United States Patent
Park et al.

(10) Patent No.: US 10,614,891 B2
(45) Date of Patent: Apr. 7, 2020

(54) METHODS OF OPERATING MEMORY DEVICES BASED ON SUB-BLOCK POSITIONS AND RELATED MEMORY SYSTEMS

(71) Applicant: Samsung Electronics Co., Ltd., Suwon-si, Gyeonggi-do (KR)

(72) Inventors: Se-Hwan Park, Yongin-si (KR); Wan-Dong Kim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/004,770

(22) Filed: Jun. 11, 2018

(65) Prior Publication Data

US 2019/0074065 A1    Mar. 7, 2019

(30) Foreign Application Priority Data

Sep. 5, 2017    (KR) .................. 10-2017-0113343

(51) Int. Cl.
  *G11C 11/34* (2006.01)
  *G11C 16/04* (2006.01)
  (Continued)

(52) U.S. Cl.
  CPC .......... *G11C 16/24* (2013.01); *G06F 13/1668* (2013.01); *G11C 11/5628* (2013.01); *G11C 16/0483* (2013.01); *G11C 16/08* (2013.01); *G11C 16/10* (2013.01); *G11C 16/26* (2013.01); *G11C 16/3418* (2013.01);
  (Continued)

(58) Field of Classification Search
  USPC .................................... 365/185.11, 185.18
  See application file for complete search history.

(56) References Cited

U.S. PATENT DOCUMENTS 6,098,145 A * 8/2000 Huang ............... G11C 7/12
  365/203
6,654,292 B2  11/2003 Keays
7,949,821 B2   5/2011 Han
(Continued)

FOREIGN PATENT DOCUMENTS

CN        105070735 A    11/2015
KR   10-2012-0131327 A   12/2012
KR   10-2016-0109906 A    9/2016

OTHER PUBLICATIONS

Invitation to Respond to Written Opinion, Singapore Application No. 10201804116T, dated Dec. 6, 2018, 12 pages.

*Primary Examiner* — Viet Q Nguyen
(74) *Attorney, Agent, or Firm* — Muir Patent Law, PLLC

(57) ABSTRACT

A memory device can include a memory block operatively connected to a common source line and a plurality of bit lines, wherein the memory block includes first and second sub-blocks each having a respective position in the memory block relative to the common source line and the plurality of bit lines. The memory device can be operated by receiving a command and an address from outside the memory device and performing a precharge operation on the memory block in response to the command, using a first precharge path through the memory block or a second precharge path through the memory block based on the respective position of the first or second sub-block that includes a word line that is configured to activate responsive to the address.

20 Claims, 41 Drawing Sheets

(51) Int. Cl.
G11C 16/24 (2006.01)
G11C 11/56 (2006.01)
G11C 16/34 (2006.01)
G06F 13/16 (2006.01)
G11C 16/08 (2006.01)
G11C 16/10 (2006.01)
G11C 16/26 (2006.01)
G11C 16/14 (2006.01)
H01L 27/11524 (2017.01)
H01L 27/11556 (2017.01)
H01L 27/1157 (2017.01)
H01L 27/11582 (2017.01)

(52) U.S. Cl.
CPC ...... *G06F 2213/0024* (2013.01); *G11C 16/14* (2013.01); *G11C 2211/5648* (2013.01); *H01L 27/1157* (2013.01); *H01L 27/11524* (2013.01); *H01L 27/11556* (2013.01); *H01L 27/11582* (2013.01)

(56) References Cited

U.S. PATENT DOCUMENTS

| | | | |
|---|---|---|---|
| 8,913,434 B2 | 12/2014 | Ha | |
| 8,976,584 B2 | 3/2015 | Han et al. | |
| 8,988,939 B2 | 3/2015 | Dunga et al. | |
| 9,104,556 B2 | 8/2015 | Gorobets et al. | |
| 9,576,667 B2 | 2/2017 | Goda et al. | |
| 9,583,201 B1 | 2/2017 | Lee | |
| 9,721,670 B1* | 8/2017 | Kim | G11C 16/26 |
| 10,068,657 B1* | 9/2018 | Yu | G11C 16/3459 |
| 10,354,737 B2* | 7/2019 | Hu | G11C 16/3431 |
| 2009/0180306 A1* | 7/2009 | Terada | G11O 5/063 365/72 |
| 2011/0085364 A1* | 4/2011 | Shimano | G11C 15/04 365/49.17 |
| 2011/0199808 A1* | 8/2011 | Yi | G11C 7/062 365/72 |
| 2014/0098606 A1* | 4/2014 | Yip | G11C 16/0483 365/185.02 |
| 2015/0009754 A1 | 1/2015 | Kim | |
| 2016/0049201 A1 | 2/2016 | Lue et al. | |
| 2016/0064083 A1* | 3/2016 | Nam | G11C 16/10 365/185.11 |
| 2016/0071561 A1* | 3/2016 | Lee | G11C 7/12 365/191 |
| 2016/0104533 A1 | 4/2016 | Tanzawa et al. | |
| 2016/0267965 A1 | 9/2016 | Kang | |
| 2016/0314833 A1* | 10/2016 | Lee | G11C 11/5635 |

* cited by examiner

FIG. 7D
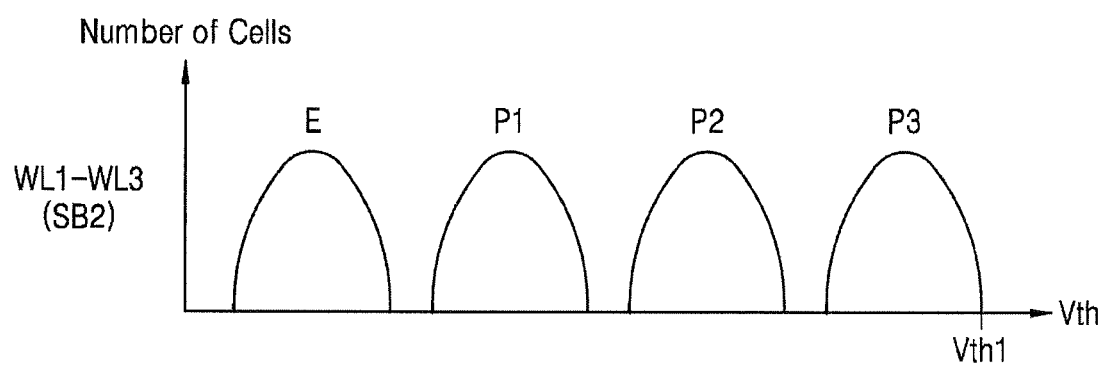
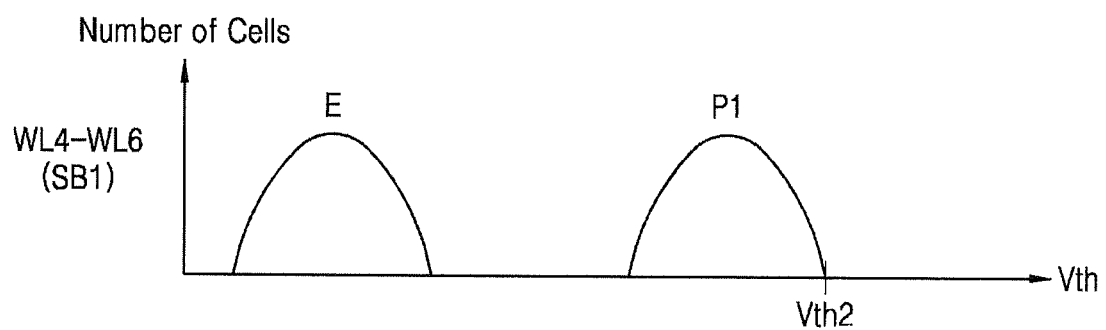

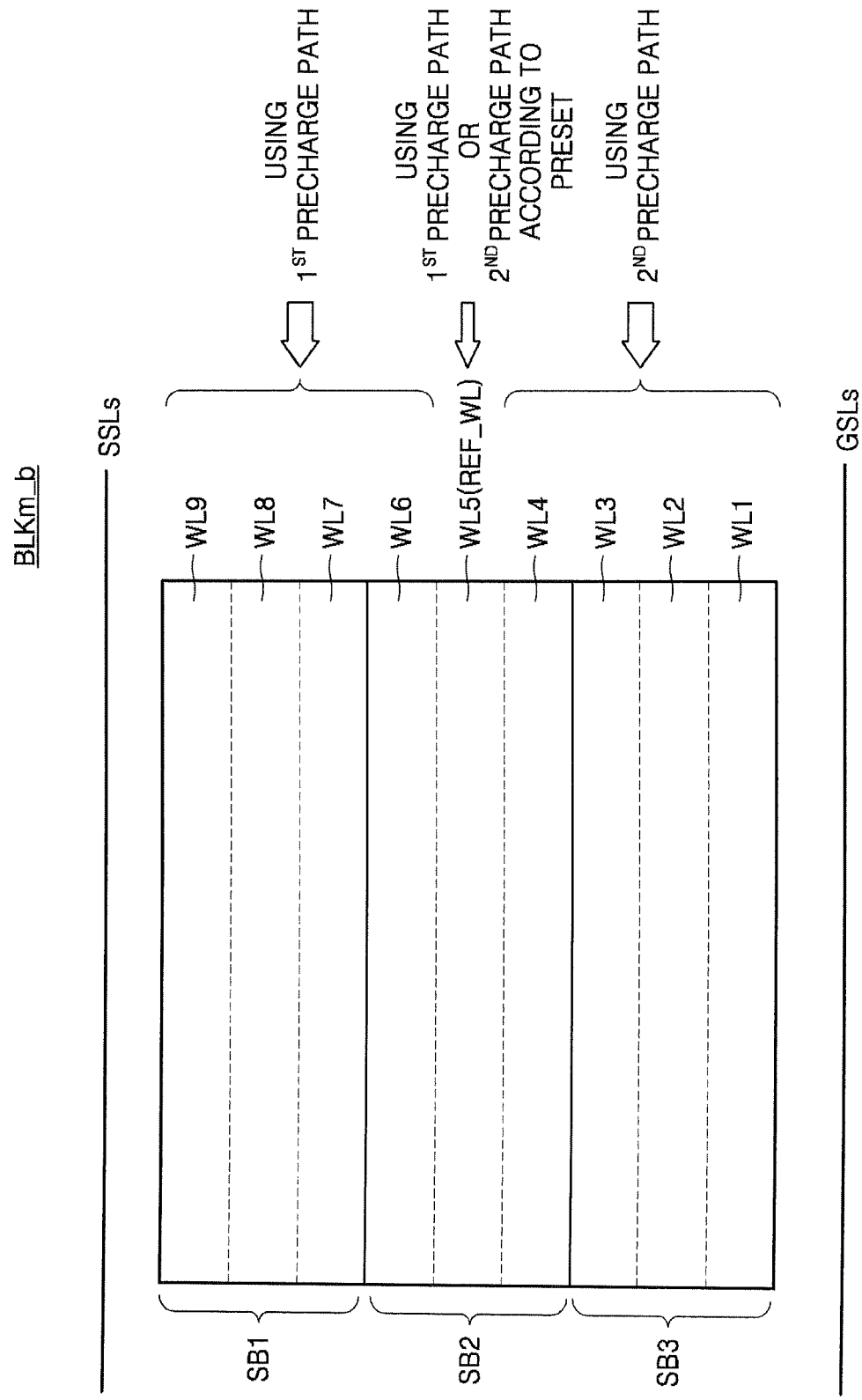

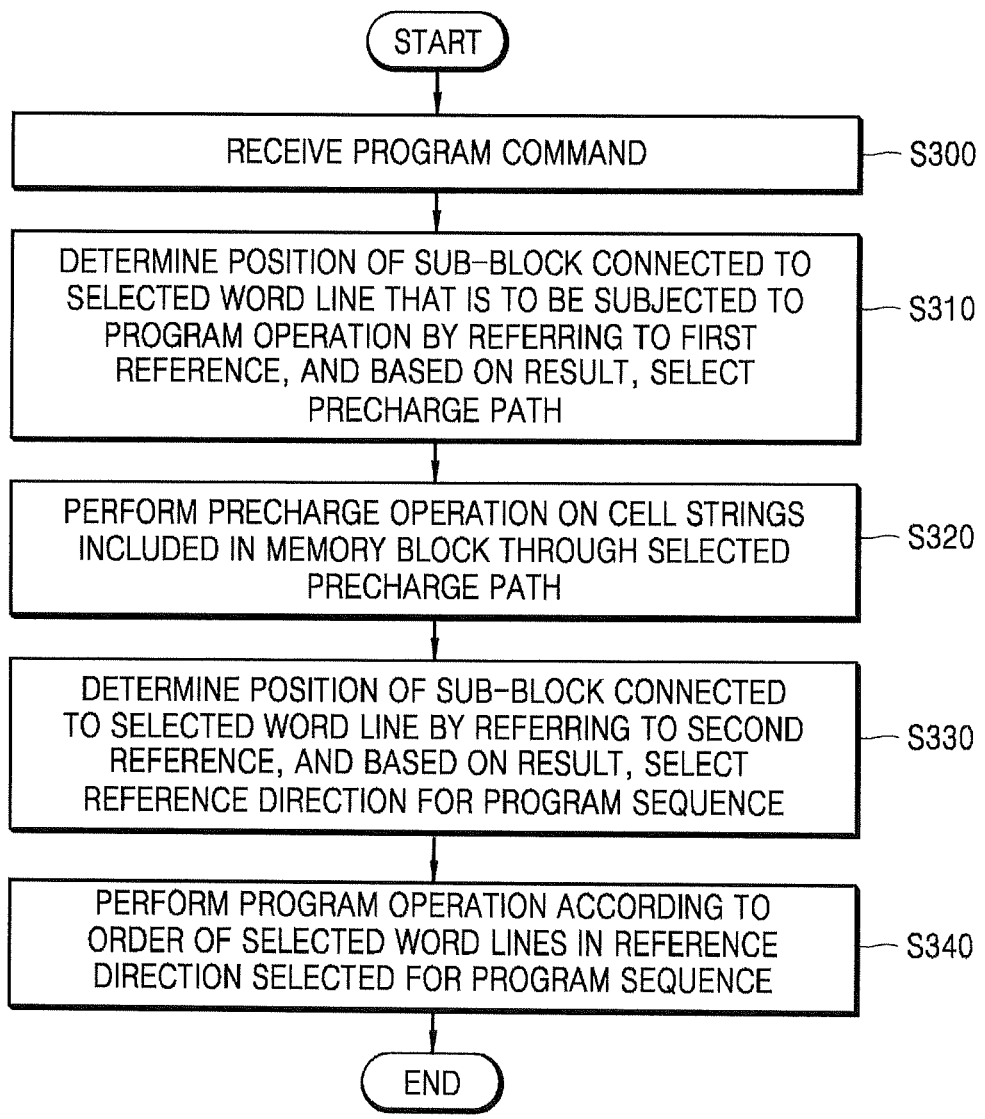

METHODS OF OPERATING MEMORY DEVICES BASED ON SUB-BLOCK POSITIONS AND RELATED MEMORY SYSTEMS

CROSS-REFERENCE TO RELATED APPLICATION

This application claims the benefit of Korean Patent Application No. 10-2017-0113343, filed on Sep. 5, 2017, in the Korean Intellectual Property Office, the disclosure of which is incorporated herein in its entirety by reference.

BACKGROUND

The inventive concept relates to a method of operating a memory device, and more particularly, to a method of operating a memory device including a three-dimensional nonvolatile memory cell array, the method including a recharge operation, a program operation, and a read operation.

Semiconductor memory devices having a three-dimensional array structure have been studied to more efficiently manage memory blocks larger than a conventional two-dimensional array structure. For example, a memory operation may be performed on sub-block units. In particular, recently, a semiconductor memory device capable of supporting a partial erase operation in which an erase operation is performed in sub-block units has been introduced.

SUMMARY

Embodiments according to the inventive concept can provide methods of operating memory devices based on sub-block positions and related memory systems and devices. Pursuant to these embodiments, a memory device can include a memory block operatively connected to a common source line and a plurality of bit lines, wherein the memory block includes first and second sub-blocks each having a respective position in the memory block relative to the common source line and the plurality of bit lines. The memory device can be operated by receiving a command and an address from outside the memory device and performing a precharge operation on the memory block in response to the command, using a first precharge path through the memory block or a second precharge path through the memory block based on the respective position of the first or second sub-block that includes a word line that is configured to activate responsive to the address.

In some embodiments, a memory block can have at least two sub-blocks, where the memory block can be connected to a plurality of ground select lines configured to control coupling to a common source line and can be connected to a plurality of string select lines configured to control coupling to a plurality of bit lines. The memory device can be programmed by receiving a program command from outside the memory device. It can be determined if a plurality of selected word lines configured to activate memory cells responsive to the program command are included a first sub-block or are included in a second sub-block to provide a selected program sub-block. A program operation can be performed using a first sequence of a plurality of first selected word lines extending in a first direction from the plurality of ground select lines toward the plurality of string select lines responsive to determining that the plurality of selected word lines are included in the first sub-block and the program operation can be performed using a second sequence of a plurality of second selected word lines extending in a second direction from the plurality of string select lines toward the plurality of ground select lines responsive to determining that the plurality of selected word lines are included in the second sub-block.

In some embodiments, a memory system can include a memory device including a memory block having at least two sub-blocks, where each of the at least two sub-blocks can include a plurality of memory cells, and the at least two sub-blocks can be connected to a plurality of ground select lines that are configured to control connection to a common source line and the at least two sub-blocks can be connected to a plurality of string select lines that are configured to control connection to a plurality of bit lines. A memory controller can be configured to control a first precharge operation through the plurality of bit lines and to control a second precharge operation through the common source line according to a position of a sub-block connected to at least one select word line subject to a program operation or a read operation performed on the memory block.

BRIEF DESCRIPTION OF THE DRAWINGS

Embodiments of the inventive concept will be more clearly understood from the following detailed description taken in conjunction with the accompanying drawings in which:

FIG. 7D shows a diagram for explaining data bits to be programmed in the memory block of FIG. 7C;

FIGS. 14A to 14C show diagrams for describing an embodiment of a reference for defining the position of a sub-block for a precharge operation of a memory device according to the inventive concept;

FIG. 21 shows a flowchart for explaining a precharge operation and a program operation according to an embodiment of the inventive concept;

DETAILED DESCRIPTION OF THE EMBODIMENTS

Hereinafter, embodiments of the inventive concept will be described in detail with reference to the accompanying drawings. It will be understood that, as used herein, the term adjacent includes arrangements where a sub-block (or group of sub-blocks) is directly adjacent to a particular structure, such as a source select line or a ground select line, such that there is no other sub-block (or group of sub-blocks) that is located between a sub-block (or group of sub-blocks) and the particular structure. For example, in some embodiments, a group of sub-blocks may be defined as being adjacent to the source select line that drives the group of sub-blocks even though some of the sub-blocks in the group may be closer to the ground select line.

Figure 1A:
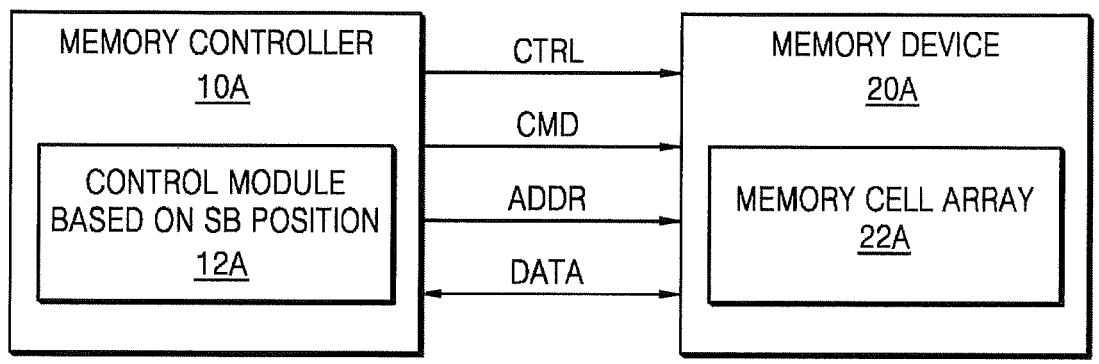
FIGS. 1A and 1B show block diagrams schematically illustrating a memory system according to one embodiment of the inventive concept.
Figure 1B:
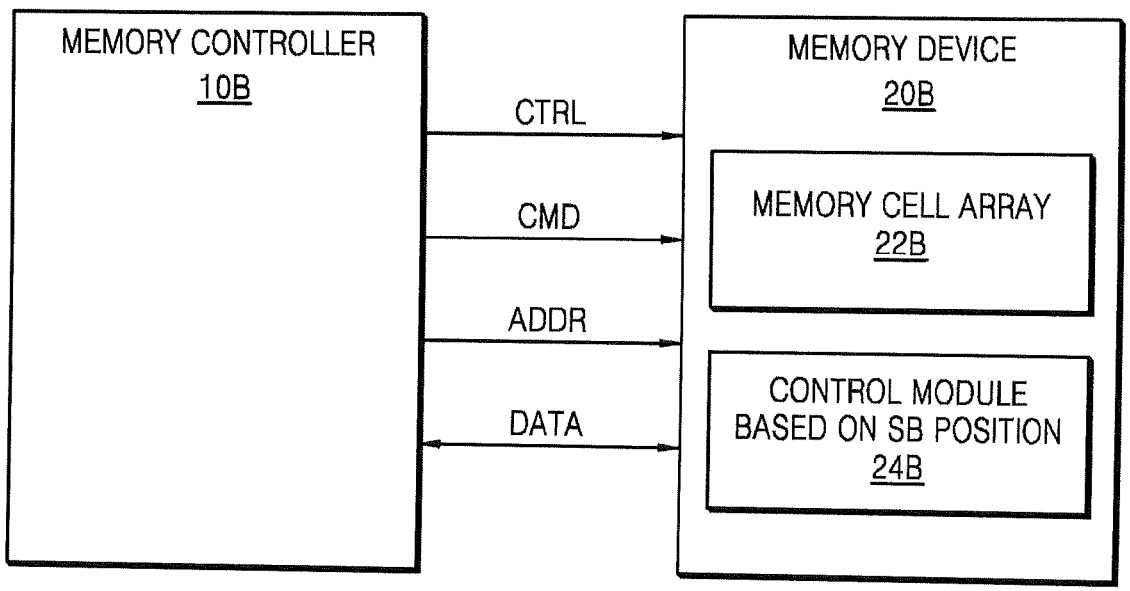

FIGS. 1A and 1B show block diagrams schematically illustrating memory systems 1A and 1B according to one embodiment of the inventive concept.

Referring to FIG. 1A, the memory system 1A may include a memory controller 10A and a memory device 20A. The memory controller 10A may control a memory operation of the memory device 20A. In one embodiment, the memory controller 10A provides an address ADDR, a command CMD, and a control signal CTRL to perform a program (or write) operation, a read operation, and an erase operation on the memory device 20A. The memory device 20A may include a memory cell array 22A, and the memory cell array 22A may include a plurality of memory cells where a plurality of word lines cross a plurality of bit lines. Furthermore, the memory cell array 22A may include word lines, at least one string select line, and at least one ground select line, and may include a plurality of memory blocks.

The memory cells of the memory cell array 22A may be three-dimensional vertical memory cells, and each of the memory blocks of the memory cell array 22A may include at least two sub-blocks. In one embodiment, the unit of a sub-block may correspond to a block unit upon which a partial erase operation can be performed.

In one embodiment, the memory cells may be flash memory cells, and the memory cell array 22 may be a NAND flash memory cell array. Hereinafter, embodiments of the inventive concept will be described in detail in which the memory cells are flash memory cells.

The memory controller 10A according to one embodiment of the inventive concept may include a sub-block position based control module 12A (hereinafter referred to as a control module). The control module 12A may control a memory operation of the memory device 20A based on the position of a sub-block connected to a word line that is to be subjected to a memory operation. The control module 12A may be a hardware block including analog circuitry and/or digital circuitry, or may be a software block including a plurality of commands executed by the memory controller 10A.

In one embodiment, in controlling a precharge operation that is performed by the memory device 20A to program data to the memory cells of the memory cell array 22A or read data from the memory cells, the control module 12A may control the precharge operation according to the position of a sub-block that is connected to a word line to which the memory operation is addressed. In one embodiment, to control the precharge operation, the control module 12A may determine whether a sub-block connected to a word line that is to be subjected to a memory operation, is adjacent to string select lines connected to a memory block or ground select lines connected to a memory block, and may select different precharge paths according to the result. The memory controller 10A controls the precharge operation in the above manner, and then may control the program operation or the read operation performed by the memory device 20A.

In addition, in one embodiment, when controlling the program operation performed by the memory device 20A, the control module 12A may control the program operation based on a program sequence that varies according to the position of a sub-block connected to a word line to which the memory operation is addressed. In one embodiment, to control the program operation, the control module 12A may determine whether a sub-block connected to a word line that is to be subjected to a memory operation is adjacent to string select lines connected to a memory block or adjacent to ground select lines connected to a memory block, and selects different program sequences according to the result.

When supporting a partial erase operation, the memory system 1A according to inventive concept performs a memory operation efficiently in different memory operation methods determined according to the position of a sub-block connected to a word line that is to be subjected to a memory operation, and thus, data reliability may be improved.

Referring to FIG. 1B, unlike FIG. 1A, a control module 24B may be included in a memory device 20B. Furthermore, the control module 24B may be implemented in various logic forms. For example, the control module 24B may be included in the function of the control logic of the memory device 20B. The control module 24B may control such that an operation mode is selected according to the position of a sub-block connected to a word line that is to be subjected to a memory operation, and based on the selected operation mode, the memory device 20B performs a memory operation (for example, a precharge operation or a program operation).

Figure 2:
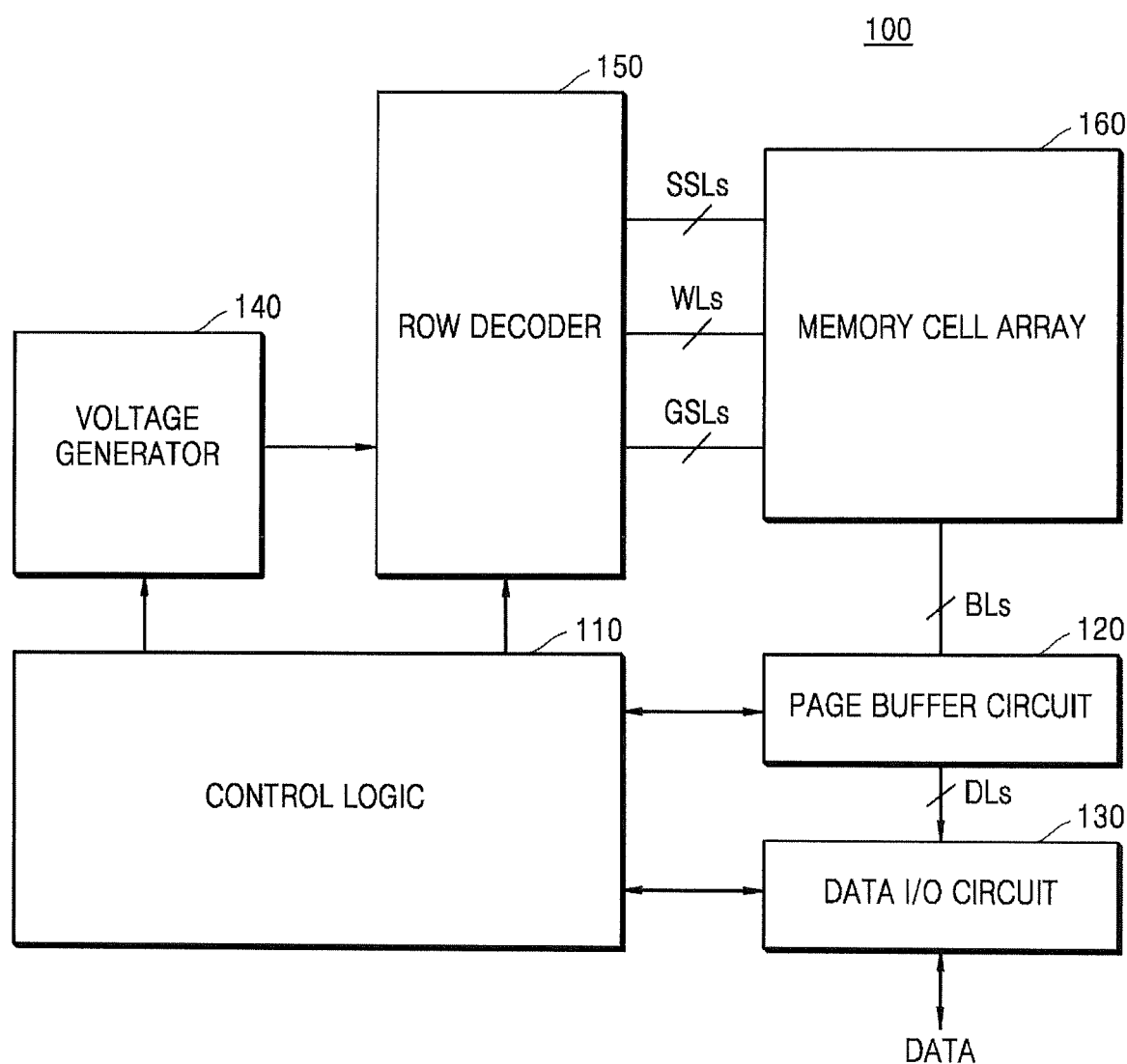
FIG. 2 shows a block diagram illustrating an example of a memory device included in the memory system of FIG. 1A.

FIG. 2 shows a block diagram illustrating an example of a memory device 100 included in the memory system of FIG. 1A.

Referring to FIG. 2, the memory device 100 may include a control logic 110, a page buffer circuit 120, a data input-output circuit 130, a voltage generator 140, a row decoder 150, and a memory cell array 160. The memory cell array 160 may be connected to the row decoder 150 via word lines WLs, ground select lines GSLs, string select lines SSL, and may be connected to the data input-output circuit 130 via bit lines BLs. The memory cell array 160 may include a plurality of memory blocks.

The memory cell array 160 may include a plurality of cell strings. Each of the cell strings may form a channel in a vertical or horizontal direction. In the memory cell array 160, a plurality of word lines may be stacked in a vertical direction. Each of the word lines may constitute a control gate for the memory cells included in each of the cell strings. In this case, a channel of a memory cell may be formed in the vertical direction. According to the arrangement of the memory cell array 160, it is possible to separately select each cell string that shares a certain bit line BL. Separately selected cell strings may be connected to a plurality of ground select lines GSLs that are electrically separated.

The row decoder 150 may decode an address received from the memory controller 10A shown in FIG. 1A to select any one of the word lines WLs of the memory cell array 160. The row decoder 150 may provide the selected word line of the memory cell array 160 with a word line voltage provided by the voltage generator 140. For example, in a program operation, the row decoder 150 may apply a program voltage to a selected word line and apply a pass voltage to unselected word lines. In one embodiment, during various memory operations, the row decoder 150 may provide a select voltage to string select lines SSLs and ground select lines GSLs.

The page buffer circuit 120 may operate as a write driver or a sense amplifier in accordance with operations performed by the control logic 110. During a program operation, the page buffer circuit 120 may provide a voltage corresponding to the data to be programmed to the bit lines BLs of the memory cell array 160. During a read operation, the page buffer circuit 120 may sense data stored in a memory cell that is selected for the read operation through the bit lines BLs and provide the data to the data input-output circuit 130.

The data input-output circuit 130 may be connected to the page buffer circuit 120 through the data lines DLs and may supply input data DATA to the page buffer circuit 120, or output data DATA provided by the page buffer circuit 120 to the outside. The data input-output circuit 130 may provide an input address or command to the control logic 110 or the row decoder 150.

The control logic 110 may control program, read, and erase operations in response to a command (for example, a command CMD received from memory controller 10A of FIG. 1A) transmitted by the data input-output circuit 130. In one embodiment, when the memory device 100 performs the precharge operation, the control logic 110 may control the precharge operation in various precharge paths according to the position of a sub-block connected to at least one selected word line corresponding to an address (for example, the address ADDR received from the memory controller 10A of FIG. 1A) transmitted by the data input-output circuit 130. In addition, when the memory device 100 performs the program operation, the control logic 110 may control the program operation in various program sequences (for example, a program sequence with respect to a plurality of selected word lines) according to the position of a sub-block connected to a plurality of select word lines that are to be subjected to a program operation.

Figure 3:
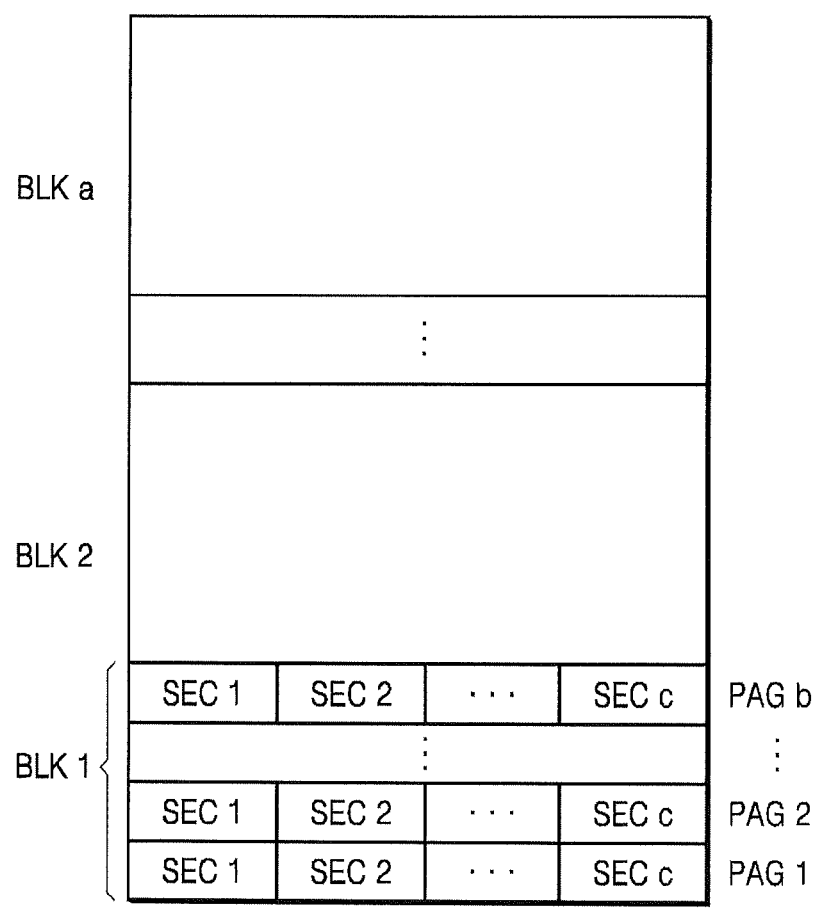
FIG. 3 shows an example of a memory cell array included in the memory device of FIG. 2.

FIG. 3 shows an example of the memory cell array 160 included in the memory device 100 of FIG. 2.

Referring to FIG. 3, the memory cell array 160 of FIG. 2 may be a flash memory cell array. In this regard, the memory cell array 160 may include blocks BLK1 to BLKa in the number of a (a is an integer of 2 or more), and each of the blocks BLK1 to BLKa includes pages PAG1 to PAGb, and each of the pages PAG1 to PAGb may include sectors SEC1 to SECc in the number of c (c is an integer of 2 or more). For an illustrative purpose only, FIG. 3 illustrates that only the block BLK1 includes the pages PAG1 to PAGb and the sectors SEC1 to SECc. However, the other blocks BLK2 to BLKa may have the same structure as the block BLK1.

Figure 4:
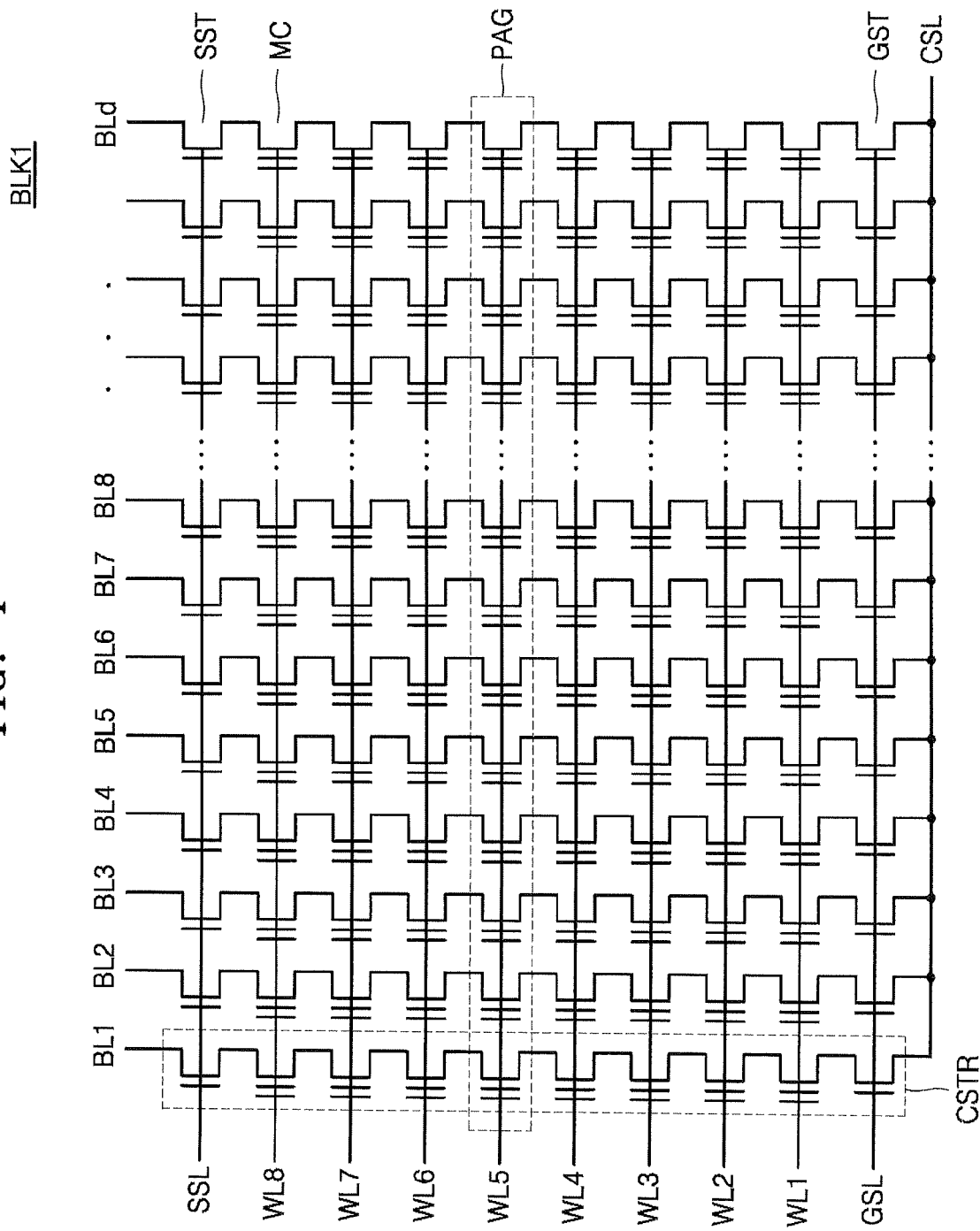
FIG. 4 shows a circuit diagram illustrating an example of a memory block included in the memory cell array of FIG. 2.

FIG. 4 shows a circuit diagram illustrating an example of the memory block BLK1 included in the memory cell array 160 of FIG. 2.

Referring to FIG. 4, the memory cell array 160 of FIG. 2 may be a memory cell array of a NAND flash memory. In this regard, each of the blocks BLK1 to BLKa shown in FIG. 3 may be implemented as shown in FIG. 4. Referring to FIG. 4, each of the blocks BLK1 to BLKa may include cell strings CSTRs in the number of d (d is an integer of 2 or more), wherein each of the cell strings CSTRs includes eight memory cells MC connected in series in the direction in which the bit lines BL1 to BLd extend. Each of the cell strings CSTRs may include a string select transistor SST and a ground select transistor GST which are connected to the memory cells MC connected in series. In one embodiment, the string select transistor SST may be connected to the string select line SSL and the ground select transistor GST may be connected to the ground select line GSL.

FIG. 4 shows an embodiment in which eight pages PAG are provided for eight word lines WL1 to WL8. However, according to one or more embodiments, the blocks BLK1 to BLKa of the memory cell array 160 include memory cells and pages in numbers different from those of the memory cells MC and the pages PAG illustrated in FIG. 4.

Figure 5A:
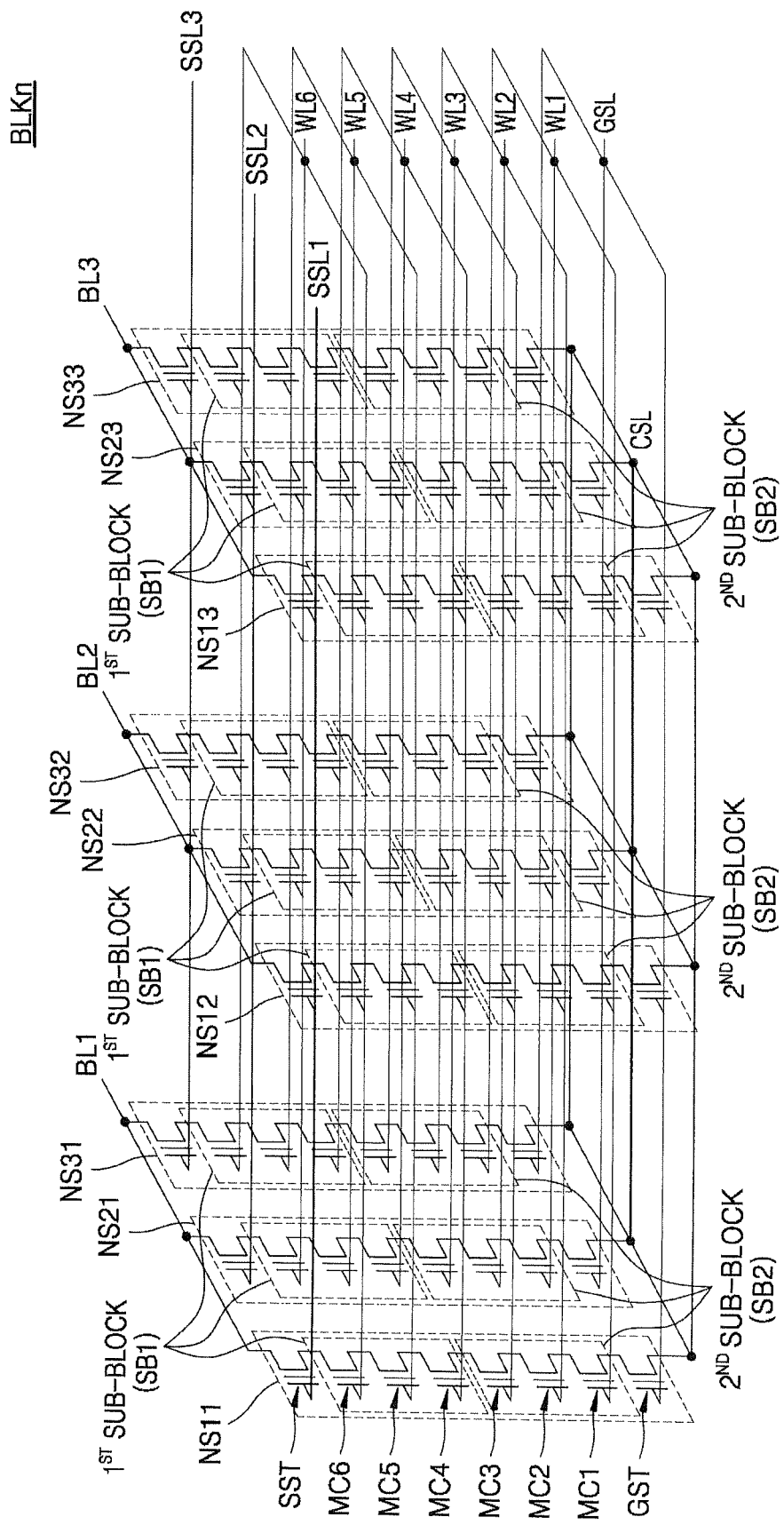
FIGS. 5A and 5B each show a circuit diagram illustrating another example of the memory block included in the memory cell array of FIG. 2.
Figure 5B:
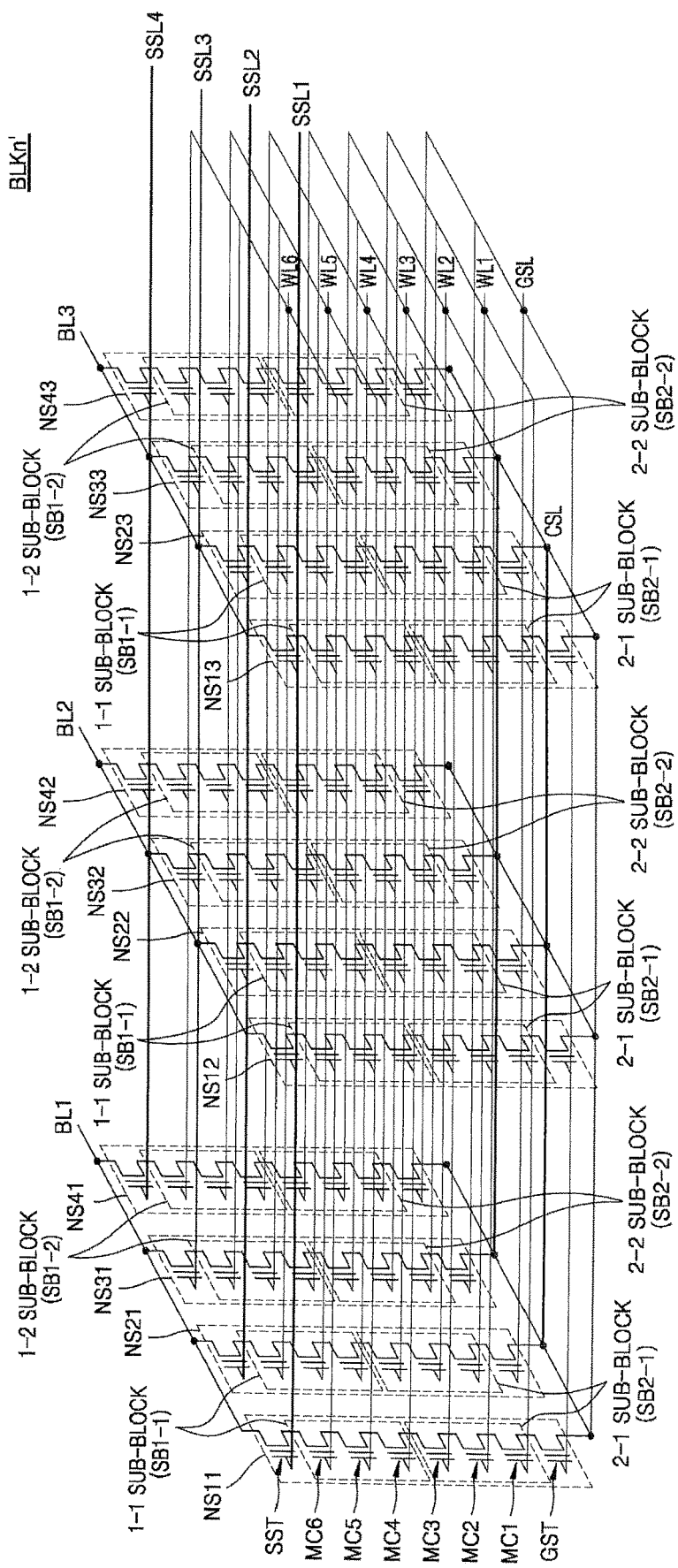

FIGS. 5A and 5B show a circuit diagram illustrating examples of a memory block included in the memory cell array 160 of FIG. 2, that is, memory blocks BLKn and BLKn', respectively.

Referring to FIG. 5A, the memory block BLKn may be a vertical NAND flash memory, and each of the memory blocks BLK1 to BLKa shown in FIG. 3 may be implemented as shown in FIG. 5. The memory block BLKn may include a plurality of NAND strings NS11 to NS33, a plurality of word lines WL1 to WL6, a plurality of bit lines BL1 to BL3, a ground select line GSL, a plurality of string select lines SSL1 to SSL3, and a common source line CSL. Here, the number of NAND strings, the number of word lines, the number of bit lines, the number of ground select lines, the number of string select lines, and the connection relationships of the respective lines may vary according to an embodiment.

The NAND strings NS11 to NS33 may be connected to the bit lines BL1 to BL3 and the common source line CSL therebetween. Each of the NAND strings (for example, NS11) may include a string select transistor SST, a plurality of memory cells MC1 to MC6, and a ground select transistor GST connected in series, and the fourth to sixth memory cells may constitute a first sub-block SB1, and the first to third memory cells may constitute a second sub-block SB2. A sub-block may be a block unit capable of partially erasing a memory device. That is, the memory device may perform a separate partial erase operation on each of the first sub-block SB1 and the second sub-block SB2. In FIG. 5A, two sub-blocks are included in a single memory block, but the present embodiment is only an example, and for example, the single memory block may include more sub-blocks.

The string select transistor SST may be connected to the string select lines SSL1 to SSL3. The memory cells MC1 to MC6 may be connected to the word lines WL1 to WL6, respectively. The ground select transistor GST may be connected to the ground select line GSL. The string select transistor SST may be connected to the bit line BL corresponding thereto, and the ground select transistor GST may be connected to the common source line CSL.

The word lines (for example, WL1) located at an identical level may be commonly connected, and the string select lines SSL1 to SSL3 may be separate lines. When memory cells connected to the first word line WL1 and belonging to the NAND strings NS11, NS12, and NS13, are programmed, the first word line WL1 and the first string select line SSL1 may be selected.

The memory device according to an embodiment of the inventive concept may perform a partial erase operation on each of the sub-blocks SB1 and SB2. Further, when performing a memory operation, the memory device may use different methods according to the positions of the sub-blocks SB1 and SB2.

Unlike FIG. 5A, FIG. 5B further illustrates a fourth string select line SSL4 to explain another example of how to define a sub-block. Referring to FIG. 5B, the memory block BLKn' may include a 1-1 sub-block SB1-1, a 1-2 sub-block B1-2, a 2-1 sub-block SB2-1 and a 2-2 sub-block SB2-2. As described above, the 1-1 sub-block SB1-1, the 1-2 sub-block B1-2, the 2-1 sub-block SB2-1, and the 2-2 sub-block SB2-2 may be defined according to a string select line unit. In one embodiment, the 1-1 sub-block SB1-1 and the 2-1 sub-block SB2-1 may be connected to the first string select line SSL1 and the second string select line SSL2, and the 1-2 sub-block SB1-2 and the 2-2 sub-block SB2-2 may be connected to the third string select line SSL3 and the fourth string select line SSL4.

The memory device according to one embodiment of the inventive concept may perform a partial erase operation on each of the 1-1 sub-block SB1-1, the 2-1 sub-block SB2-1, the 1-2 sub-block SB1-2 and the 2-2 sub-block SB2-2, and further, when performing a memory operation, the memory device may use different methods according to the positions of the 1-1 sub-block SB1-1, the 2-1 sub-block SB2-1, the 1-2 sub-block SB1-2 and the 2-2 sub-block SB2-2.

Figure 6A:
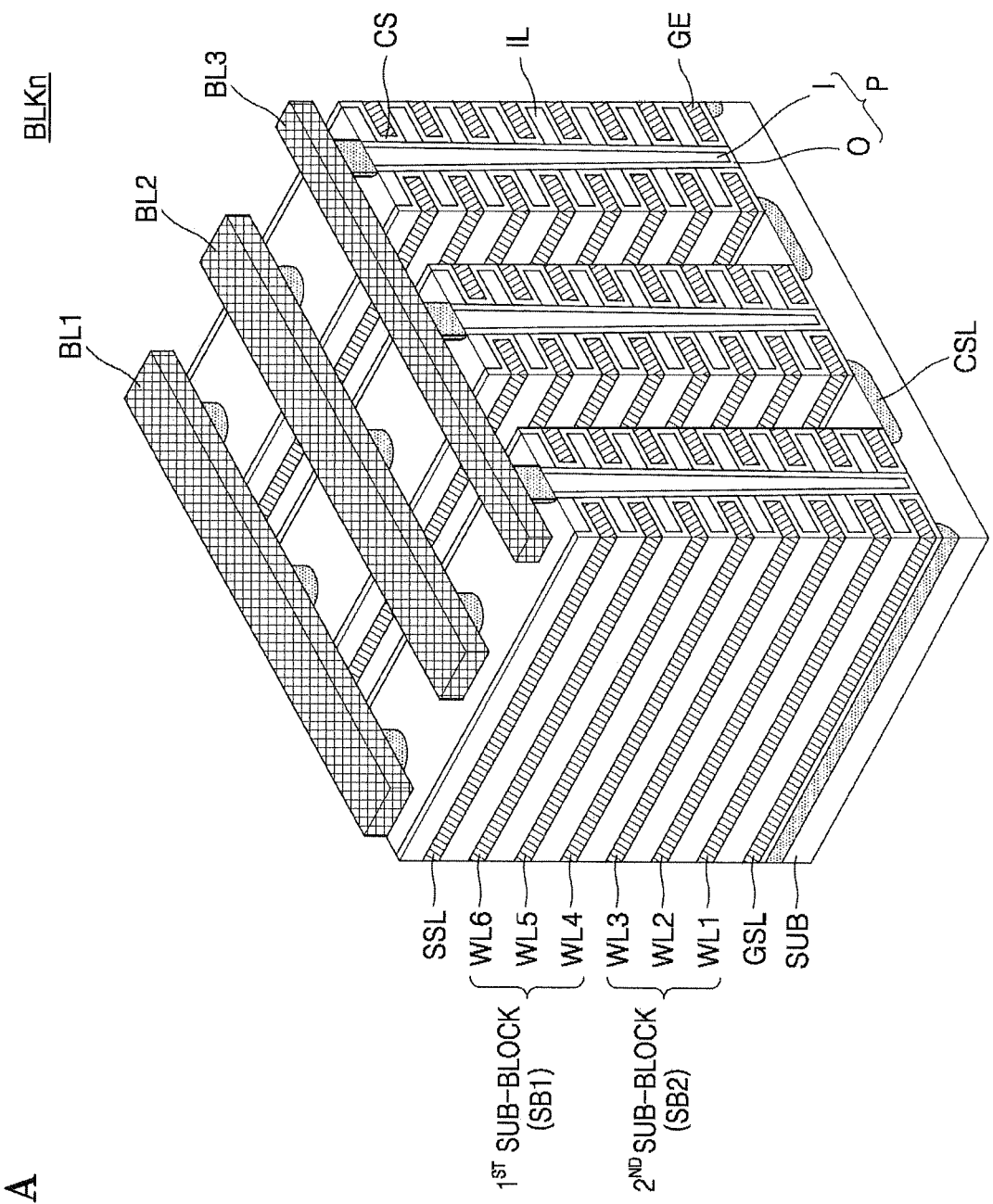
FIGS. 6A and 6B show perspective views of the memory blocks of FIGS. 5A and 5B.
Figure 6B:
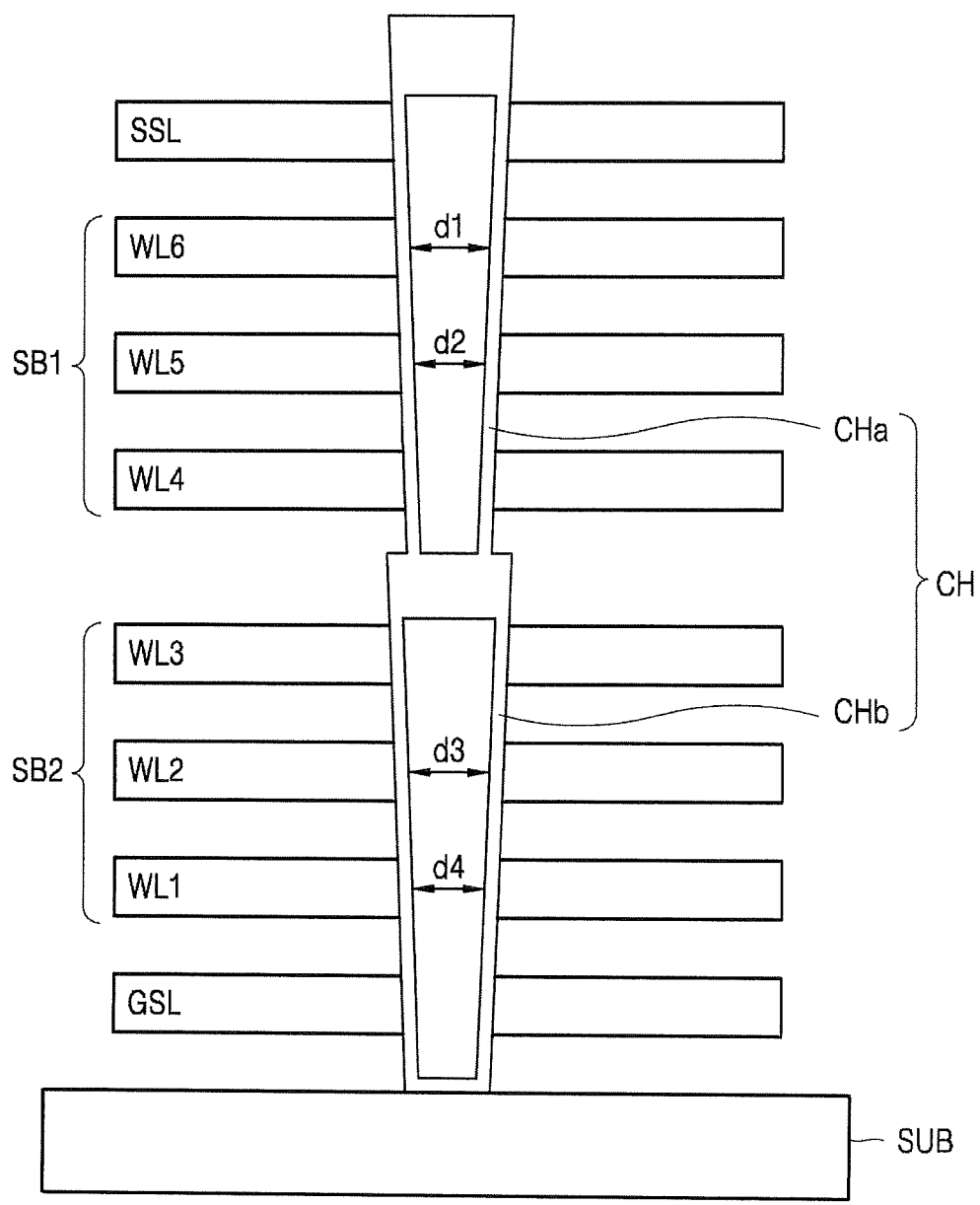

FIGS. 6A and 6B show perspective views of the memory blocks BLKn and BLKn' of FIGS. 5A and 5B.

Referring to FIG. 6A, the memory block BLKn may be formed in a direction perpendicular to a substrate SUB. The common source line CSL is located on the substrate SUB, and gate electrodes GE and insulation layers IL may be alternately stacked on the substrate SUB. In addition, a charge storage layer (CS) may be formed between the gate electrodes GE and the insulation layers IL.

When the gate electrodes GE and the insulation layers IL, which are alternately stacked, are vertically patterned, a V-shaped pillar P may be formed. The pillar P may be connected to the substrate SUB through the gate electrodes GE and the insulation layers IL. The pillar P may include an outer portion O and an inner portion I, and the outer portion O may include a semiconductor material and function as a channel, and the inner portion I may include an insulating material such as silicon oxide.

The gate electrodes GE of the memory block BLKn may be connected to the ground select line GSL, the word lines WL1 to WL6, and the string select line SSL, respectively. The pillar P of the memory block BLKn may be connected to the bit lines BL1 to BL3. In one embodiment, the fourth to sixth word lines WL4 to WL6 may constitute the first sub-block SB1 and the first to third word lines WL1 to WL3 may constitute the second sub-block SB2.

FIG. 6B shows a view for explaining the memory block BLKn' formed by using a method that is different from the method used to form the memory block BLKn of FIG. 6A. Referring to FIG. 6B, the memory block BLKn' may include a channel CH including an upper channel CHa and a lower channel CHb. The lower channel CHb may be positioned between the upper channel CHa and the substrate SUB. For example, the lower channel CHb may be formed by using an etching process and a polysilicon deposition process before the channel CHa is formed. After the lower channel CHb is formed, the upper channel CHa may be formed on the lower channel CHb by using an etching process and a polysilicon deposition process. The channel width of each of the lower channel CHb and the upper channel CHa may have an identical profile. For example, a diameter d1 of the upper channel CHa corresponding to the sixth word line WL6 may be substantially equal or similar to a diameter d3 of the lower channel CHb corresponding to the second word line WL2. In one embodiment, a diameter d2 of the upper channel CHa corresponding to the fifth word line WL5 may be substantially equal or similar to a diameter d4 of the lower channel CHb corresponding to the first word line WL1. Referring to FIG. 6B, the channel corresponding to the first sub-block SB1 is the upper channel CHa, and the channel corresponding to the second sub-block SB2 is the lower channel CHb. However, the present embodiment is an example only, and the memory block BLKn' may be divided in various manners to form the upper channel CHa and the lower channel CHb. Furthermore, embodiments are not limited to the upper channel CHa and the lower channel CHb, and more channels may be formed in phases.

Figure 7A:
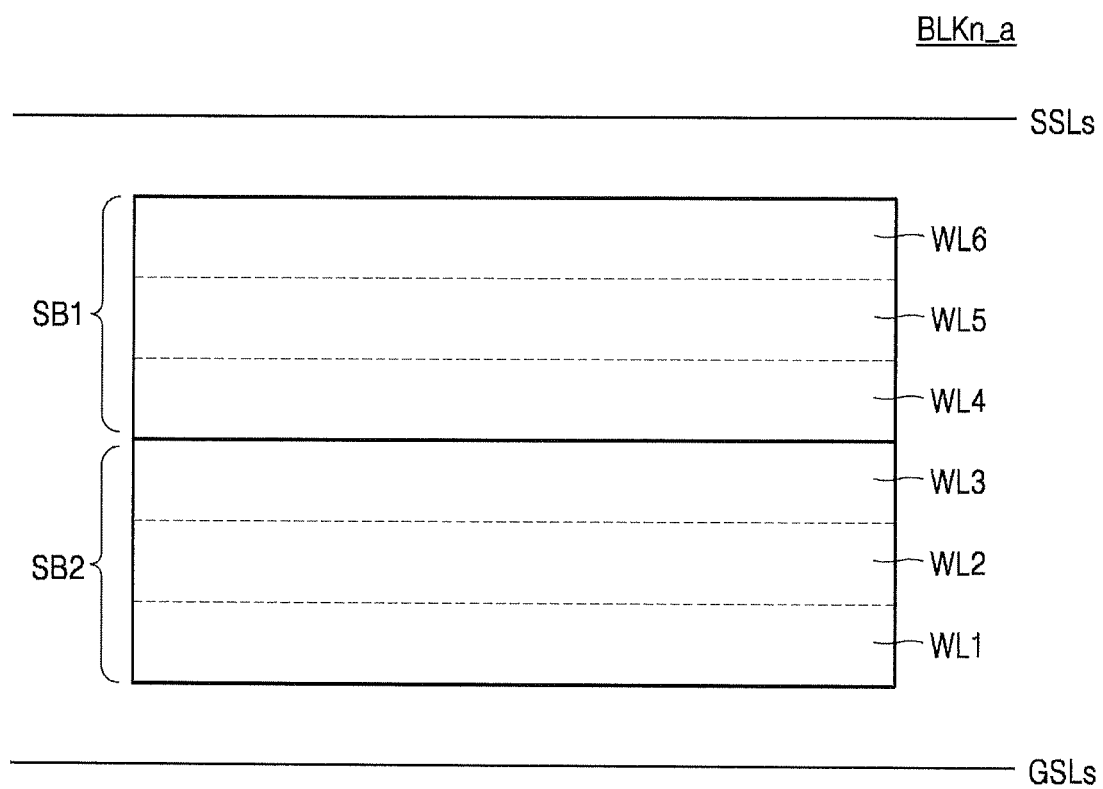
FIGS. 7A to 7C show diagrams illustrating various embodiments of sub-blocks included in a memory block.
Figure 7B:
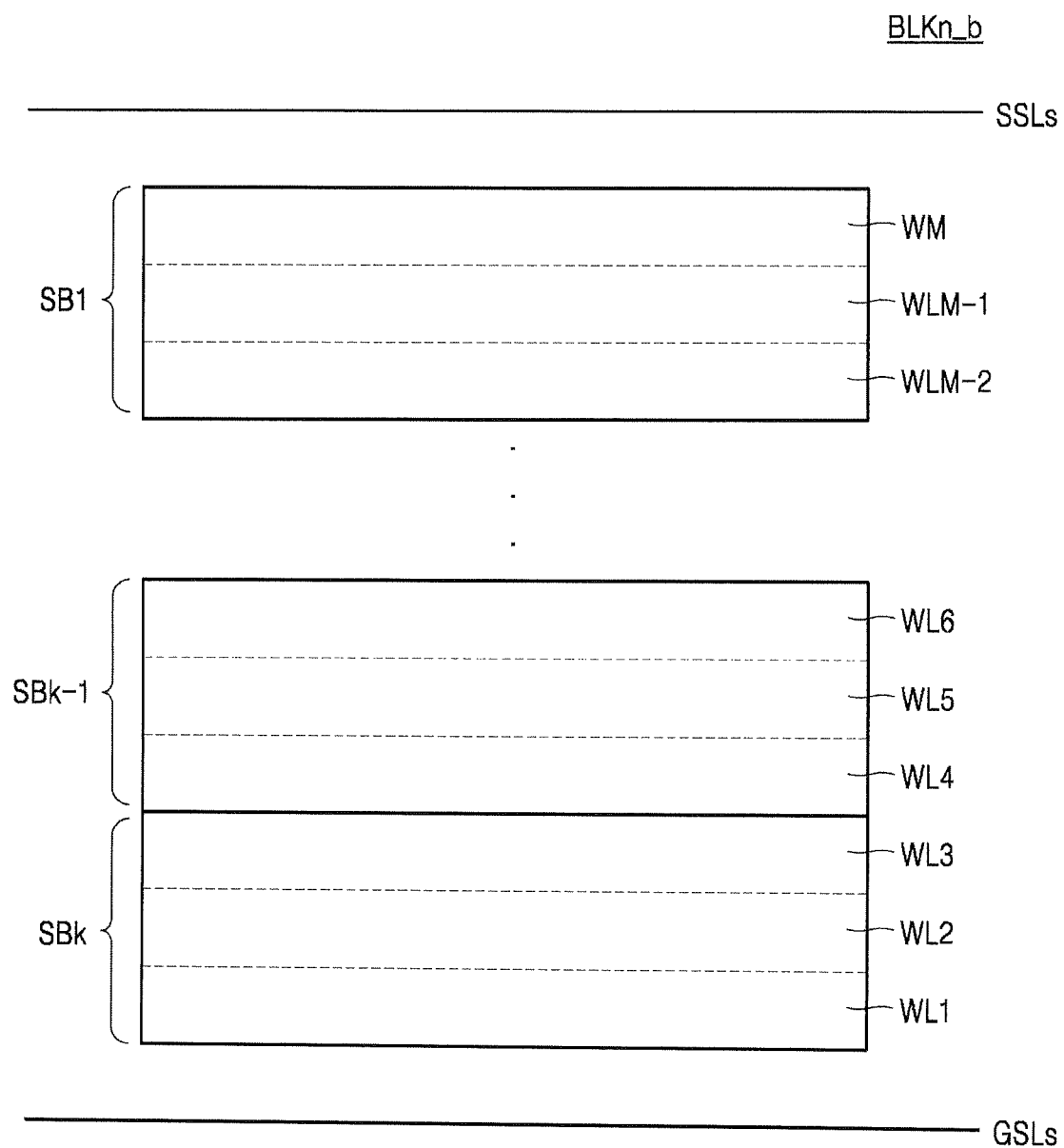
Figure 7C:
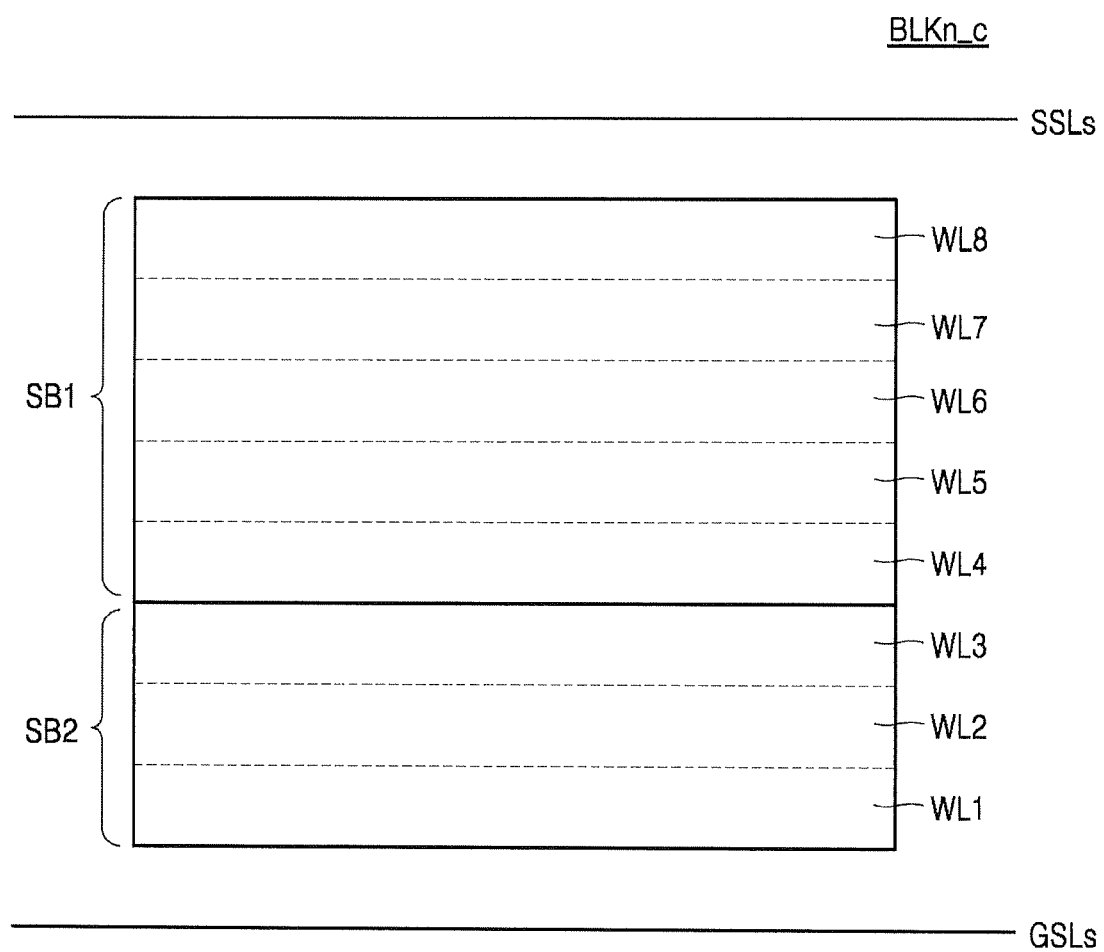

FIGS. 7A to 7C show diagrams illustrating various embodiments of sub-blocks included in memory blocks BLKn_a to BLKn_c, and FIG. 7D shows a diagram for explaining data bits to be programmed in the memory block BLKn_c of FIG. 7C.

Referring to FIG. 7A, the memory block BLKn_a may include the first sub-block SB1 and the second sub-block SB2. The first sub-block SB1 and the second sub-block SB2 may be connected to the same number of word lines, and the number of memory cells included in the first sub-block SB1 and the number of memory cells included in the second sub-block SB2 may be the same. The first sub-block SB1 may be connected to three word lines, and the second sub-block SB2 may be connected to three word lines. The first sub-block SB1 may be positioned adjacent to string select lines SSLs, and the position of the first sub-block SB1 may be defined as adjacent to string select lines SSLs. The second sub-block SB2 may be positioned adjacent to ground select lines GSLs, and the position of the second sub-block SB2 may be defined as adjacent to ground select lines GSLs. Hereinafter, for the sake of consistency, the position of each sub-block is described based on the string select lines SSLs or the ground select lines GSLs. However, the position of each sub-block may be described in different manners. For example. bit lines or string select transistors may be used instead of the string select lines SSLs, and a common source line or ground select transistors may be used instead of the ground select lines GSLs.

Referring to FIG. 7B, the memory block BLKn_b may include a first sub-block SB1 to a k-th sub-block SBk. That is, the memory block BLKn_b may include three or more sub-blocks. Each of the sub-blocks SB1 to SBk may be connected to the same number of word lines, and the number of memory cells included in each of the sub-blocks SB1 to SBk may be the same. However, the number of word lines and the number of memory cells explained herein are an example only. That is, the number of word lines connected to each of the sub-blocks SB1 to SBk may vary according to a sub-block, and the number of memory cells included in each of the sub-blocks SB1 to SBk may vary according to a sub-block. The position of each of the sub-blocks SB1 to SBk may be defined with respect to the string select lines SSLs or the ground select lines GSLs. For example, the first to jth sub-blocks SB1 to SBj (j is an integer being smaller than k−1) may be defined as adjacent to the string select lines SSLs, and the j+1th to kth sub-blocks SBj+1 to SBk may be defined as adjacent to the ground select lines GSLs. Details of the present embodiment will be described in connection with, for example, FIG. 13A.

Referring to FIG. 7C, the memory block BLKn_c may include a first sub-block SB1 and a second sub-block SB2, wherein the number of word lines connected to the first sub-block SB1 is different from the number of word lines connected to the second sub-block SB2. For example, the first sub-block SB1 may be connected to five word lines, for example, fourth to eighth word lines WL4 to WL8, and the second sub-block SB2 may be connected to three word lines, for example, first to third word lines WL1 to WL3. Furthermore, the number of memory cells included in the first sub-block SB1 may be greater than the number of memory cells included in the second sub-block SB2. The first sub-block SB1 may be positioned adjacent to string select lines SSLs and the position of the first sub-block SB1 may be defined as adjacent to string select lines SSLs. The second sub-block SB2 may be positioned adjacent to ground select lines GSLs, and the position of the second sub-block SB2 may be defined as adjacent to ground select lines GSLs.

FIG. 7D illustrates a threshold voltage distribution of memory cells of the first to third word lines WL1 to WL3 of the second sub-block SB2 of FIG. 7C and a threshold voltage distribution of memory cells of the fourth to eighth word lines WL4 to WL8 of the first sub-block SB1 of FIG. 7C.

Referring to FIG. 7D, the memory cells of the first to third word lines WL1 to WL3 may be programmed at a multi-level, and the memory cells of the fourth to eighth word lines WL4 to WL8 may be programmed at a single level. Therefore, the number of the threshold voltage distributions of the first sub-block SB2 may be different from the number of the threshold voltage distributions of the second sub-block SB1. The memory cells of the first to third word lines WL1 to WL3 may be used as a multi-level cell and the fourth to eighth word lines WL4 to WL8 may be used as a single level cell. That is, the number of data bits programmed in the first sub-block SB1 may be smaller than the number of data bits programmed in the second sub-block SB2. Therefore, referring to FIG. 7C, the size of the first sub-block SB1 (or the number of memory cells included in the first sub-block SB1) may be greater than the size of the second sub-block SB2 (or the number of memory cells included in the second sub-block SB2).

Although FIG. 7D illustrates a case where the memory cells of the first to third word lines WL1 to WL3 and the memory cells of the fourth to eighth word lines WL4 to WL8 are programmed at a 2-bit multi-level and a single-level, respectively, embodiments of the inventive concept are not limited thereto. In one embodiment, the memory cells of the first to third word lines WL1 to WL3 and the memory cells of the fourth to eighth word lines WL4 to WL8 may be programmed at a 3-bit triple level and a 2-bit multi-level, respectively. In one embodiment, not limited to the embodiment illustrated in connection with FIG. 7D, the memory cells of the first to third word lines WL1 to WL3 and the fourth to eighth word lines WL4 to WL8 may be programmed at the same level.

Figure 8A:
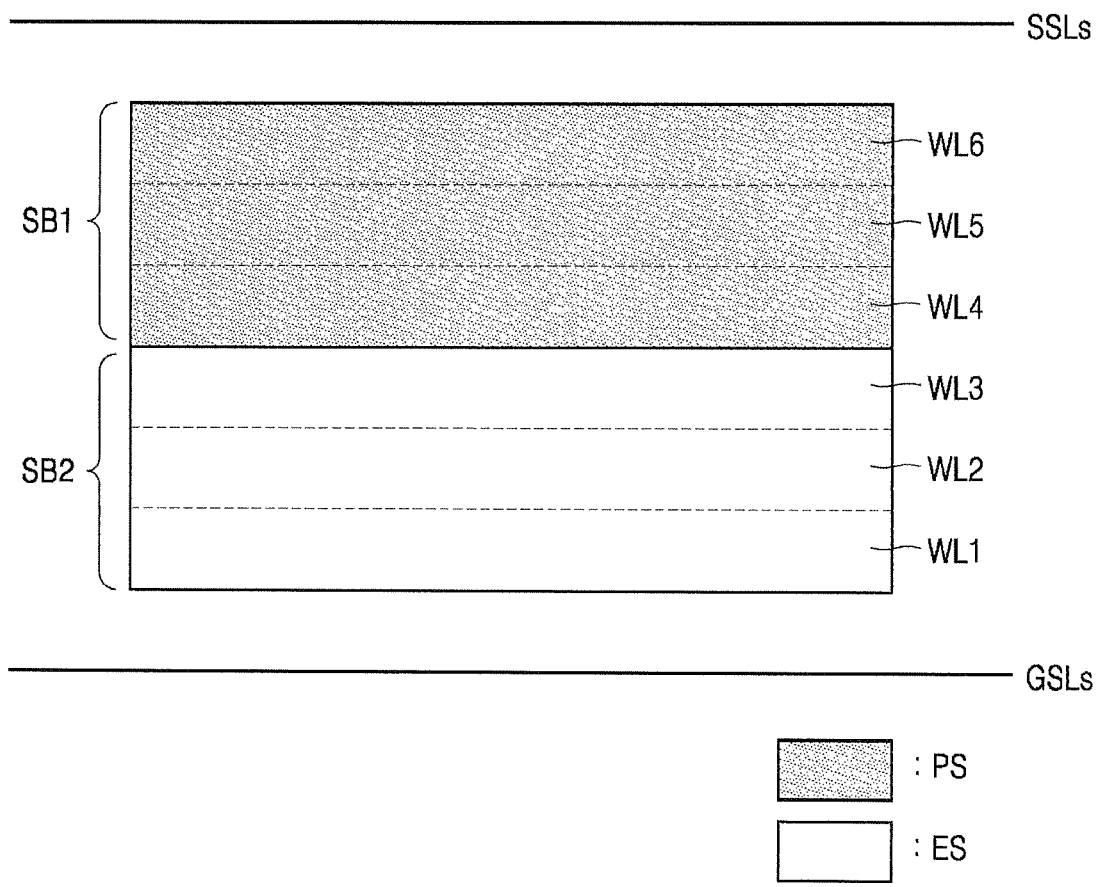
FIGS. 8A and 8B show diagrams for explaining a portion that acts as a disturbance for a program operation when a memory device supports a partial erase operation.
Figure 8B:
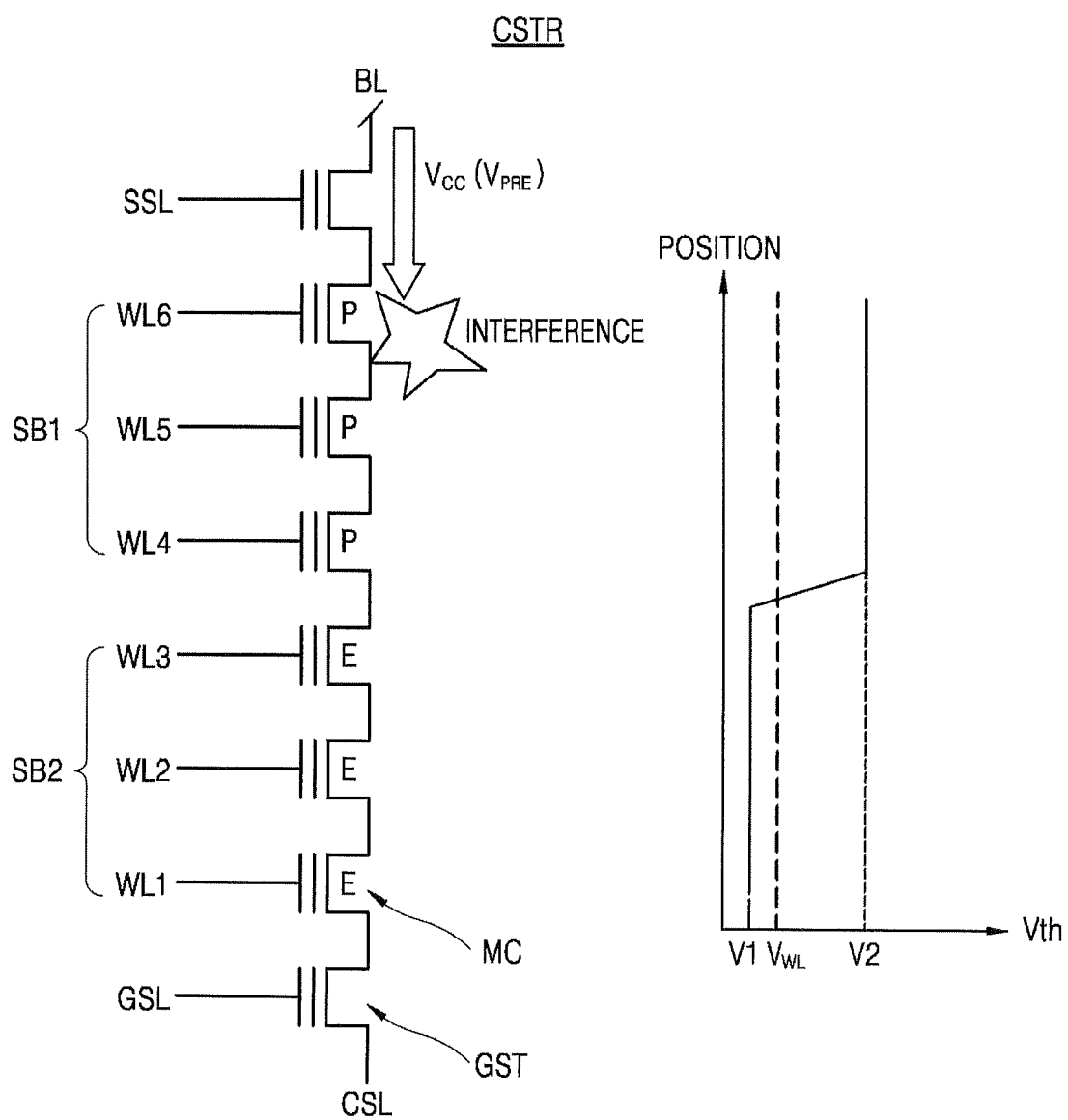

FIGS. 8A and 8B show diagrams for explaining a portion that acts as a disturbance for a program operation when a memory device supports a partial erase operation.

Referring to FIG. 8A, since a memory device may perform a partial erase operation in the unit of a sub-block, a first sub-block SB1 included in the memory block BLKn_a may be in a programmed state PR, and a second sub-block SB2 included in the predetermined memory block BLKn_a may be in an erased state ES. Hereinafter, a disturbance occurring when a precharge operation is performed to execute a program operation and a read operation on memory cells of the memory block BLKn_a will be described.

Referring to FIG. 8B, the memory block BLKn_a may include a cell string CSTR. The cell string CSTR may include a string select transistor SST for controlling the connection between a bit line BL and the cell string CSTR, a ground select transistor GST for controlling the connection between a common source line CSL and the cell string CSTR, and a plurality of memory cells MC. To program data to predetermined memory cells or to read programmed data from the predetermined memory cells, a channel corresponding to the cell string CSTR may be pre-charged with a predetermined voltage level. As illustrated in FIG. 8B, the memory cells of the first sub-block SB1 may be in the programmed state P, and the memory cells of the second sub-block SB2 may be in the erased state E. A threshold voltage Vth of the memory cells in the programmed state P of the first sub-block SB1 may correspond to V2, and a threshold voltage Vth of the memory cells in the erased state E of the second sub-block SB may correspond to V1. In this regard, when the cell string CSTR is precharged, since a voltage $V_{WL}$ applied to the word lines WL1 to WL6 has the voltage level between V1 and V2, it is difficult to form a channel in each of the memory cells of the first sub-block SB1, and a voltage ($V_{CC}$ or $V_{PRE}$) applied through the bit line BL for precharging the channel of the cell string CSTR may not be smoothly supplied to the channel of each of the memory cells of the second sub-block SB2. That is, when a predetermined voltage (VCC or VPRE) is applied to the cell string CSTR through the bit line BL, from among channels of the cell string CSTR, the channel corresponding to the second sub-block SB2 of the cell string CSTR may not properly be precharged, and thus, the channel corresponding to the second sub-block SB2 of the cell string CSTR may act as a disturbance during program-operation. Accordingly, in order to reduce such disturbance, a memory device according to an embodiment of the inventive concept may control the memory operation in different ways according to the position of a sub-block connected to a select word line that is to be subjected to a memory operation. Hereinafter, details for the embodiments described above will be described.

Figure 9:
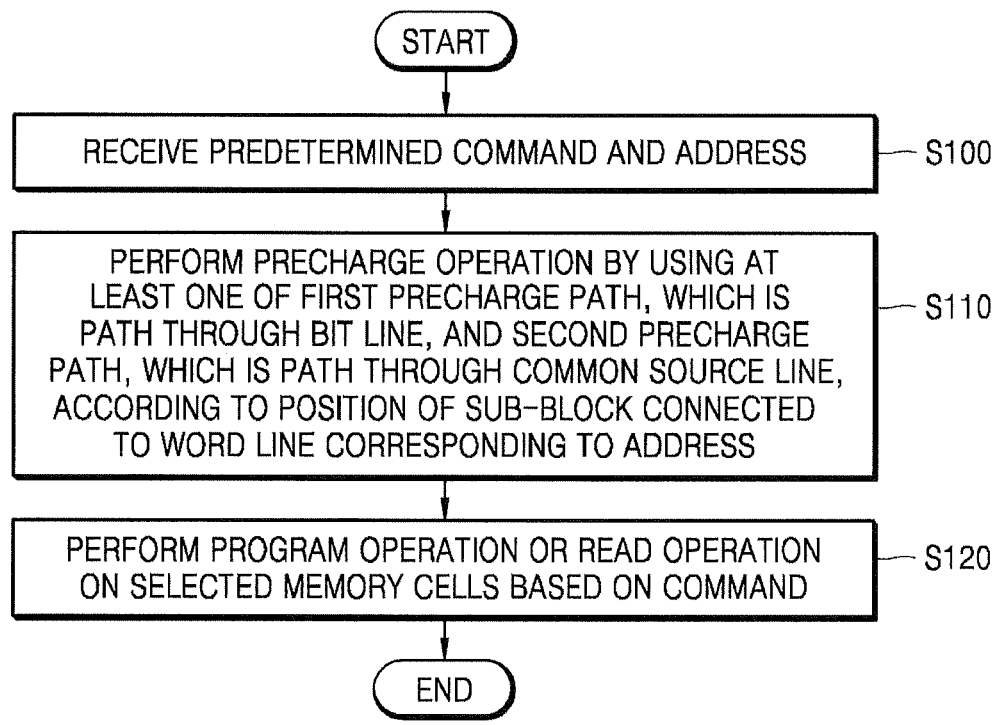
FIG. 9 shows a flowchart illustrating a memory operation according to an embodiment of the inventive concept.

FIG. 9 shows a flowchart illustrating a memory operation according to an embodiment of the inventive concept.

Referring to FIG. 9, the memory device may receive a predetermined command for instructing execution of a memory operation and an address indicating selected memory cells to be subjected to the memory operation (S100). The memory device may perform a precharge operation by using at least one of a first precharge path, which is a path through a bit line, and a second precharge path, which is a path through a common source line, according to the position of a sub-block connected to a word line corresponding to the address (S110). Thereafter, the memory device may perform a program operation or a read operation on the selected memory cells based on the command (S120).

Figure 10:
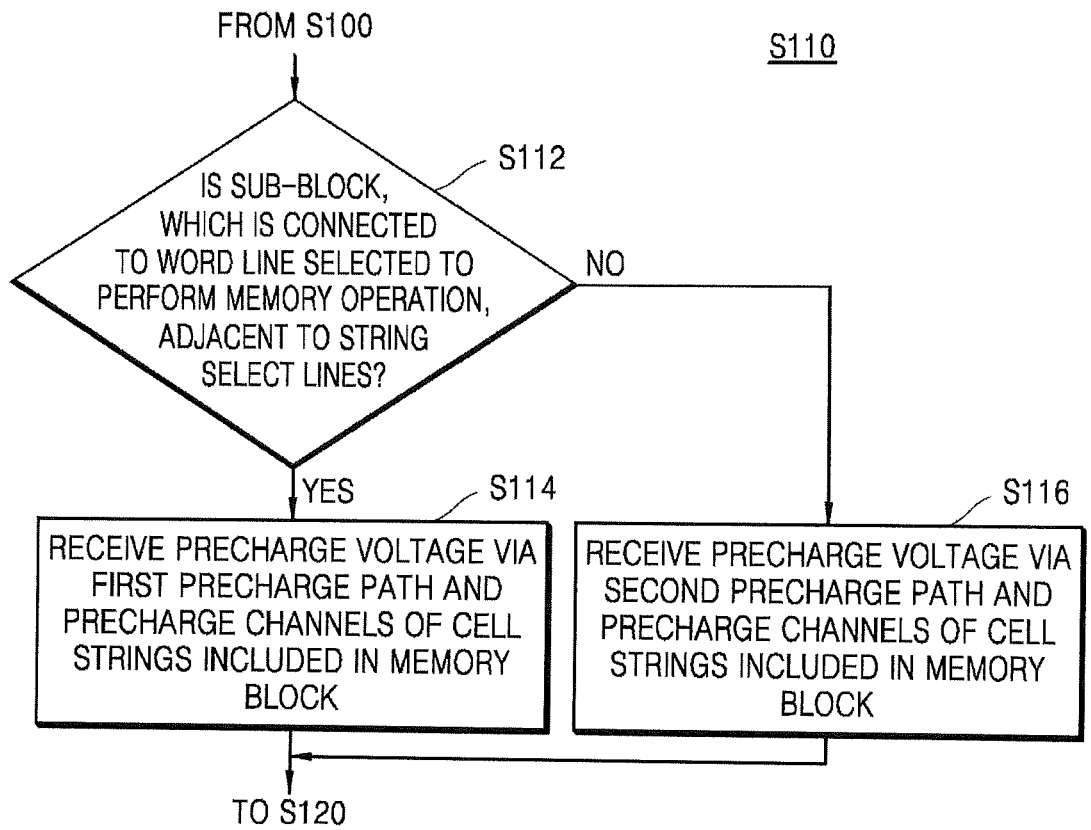
FIG. 10 shows a flowchart for specifically explaining operation S110 in FIG. 9.

FIG. 10 shows a flowchart for specifically explaining operation S110 in FIG. 9.

Referring to FIG. 10, the memory device may determine whether a sub-block, which is connected to a word line selected to perform a memory operation, is adjacent to string select lines (S112). When the sub-block connected to the selected word line is found to be adjacent to the string select lines (S112, YES), the memory device may receive a precharge voltage via the first precharge path and may precharge channels of the cell strings included in the memory block (S114). When the sub-block connected to the selected word line is found to be not adjacent to the string select lines (S112, NO), the memory device may receive a precharge voltage via the second precharge path and may precharge channels of the cell strings included in the memory block (S116). However, the present embodiment is only an example. In one or more embodiments, in S112, it may be determined whether the sub-block connected to the selected word line is adjacent to ground select lines. In addition, in some embodiments a reference is provided based on which the positions of a plurality of sub-blocks included in the memory block are defined as whether particular sub-blocks are adjacent to string select lines or adjacent to ground select lines. In one embodiment, at least one of information about the reference and information about the position of each of the sub-blocks may be stored in a storage of the memory controller 10A or memory device 20A illustrated in FIG. 1A. The memory device may use sub-blocks by using the information stored in the storage and may perform a memory operation.

Figure 11A:
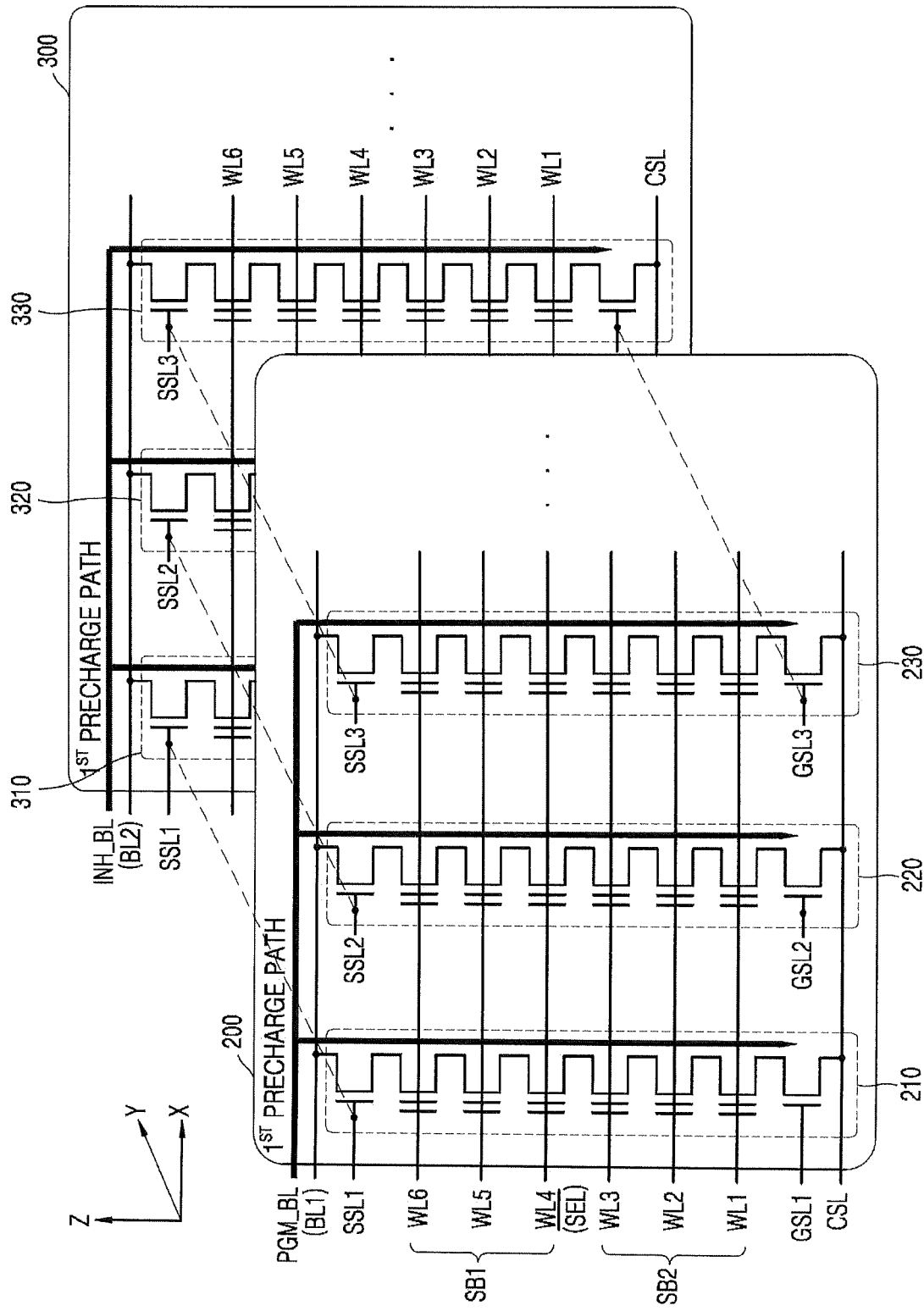
FIGS. 11A and 11B are diagrams for explaining a case where a precharge operation is performed through a first precharge path.
Figure 11B:
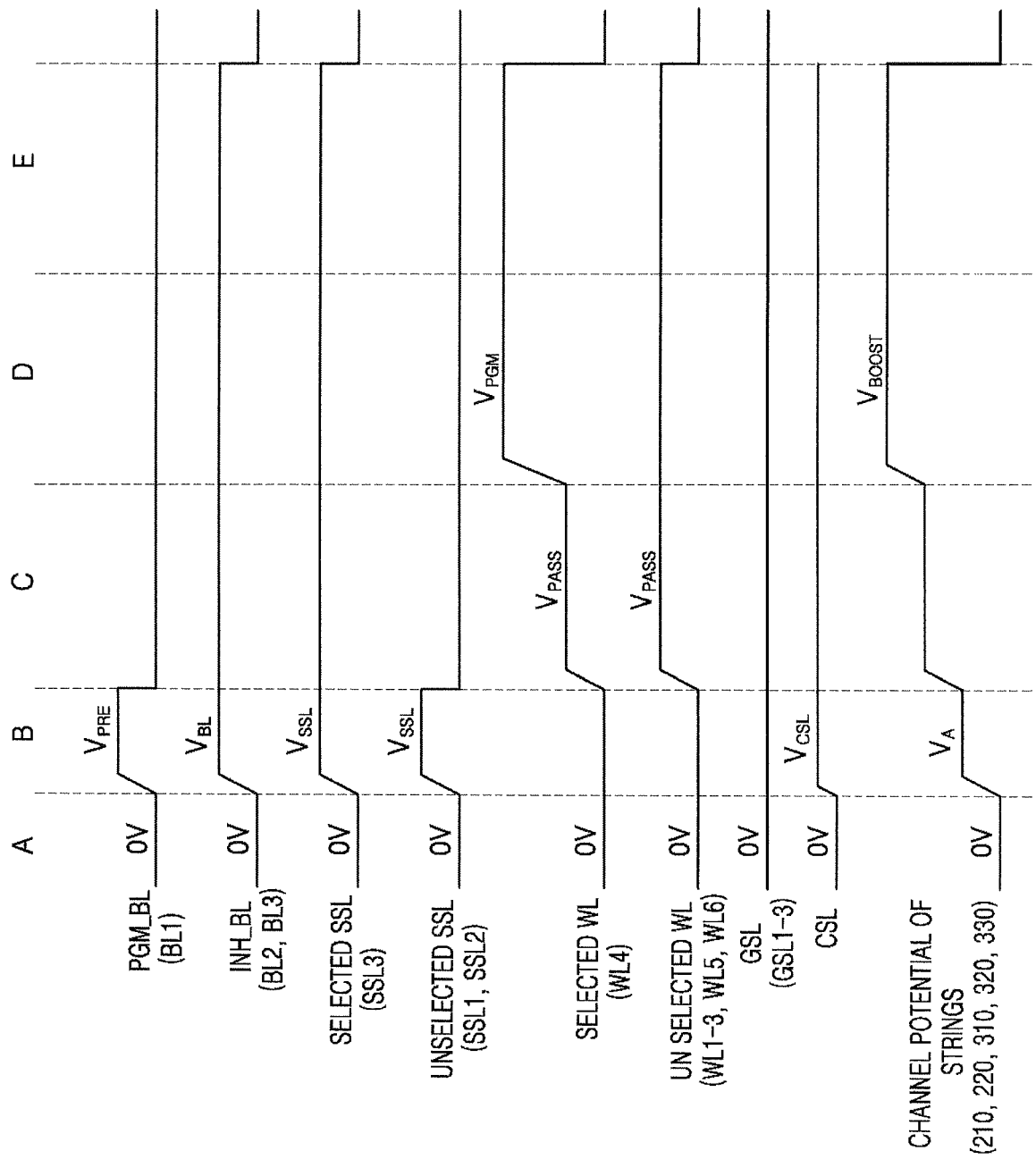

FIGS. 11A and 11B are diagrams for explaining a case where a precharge operation is performed through the first precharge path.

FIG. 11A shows a circuit diagram illustrating cell strings 210 to 230 and 310 to 330 connected to a program bit line (for example, BL1) and an inhibit bit line (for example, BL2), respectively. Hereinafter, embodiments will be described assuming that the program bit line is a first bit line BL1, the selected word line is a fourth word line WL4, and the selected string select line is a third string select line SSL3. For ease of description, the third bit line BL3 illustrated in FIG. 5A or FIG. 5B, which is an inhibit bit line, is not illustrated in FIG. 11A, Referring to FIG. 11A, during a program operation, 0 V may be applied to the program bit line BL1, and a voltage $V_{BL}$ having an arbitrary level may be applied to the inhibit bit line BL2. It is assumed that a program voltage $V_{PGM}$ is applied to the selected word line, for example, the fourth word line WL4 connected to the first sub-block SB1, and a pass voltage $V_{PASS}$ is applied to unselected word lines, for example, the first to third word lines WL1 to WL3, the fifth word line WL5, and the sixth word line WL6. Cell strings may be divided into a cell string group connected to the program bit line BL1 and a cell string group connected to the inhibit bit line BL2, wherein the cell string group connected to the program bit line BL1 is denoted by 200, and the cell string group connected to the inhibit bit line BL2 is denoted by 300. When the fourth word line WL4 connected to the first sub-block SB1 is a selected word line, since all of the memory cells of the first sub-block SB1 are not programmed, the disturbance, which has been described in connection with FIG. 8B, does not occur. In other words, in some embodiments, because the cells included in the first sub-block SB1 are adjacent to the string select line, the likelihood of the interference described in FIG. 8B may be less than using a precharge path that originates using the ground select line. Therefore, the memory device may perform the precharge operation by using the first precharge path through a bit line.

FIG. 11B is a timing diagram illustrating an exemplary bias method by cell strings connected to the bit lines BL1 to BL3 of FIG. 11A. Referring to FIG. 11B, a bias state before the program operation starts is shown in section A. It is assumed that the string select lines SSL1 to SSL3, the word lines WL1 to WL6, the ground select lines GSL1 to GSL3, the bit lines BL1 and BL2, and the common source line CSL are initialized to be 0 V in the section A.

In section B, a voltage ($V_{PRE}$ or a precharge voltage) having an arbitrary level is applied to the program bit line BL1, and a voltage $V_{BL}$ having an arbitrary level is applied to the inhibit bit lines BL2 and BL3, 0 V may be applied to the ground select lines GSL1 to GSL3, and a voltage $V_{CSL}$ having a certain level may be applied to the common source line CSL. Since a voltage $V_{SSL}$ having an arbitrary level is applied to the string select lines SSL1 to SSL3, string select transistors are individually turned on so that the bit lines BL1 to BL3 may be connected to the cell strings 210 to 230 and 310 to 330, and accordingly, the channel of each of the cell strings 210 to 230 and 310 to 330 may be precharged by using the voltage $V_{PRE}$ via a corresponding bit line selected from the bit lines BL1 to BL3. Accordingly, the channels of the cell strings 210 to 230 and 310 to 330 may be precharged to a predetermined voltage $V_A$ level. In section B, supply of the voltage to the word lines WL1 to WL6 has not yet been started.

In section C, 0 V is applied to the program bit line BL1 (PGM_BL) and the unselected string select lines SSL1 and SSL2, and the voltages $V_{BL}$ and $V_{SSL}$ may be applied to the inhibit bit lines BL2 and BL3 (INH_BL) and the selected string select line SSL3. A pass voltage $V_{PASS}$ may be applied to the word lines WL1 to WL6. In this regard, the channels of the cell strings 210, 220, and 310 to 330 which are disconnected from the bit lines BL1 to BL3 and the common source line CSL and thus in a floating state, may be boosted by a coupling effect.

In sections D and E, the program voltage $V_{PGM}$ may be applied only to the selected word line, that is, the fourth word line WL4. Therefore, the channel potential of each of the cell strings 210, 220, and 310 to 330 may be raised to a boosting voltage $V_{BOOST}$. In sections C, D, and E, the voltage $V_{CSL}$ applied in the section B may be directly applied to the common source line CSL.

The voltage $V_{PRE}$ applied to the bit lines BL1 to BL3 in the section B shown in FIG. 11B may have a level that is enough to precharge the channels of the cell strings to a predetermined voltage $V_A$ level. In one embodiment, the level of the precharge voltage $V_{PRE}$ may be the same as or different from the level of a predetermined power supply voltage. In addition, the levels of bias voltages in the sections illustrated in FIG. 11B are examples only, and such bias voltages may be applied at various levels in each section to implement the teachings of the inventive concept.

Figure 12A:
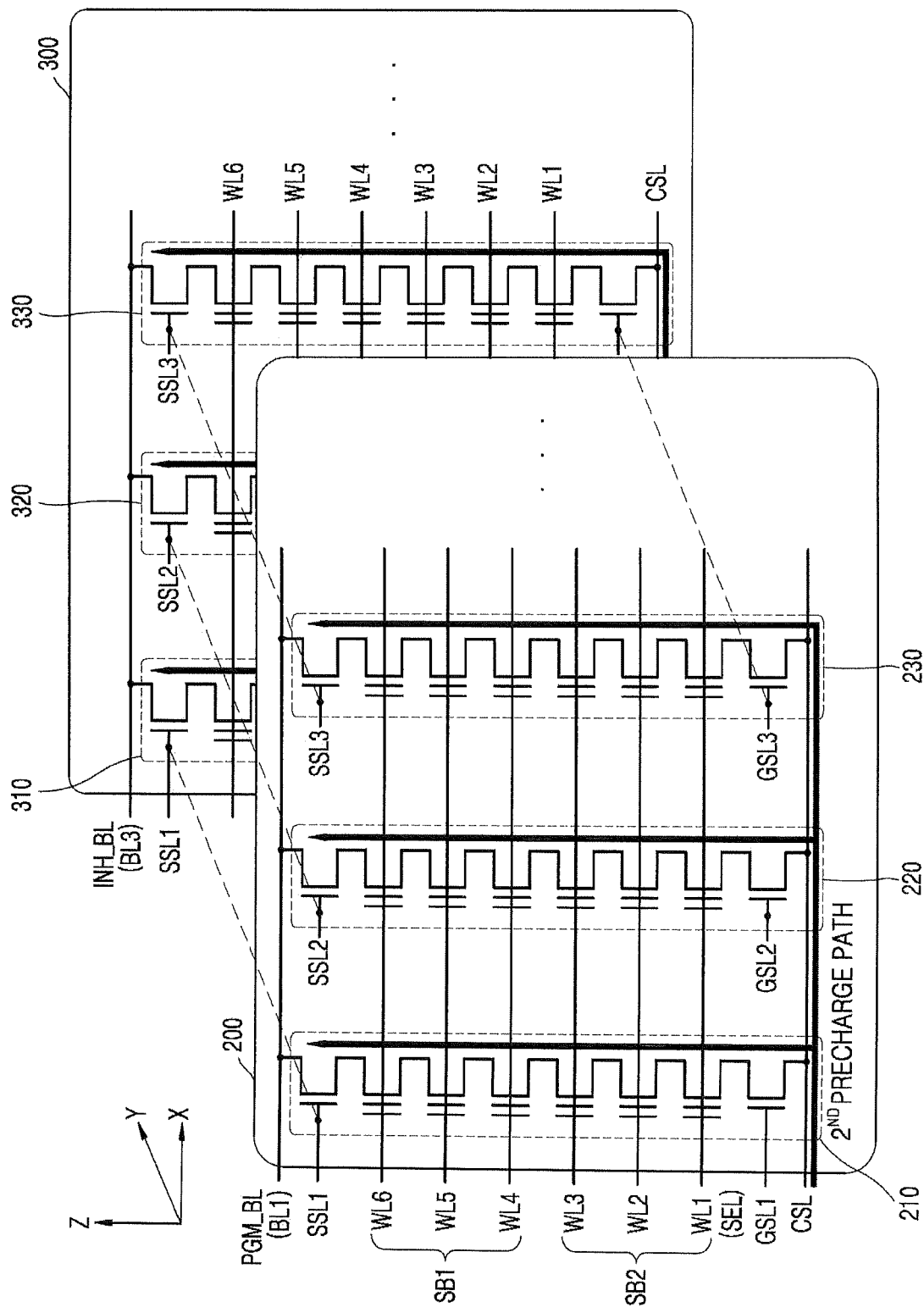
FIGS. 12A and 12B are diagrams for explaining a case where a precharge operation is performed through a second precharge path.
Figure 12B:
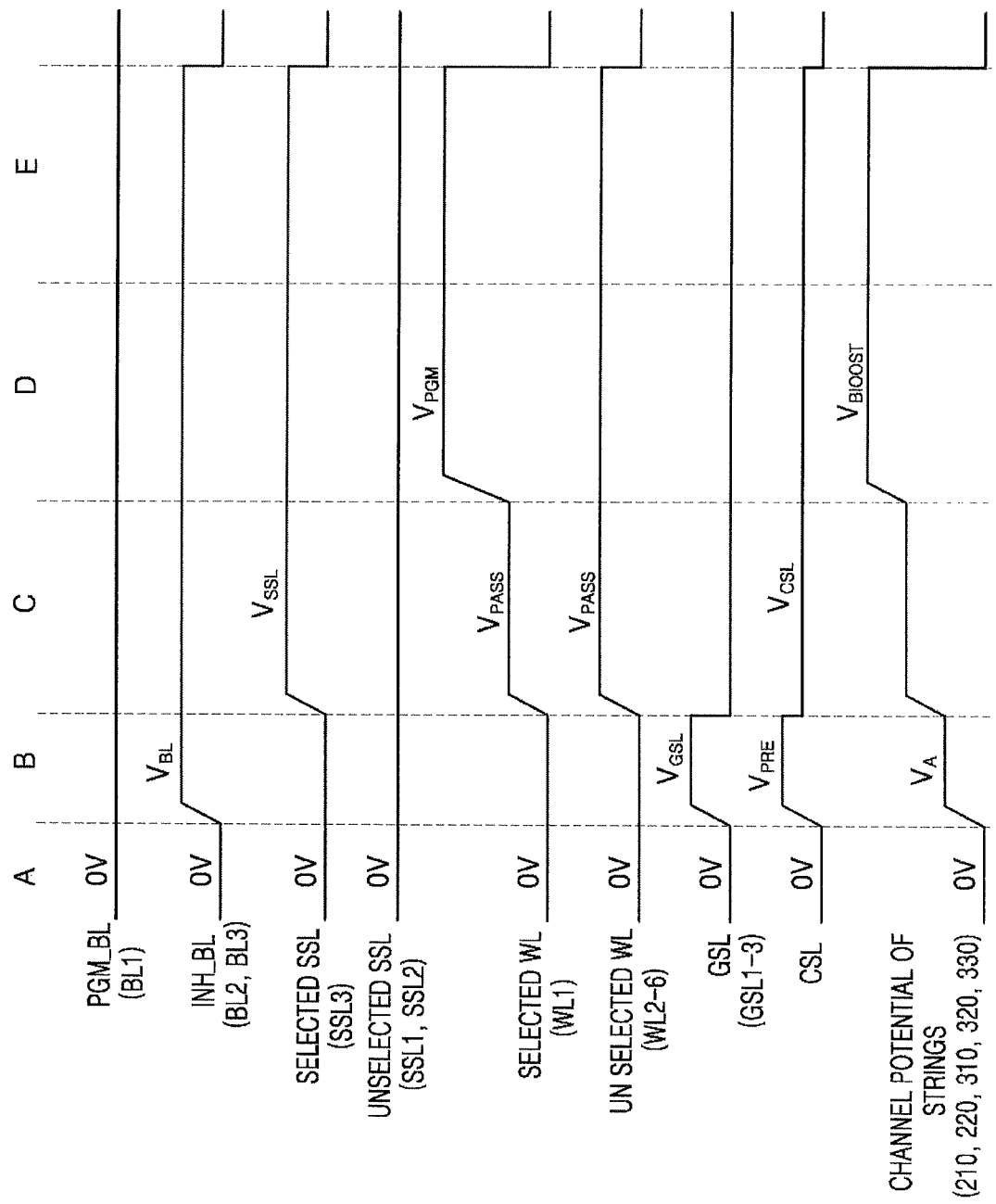

FIGS. 12A and 12B are diagrams for explaining a case where a precharge operation is performed through a second precharge path.

Unlike FIG. 11A, embodiments will be described in connection with FIG. 12A, assuming that a word line selected as a program target is a first word line WL1. Referring to FIG. 12A, during a program operation, 0 V may be applied to the program bit line BL1, and a voltage $V_{BL}$ having an arbitrary level may be applied to the inhibit bit line BL2. It is assumed that a program voltage $V_{PGM}$ is applied to the selected word line, for example, the first word line WL1 connected to the second sub-block SB2, and a pass voltage $V_{PASS}$ is applied to unselected word lines, for example, the second to sixth word lines WL2 to WL6. When the first word line WL1 connected to the second sub-block SB2 is a selected word line, all of the memory cells of the first sub-block SB1 may be in a programmed state as illustrated in FIG. 8A. Thus, the disturbance described in connection with FIG. 8B may occur, if unaddressed. Accordingly, the memory device may perform the precharge operation via the second precharge path, which is a path through the common source line rather than via the bit line.

FIG. 12B is a timing diagram illustrating an exemplary bias method by cell strings connected to the bit lines BL1 to BL3 of FIG. 12A. Referring to FIG. 12B, a bias state before the program operation starts is shown in section A. It is assumed that the string select lines SSL1 to SSL3, the word lines WL1 to WL6, the ground select lines GSL1 to GSL3, the bit lines BL1 and BL2, and the common source line CSL are initialized to be 0 V in the section A.

In section B, 0 V may be applied to the program bit line BL1 (PGM_BL) and the string select lines SSL1 to SSL3, a voltage $V_{BL}$ having an arbitrary level may be applied to the inhibit bit lines BL2 and BL3 (INH_BL), a voltage $V_{GSL}$ having an arbitrary level may be applied to the select lines GSL1 to GSL3, and a voltage $V_{PRE}'$ (or a precharge voltage) having an arbitrary level may be applied to the common source line CSL. Since a voltage $V_{GSL}$ is applied to the ground select lines GSL1 to GSL3, string select transistors are individually turned on so that the common source line CSL may be connected to the cell strings 210 to 230 and 310 to 330, and accordingly, the channel of each of the cell strings 210 to 230 and 310 to 330 may be precharged by using the voltage $V_{PRE'}$ via the common source line CSL. Accordingly, the channels of the cell strings 210, 220, and 310 to 330 may be precharged to a predetermined voltage $V_A$ level. In section B, supply of the voltage to the word lines WL1 to WL6 has not yet been started.

In section C, 0 V may be applied to the program bit line BL1 (PGM_BL) and the unselected string select lines SSL1 and SSL2, the voltage $V_{BL}$ having an arbitrary level may be applied to the inhibit bit lines BL2 and BL3 (INH_BL), and the voltage $V_{SSL}$ having an arbitrary level may be applied to the selected string select line SSL3. A pass voltage $V_{PASS}$ may be applied to the word lines WL1 to WL6. In this regard, the channels of the cell strings 210, 220, and 310 to 330 which are disconnected from the bit lines BL1 to BL3 and the common source line CSL and thus in a floating state, may be boosted by a coupling effect. In sections C, D, and E, a voltage $V_{CSL}$ having a level that is different from (or lower than) the level of the voltage $V_{PRE}'$ that has been applied to the common source line CSL in the section B, may be applied to the common source line CSL.

In sections D and E, the program voltage $V_{PGM}$ may be applied only to the selected word line, that is, the first word line WL1. Therefore, the channel potential of each of the cell strings 210, 220, and 310 to 330 may be raised to a boosting voltage $V_{BOOST}$.

The voltage $V_{PRE'}$ applied to the common source line CSL in the section B shown in FIG. 12B may have a level that is enough to precharge the channels of the cell strings to a predetermined voltage $V_A$ level. In one embodiment, the level of the precharge voltage $V_{PRE}'$ may be the same as or different from the level of a power supply voltage $V_{CC}$. Furthermore, in the section B, the voltage applied to the selected string select line SSL3 is shifted from 0 V to the power supply voltage $V_{CC}$. In addition, the levels of bias voltages in the sections illustrated in FIG. 12B are examples only, and such bias voltages may be applied at various levels in each section to implement the teachings of the inventive concept.

Figure 13A:
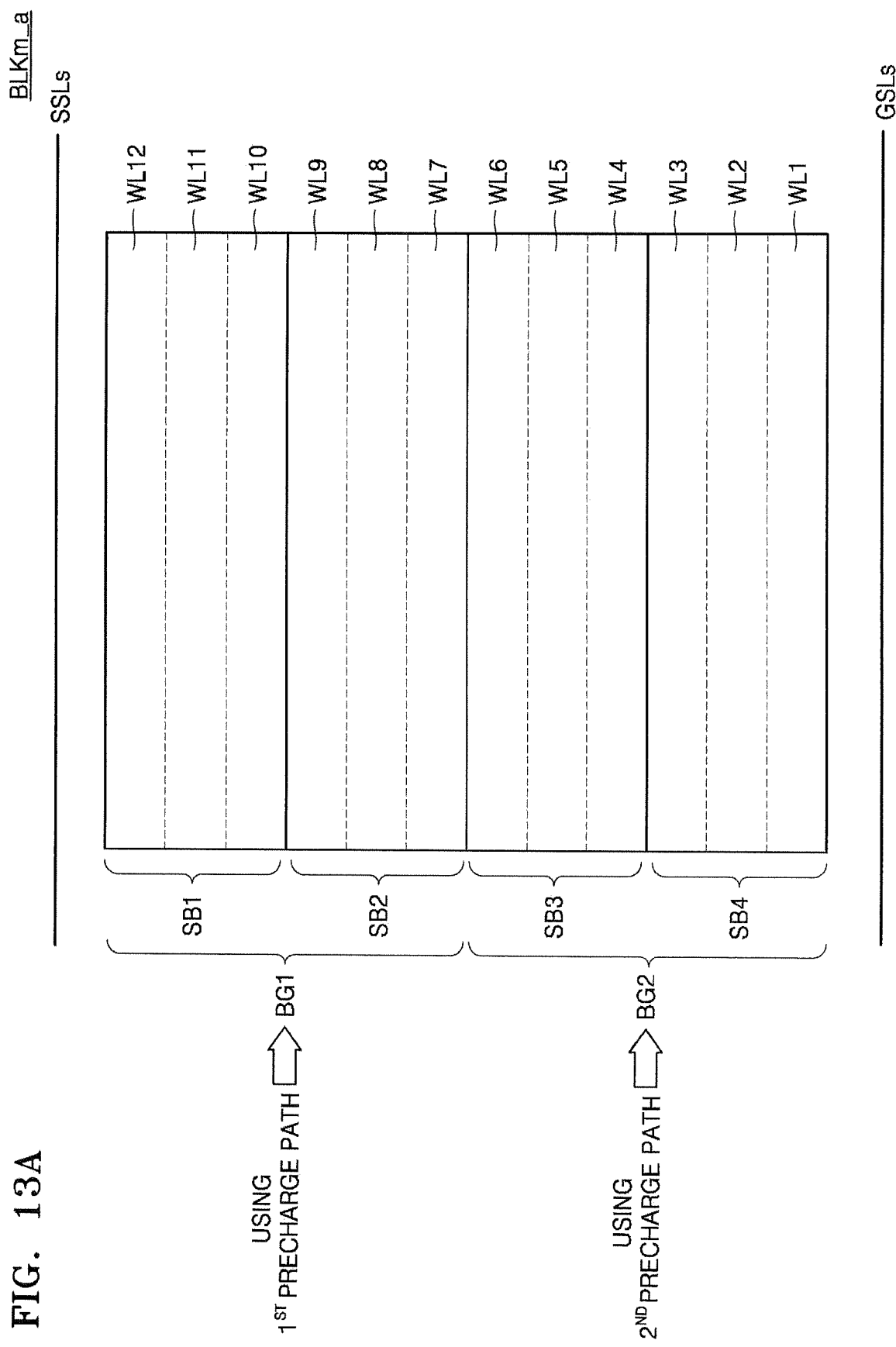
FIGS. 13A and 13B show diagrams for describing an embodiment of a reference for defining the position of a sub-block for a precharge operation of a memory device according to the inventive concept.
Figure 13B:
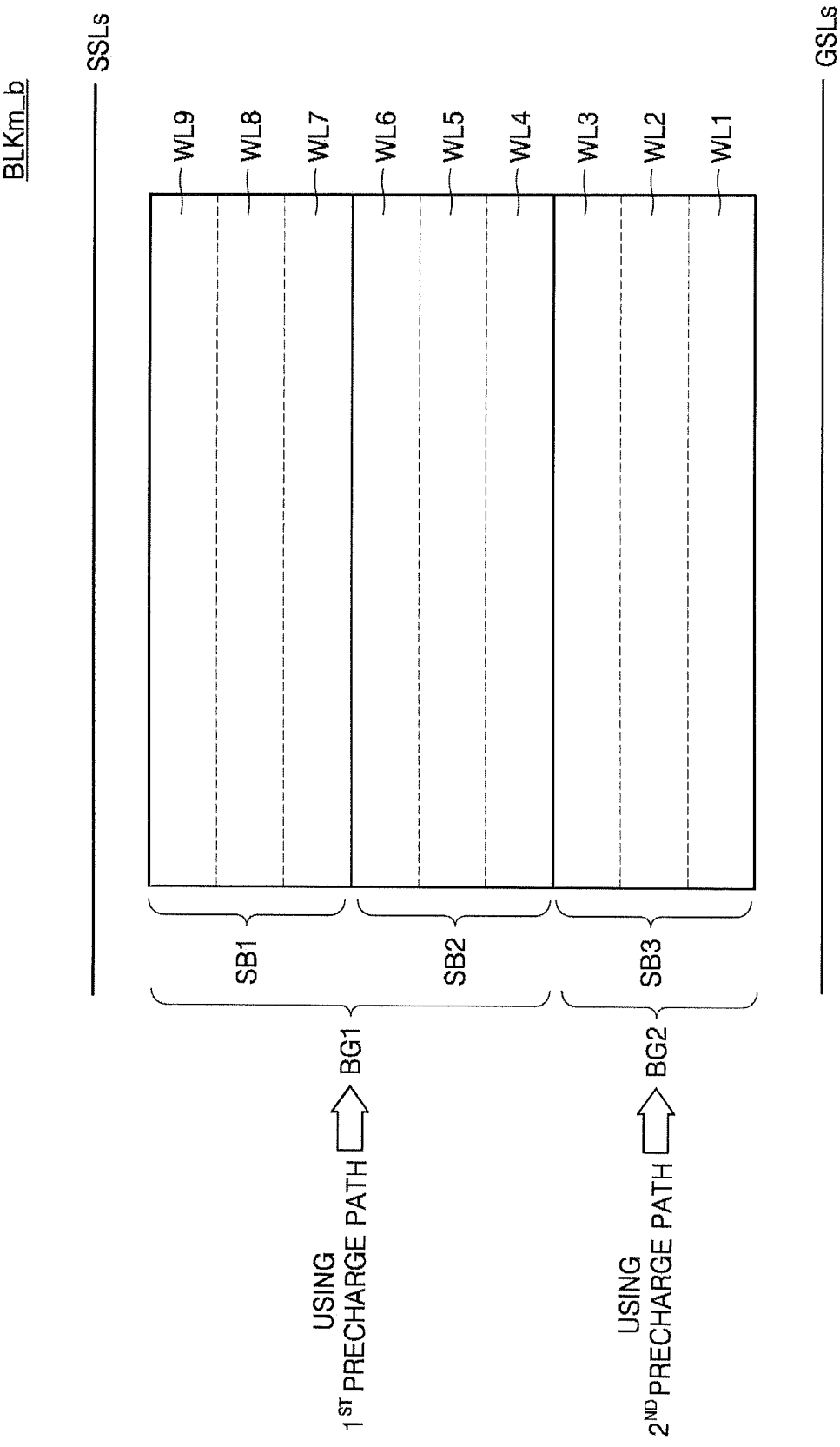

FIGS. 13A and 13B show diagrams for describing an embodiment of a reference for defining the position of a sub-block for a precharge operation of a memory device according to the inventive concept.

Referring to FIG. 13A, a memory block BLKm_a may include first to fourth sub-blocks SB1 to SB4, and the first to fourth sub-blocks SB1 to SB4 may be divided into a first block group BG1 adjacent to string select lines SSLs and a second block group BG2 adjacent to ground select lines GSLs. Sub-blocks adjacent to the string select lines SSLs are classified as the first block group BG1, and sub-blocks adjacent to the ground select lines GSLs are classified as the second block group BG2. In one embodiment, the number of sub-blocks included in the first block group BG1 may be identical to the number of sub-blocks included in the second block group BG2, and further, the number of memory cells included in the first block group BG1 may be identical to the number of memory cells included in the second block group BG2. The first block group BG1 may include first and second sub-blocks SB1 and SB2, and the second block group BG2 may include third and fourth sub-blocks SB3 and SB4. Accordingly, when a memory device performs a precharge operation, the memory device determines which block group a sub-block connected to the selected word line to be subjected to the memory operation belongs to, and based on the result, the memory device selects a precharge path, and by using the selected precharge path, the memory device may perform the precharge operation. For example, when a sub-block connected to a selected word line to be subjected to a memory operation is included in the first block group BG1, the memory device may perform a precharge operation by using a first precharge path, that is, a path through a bit line; and when a sub-block connected to a selected word line to be subjected to a memory operation is included in the second block group BG2, the memory device may perform a precharge operation by using a second precharge path, that is, a path through a common source line.

In one embodiment, the memory controller may store, in a storage, information about which block group BG1 or BG2 each of the sub-blocks SB1 to SB4 belongs to, and based on the information, the memory controller may control the precharge operation performed by the memory device.

Referring to FIG. 13B, a memory block BLKm_b may include first to third sub-blocks SB1 to SB3, and the first to third sub-blocks SB1 to SB3 may be divided into a first block group BG1 adjacent to string select lines SSLs and a second block group BG2 adjacent to the ground select lines GSLs. In one embodiment, the number of sub-blocks included in the first block group BG1 may be different from the number of sub-blocks included in the second block group BG2, and further, the number of memory cells included in the first block group BG1 may be different from the number of memory cells included in the second block group BG2. The first block group BG1 may include first and second sub-blocks SB1 and SB2, and the second block group BG2 may include the third sub-block SB3. The precharge operation of the memory device has already been described in detail with reference to FIG. 13A. Accordingly, the related description will be skipped herein.

Figure 14A:
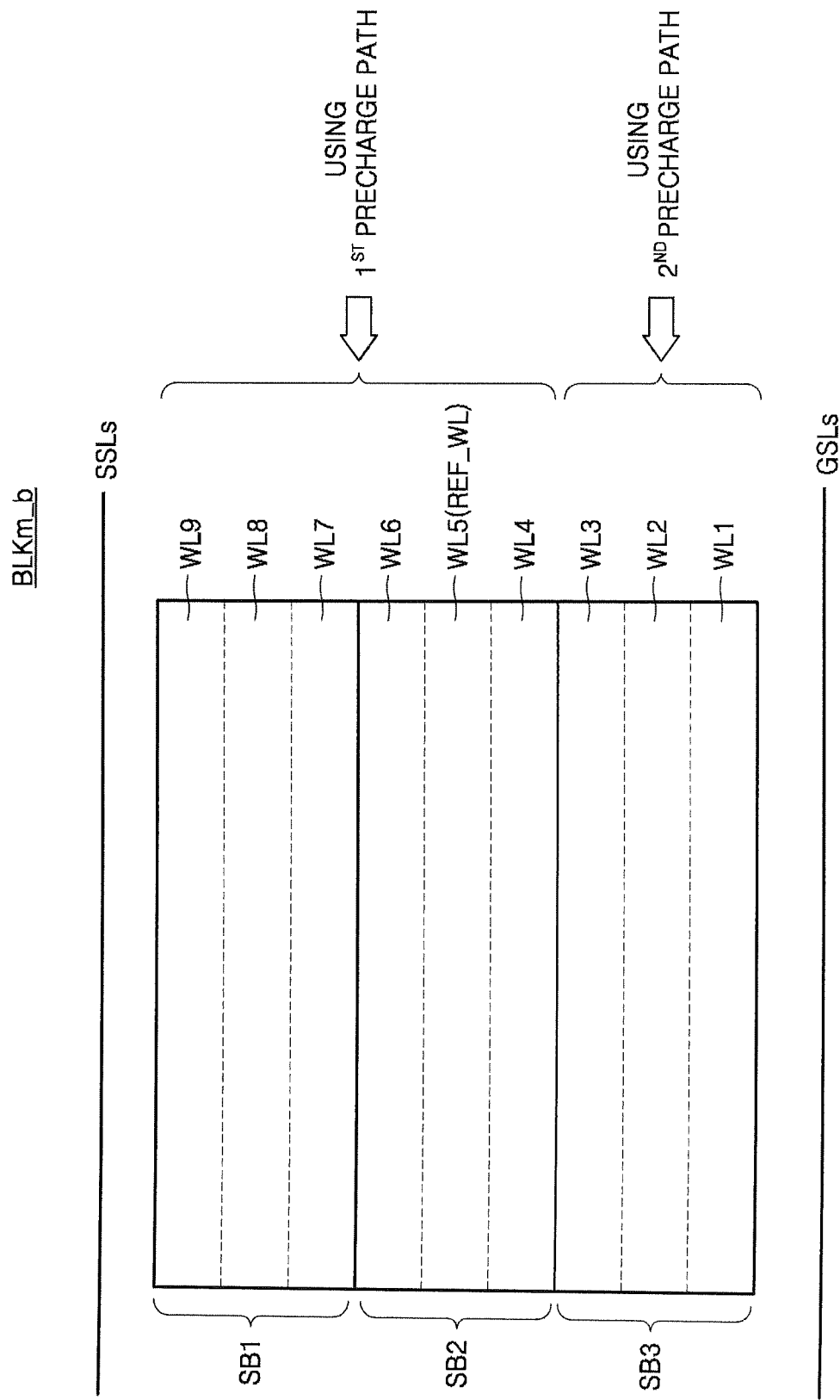
Figure 14C:
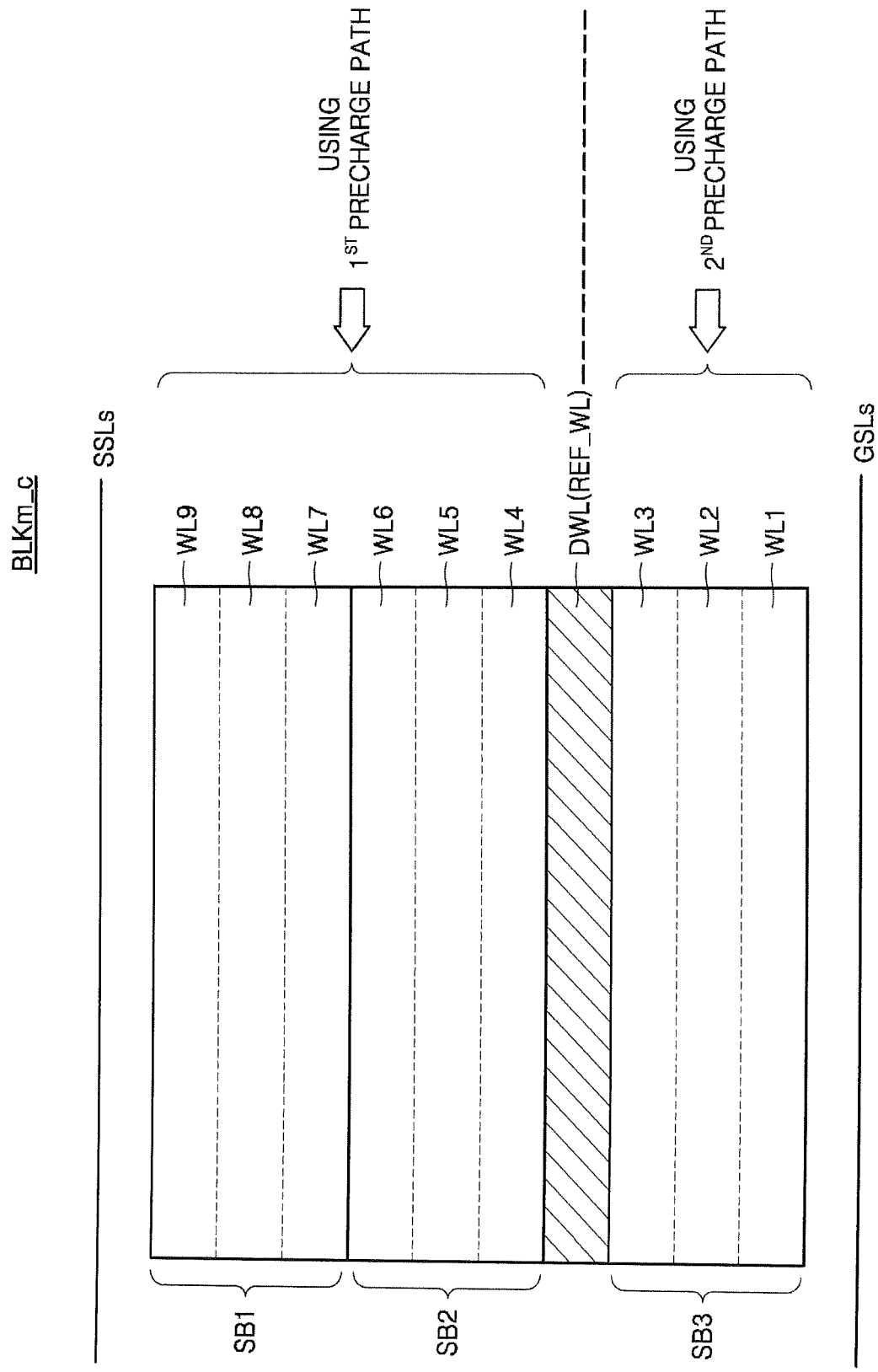

FIGS. 14A to 14C show diagrams for describing an embodiment of a reference for defining the position of a sub-block for a precharge operation of a memory device according to the inventive concept.

Referring to FIG. 14A, a memory block BLKm_b may include first to third sub-blocks SB1 to SB3. A first sub-block SB1 may be connected to seventh to ninth word lines WL7 to WL9, a second sub-block SB2 may be connected to fourth to sixth word lines WL4 to WL6, and a third sub-block SB3 may be connected to first to third word lines WL1 to WL3. When a precharge operation is performed, the fifth word line WL5 may be a reference word line REF_WL used to determine whether each of the sub-blocks SB1 to SB3 is adjacent to string select lines SSLs or adjacent to ground select lines GSLs. Hereinafter, it is assumed that the fifth word line WL5 is the reference word line REF_WL. In one embodiment, a sub-block (for example, the third sub-block SB3) below the reference word line REF_WL may be classified as a sub-block adjacent to the ground select lines GSLs, and a sub-block above the reference word line REF_WL (for example, the first sub-block SB1) may be classified as a sub-block adjacent to the string select lines SSLs. In one embodiment, the second sub-block SB2 connected to the reference word line REF_WL may be preset to be classified as a sub-block adjacent to the ground select lines GSLs or a sub-block adjacent to the string select lines SSLs. Referring to FIG. 14A, the second sub-block SB2 connected to the reference word line REF_WL is preset as being adjacent to the string select lines SSLs. Accordingly, when a selected word line corresponding to a selected memory cell which is to be subjected to a memory operation is connected to the first sub-block SB1 or the second sub-block SB2, the memory device may perform the precharge operation through the first precharge path. In one embodiment, when the selected word line is connected to the third sub-block SB3, the memory device may perform a precharge operation through the second precharge path.

Unlike FIG. 14A, FIG. 14B illustrates an embodiment in which, when the second sub-block connected to the reference word line REF_WL, a memory device may perform a precharge operation using different precharge paths. In detail, referring to FIG. 14B, when a selected word line corresponding to a selected memory cell which is to be subjected to a memory operation is a sixth word line WL6 (connected to the second sub-block SB2), the memory device may perform the precharge operation through the first precharge path. When the selected word line is the fourth word line WL4 (connected to the second sub-block SB2), the memory device may perform a precharge operation through the second precharge path. In one embodiment, when the selected word line is the fifth word line WL5 which is the reference word line REF_WL, the memory device may be preset to perform a precharge operation by using the first precharge path or the second precharge path. Accordingly, when the selected word line is any one of the sixth to ninth word lines WL6 to WL9, the memory device may perform the precharge operation through the first precharge path, and when the selected word line is any one of the first to fourth word lines WL1 to WL4, the memory device may perform the precharge operation through the second precharge path. When the selected word line is the fifth word line WL5, based on the preset information, the memory device may perform the precharge operation through the first precharge path or the second precharge path. In some embodiments, the precharge operation may use a path that alternates between the first and second precharge paths.

Referring to FIG. 14C, a memory block BLKm_c may include first to third sub-blocks SB1 to SB3, and may further include dummy memory cells. The dummy memory cells may be connected to a dummy word line DWL, and the dummy word line DWL may be a reference word line REF_WL used to define the position of a sub-block during the precharge operation of the memory device. In one embodiment, a sub-block (for example, the third sub-block SB3) below the dummy word line DWL may be classified as a sub-block adjacent to the ground select lines GSLs, and a sub-block above the dummy word line DWL (for example, the first sub-block SB1 and the second sub-block SB2) may be classified as a sub-block adjacent to the string select lines SSLs. Data programmed into the dummy memory cells may be dummy data, and data bits programmed into the memory cells included in the sub-blocks SB1 to SB3 may be identical to or different from data bits programmed into the dummy memory cells.

Figure 15:
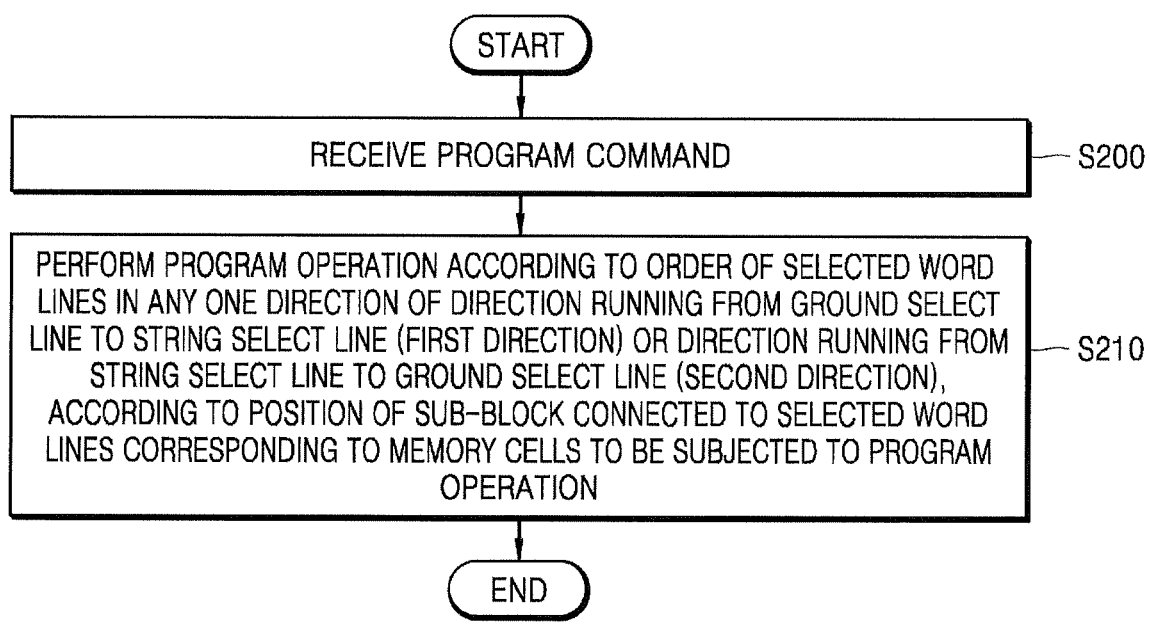
FIG. 15 shows a flowchart for explaining a programming method according to the position of a sub-block.

FIG. 15 shows a flowchart for explaining a programming method according to the position of a sub-block.

Referring to FIG. 15, a memory device may receive a program command transmitted by a memory controller (S200). According to the position of a sub-block connected to the selected word lines corresponding to memory cells to be subjected to a program operation, the memory device may perform the program operation according to the order of selected word lines in any one direction of a direction running from a ground select line to a string select line (hereinafter referred to as a first direction) or a direction running from the string select line to the ground select line (hereinafter referred to as a second direction) (S210).

Figure 16:
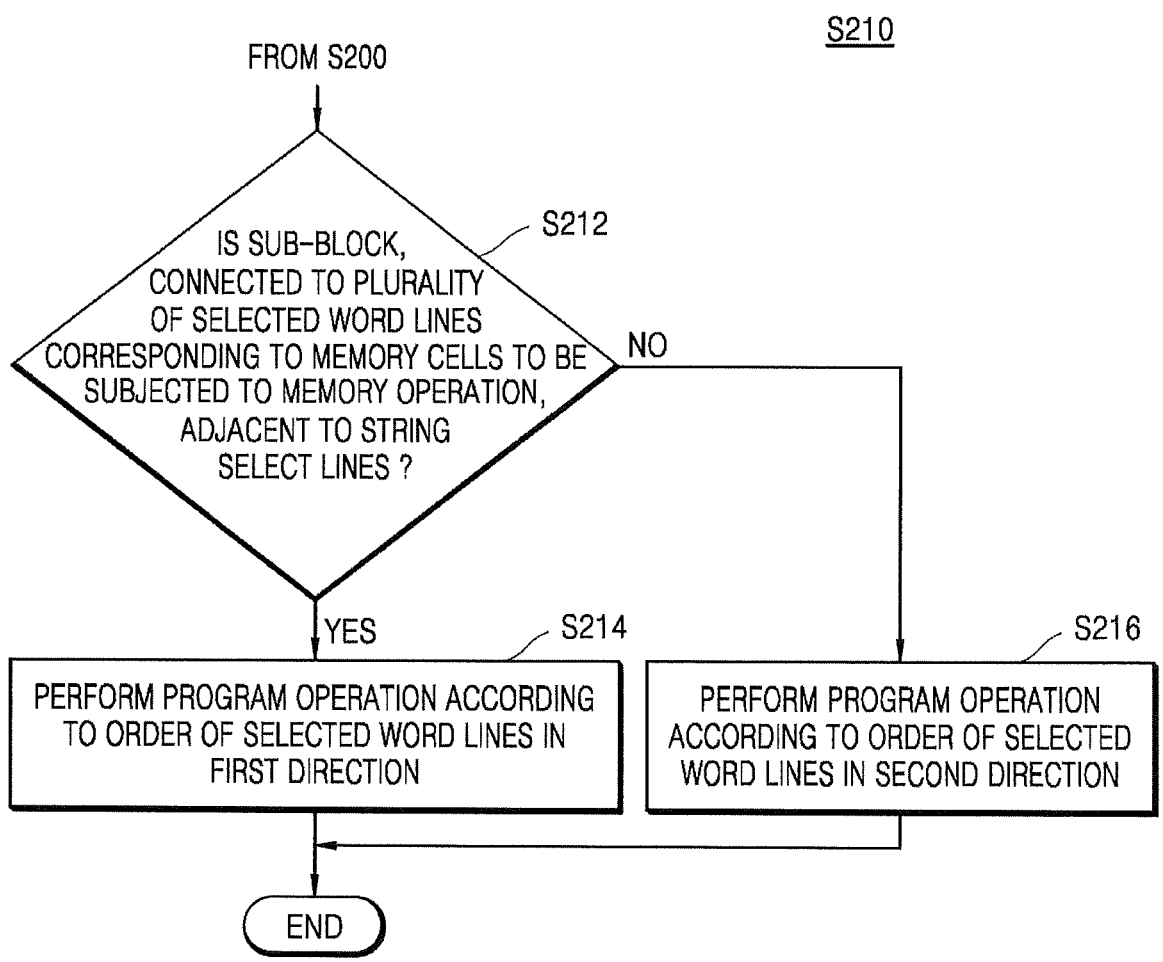
FIG. 16 shows a flowchart specifically illustrating operation S210 of FIG. 15.

FIG. 16 shows a flowchart specifically illustrating operation S210 of FIG. 15.

Referring to FIG. 16, it may be determined whether a sub-block, connected to a plurality of selected word lines corresponding to memory cells to be subjected to a memory operation, is adjacent to string select lines (or adjacent to ground select lines) (S212). When the sub-block connected to the selected word lines is adjacent to the string select lines (S212, YES), the memory device may perform the program operation according to the order of the selected word lines in the first direction (S214). When the sub-block connected to the selected word lines is not adjacent to the string select lines (S212, NO; or adjacent to the ground select lines), the memory device may perform the program operation in the order of the selected word lines in the second direction (S216).

Figure 17:
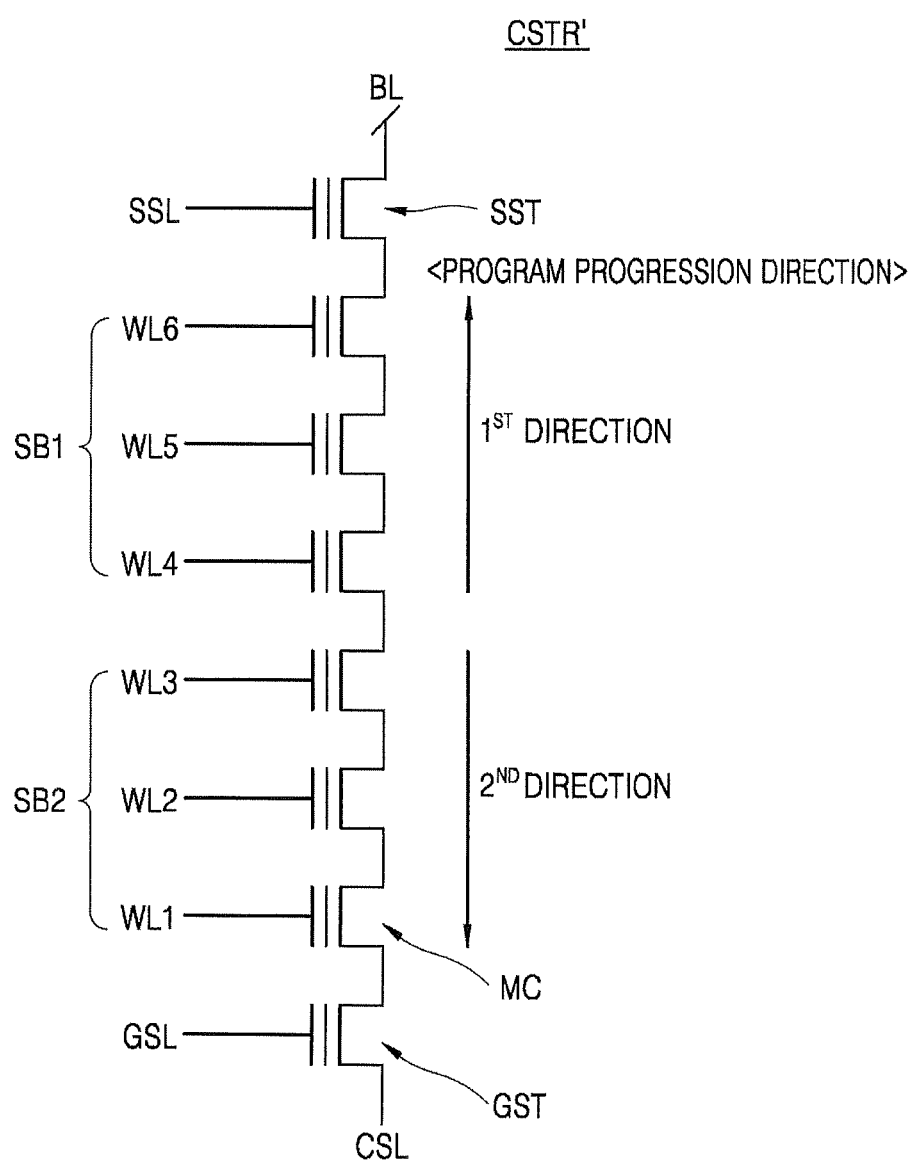
FIG. 17 shows a diagram illustrating a cell string for explaining a program operation according to an embodiment of the inventive concept.

FIG. 17 shows a diagram illustrating a cell string for explaining a program operation according to an embodiment of the inventive concept.

Referring to FIG. 17, a memory block may include a cell string CSTR'. The cell string CSTR' may include a string select transistor SST for controlling the connection between a bit line BL and the cell string CSTR', a ground select transistor GST for controlling the connection between a common source line CSL and the cell string CSTR', and a plurality of memory cells MC. The first sub-block SB1 may include memory cells connected to fourth to sixth word lines WL4 to WL6, and may be classified as a sub-block adjacent to the string select line SSL. The second sub-block SB2 may include memory cells connected to first to third word lines WL1 to WL3, and may be classified as a sub-block adjacent to the ground select line GSL.

When a sub-block connected to the plurality of selected fourth to sixth word lines WL4 to WL6 corresponding to memory cells to be programmed is the first sub-block SB1, the memory device may perform a program operation according to the order of the selected fourth to sixth word lines WL4 to WL6 in a first direction 1$^{ST}$ DIRECTION which extends from the ground select line GSL toward the string select line SSL. For example, the memory device may perform a program operation in the stated program sequence of the fourth word line WL4, the fifth word line WL5, and the sixth word line WL6. In one embodiment, when a sub-block, connected to the plurality of selected first to third word lines WL1 to WL3 corresponding to memory cells to be subjected to the program operation, is the second sub-block SB2, the memory device may perform a program operation according to the order of the selected first to third word lines WL1 to WL3 in a second direction (2$^{ND}$ DIRECTION) which extends from the string select line SSL toward the ground select line GSL. For example, the memory device may perform a program operation in the stated program sequence of the third word line WL3, the second word line WL2, and the first word line WL1.

In one embodiment, the memory device may perform the program operation roughly according to the order of the selected fourth to sixth word lines WL4 to WL6 in the first direction 1$^{ST}$ DIRECTION, and then the memory device may perform the program operation finely according to the order of the selected fourth to sixth word lines WL4 to WL6 in the first direction 1$^{ST}$ DIRECTION. When the memory cell is a multilevel cell, a lower bit may be programmed according to the order of the selected fourth to sixth word lines WL4 to WL6 in the first direction 1$^{ST}$ DIRECTION, a upper bit can be programmed according to the order of the selected fourth to sixth word lines WL4 to WL6 in the first direction 1$^{ST}$ DIRECTION. This is an exemplary embodiment, and not limited thereto, the two program methods described above may be combined. The above described programming method can also be applied to the second sub block SB2 that may be programmed in the second direction (2$^{ND}$ DIRECTION).

In one or more embodiments, the memory device may perform the program operation by using various methods (for example, a high speed program method, a shadow program method, a Reprogram method, a Sun-Who program method, a Sun-E-Who program method, etc.). The memory device may perform the program operation by changing the program sequence according to the position of a sub-block connected to the selected word line to be subjected to a program operation by using the selected program method.

Figure 18A:
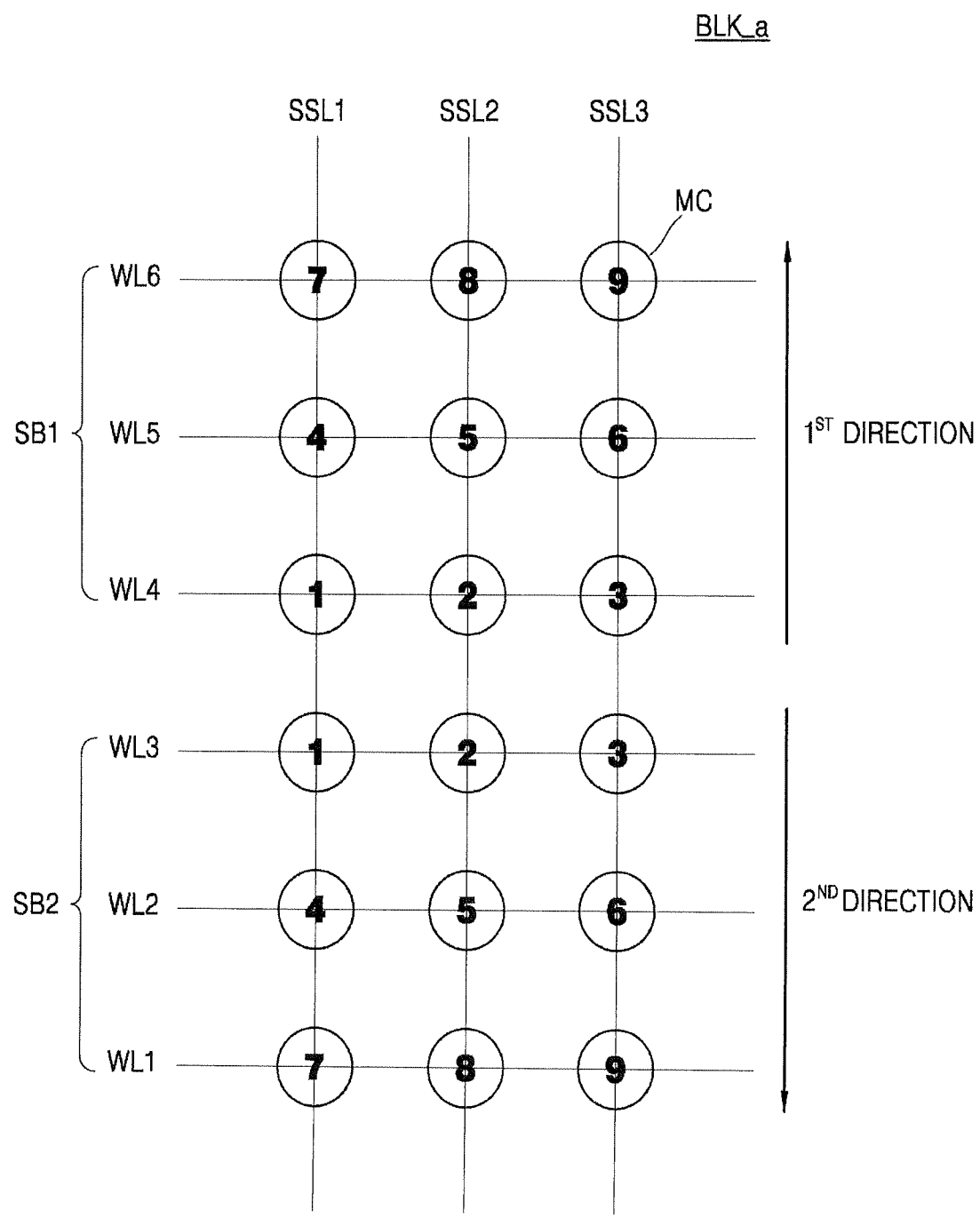
FIGS. 18A to 18C show views for explaining various program operation-related embodiments to which the embodiment of FIG. 17 is applied.
Figure 18B:
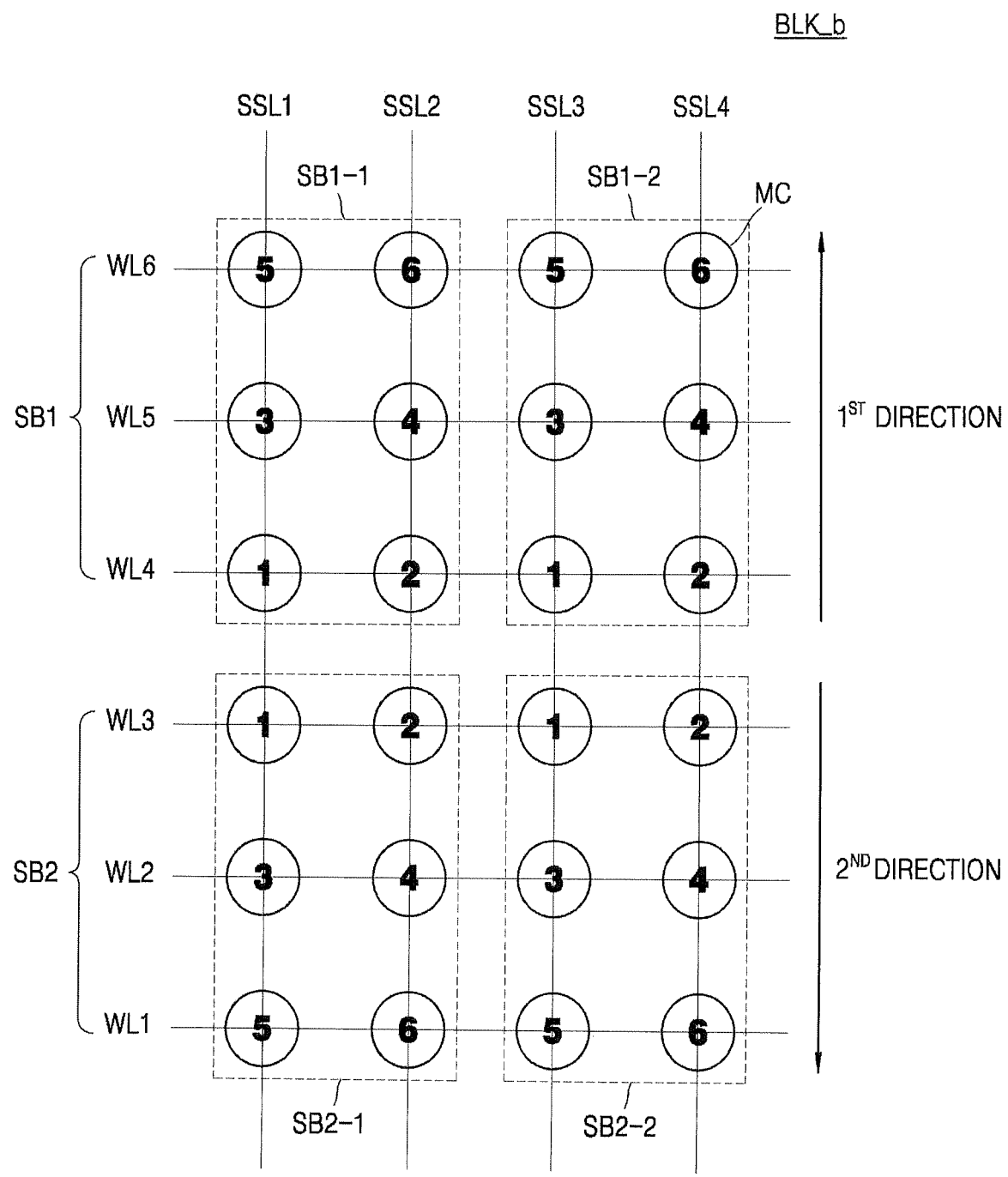
Figure 18C:
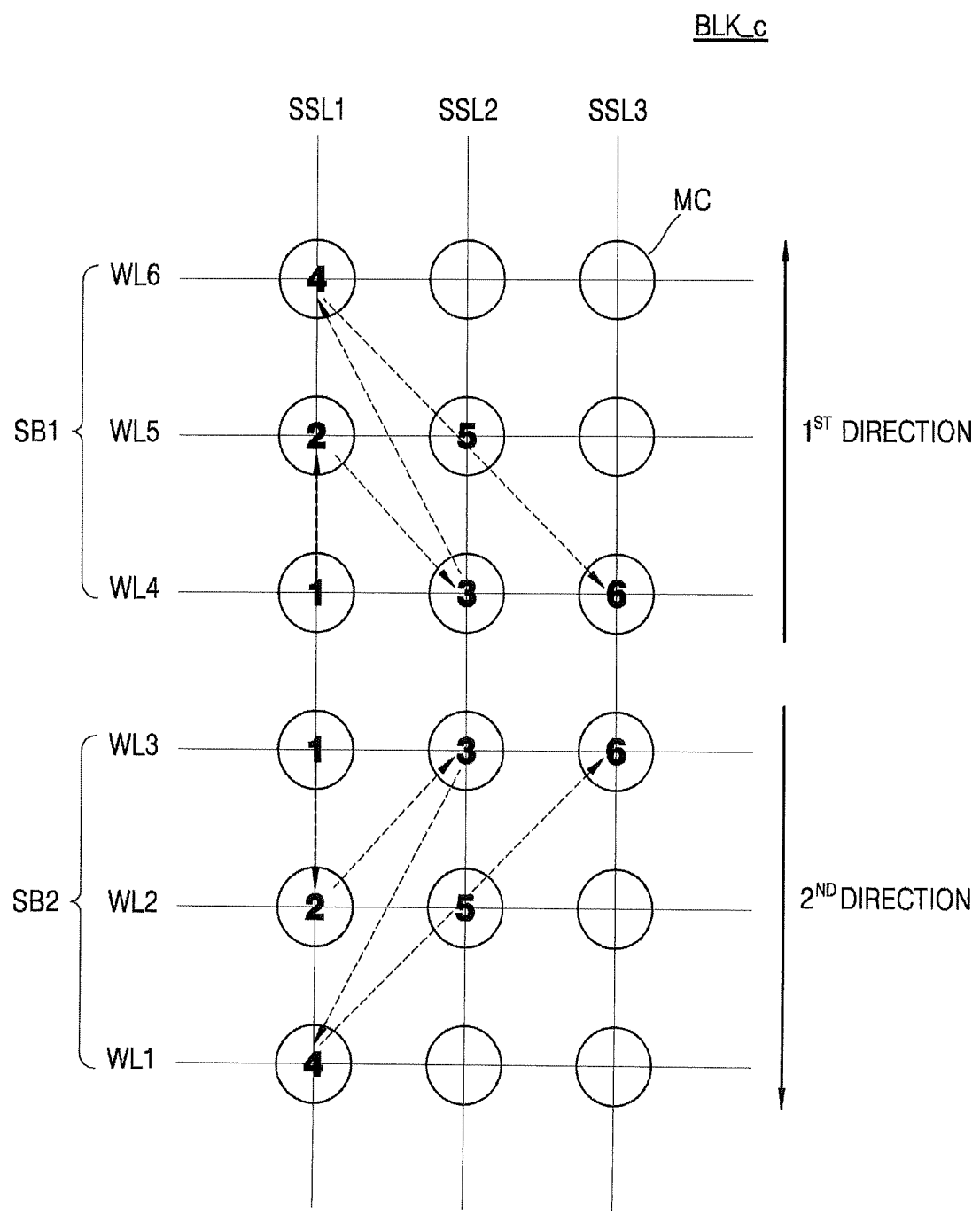

FIGS. 18A to 18C show views for explaining various program operation-related embodiments to which the embodiment of FIG. 17 is applied.

Referring to FIG. 18A, a memory block BLK_a may include a plurality of memory cells MC connected to first to third string select lines SSL1 to SSL3 and first to sixth word lines WL1 to WL6. A first sub-block SB1 may include memory cells connected to the fourth to sixth word lines WL4 to WL6, and a second sub-block SB2 may include memory cells connected to the first to third word lines WL1 to WL3.

When the memory device performs a program operation on memory cells connected to the fourth to sixth word lines WL4 to WL6, the program operation may be sequentially performed according to the order of word lines in a first direction 1$^{ST}$ DIRECTION. In one embodiment, the memory device may perform a program sequence on the first sub-block SB1 according to an address scramble (1→2→3 . . . →9). The memory device may perform the program operation on memory cells connected to the fourth word line WL4, memory cells connected to the fifth word line WL5, and memory cells connected to the sixth word line WL6 in this stated order. Regarding memory cells connected to an identical word line, the memory device may sequentially perform a program operation on the memory cells in a predetermined order. In one embodiment, regarding memory cells connected to an identical word line, the program operation may be performed on a memory cell connected to the first string select line SSL1, a memory cell connected to the second string select line SSL2, and a memory cell connected to a third string select line SSL3 in this stated order.

When the memory device performs a program operation on memory cells connected to the first to third word lines WL1 to WL3, the program operation may be sequentially performed according to the order of word lines in a second direction 2$^{ND}$ DIRECTION. The memory device may perform a program sequence on the second sub-block SB2 according to an address scramble (1→2→3 . . . →9). The memory device may perform the program operation on memory cells connected to the third word line WL3, memory cells connected to the second word line WL2, and memory cells connected to the first word line WL1 in this stated order. Regarding memory cells connected to an identical word line, the memory device may sequentially perform a program operation on the memory cells in a predetermined order. In one embodiment, regarding memory cells connected to an identical word line, the program operation may be performed on a memory cell connected to the first string select line SSL1, a memory cell connected to the second string select line SSL2, and a memory cell connected to a third string select line SSL3 in this stated order.

Referring to FIG. 18B, a memory block BLK_b may include a plurality of memory cells MC connected to first to fourth string select lines SSL1 to SSL4 and first to sixth word lines WL1 to WL6. The memory block BLK_b illustrated in FIG. 18B may correspond to the configuration of the memory block BLKn' illustrated in FIG. 5B.

The 1-1 sub-block SB1-1 may be connected to the fourth to sixth word lines WL4 to WL6, and may include memory cells connected to the first string select line SSL1 and the second string select line SSL2, and the 1-2 sub-blocks SB1-2 may be connected to the fourth to sixth word lines WL4 to WL6 and may include memory cells connected to the third string select line SSL3 and the fourth string select line SSL4. The 2-1 sub-block SB2-1 may be connected to the first to third word lines WL1 to WL3, and may include memory cells connected to the first string select line SSL1 and the second string select line SSL2, and the 2-2 sub-blocks SB2-2 may be connected to the first to third word lines WL1 to WL3 and may include memory cells connected to the third string select line SSL3 and the fourth string select line SSL4.

In one embodiment, the memory device may perform a program sequence on each of the 1-1 sub-block SB1-1, the 1-2 sub-block SB1-2, the 2-1 sub-block SB2-1, and the 2-2 sub-block SB2-2 according to an address scramble (1→2→3 . . . →6). When performing a program operation on memory cells included in the 1-1 sub-block SB1-1 and the 1-2 sub-block SB1-2 each adjacent to string select lines, the memory device may perform a program operation according to the order of word lines in the first direction 1$^{ST}$ DIRECTION. In one embodiment, when performing a program operation on memory cells included in the 2-1 sub-block SB2-1 and the 2-2 sub-block SB2-2 each adjacent to ground select lines, the memory device may perform a program operation according to the order of word lines in the second direction 2$^{ND}$ DIRECTION.

Regarding memory cells connected to an identical word line from among memory cells included in the 1-1 sub-block SB1-1, the 1-2 sub-block SB1-2, the 2-1 sub-block SB2-1, and the 2-2 sub-block SB2-2, the memory device may sequentially perform a program operation in a predetermined order. In one embodiment, regarding the memory cells connected to the fourth word line WL4, the memory device may sequentially perform a program operation on memory cells connected to the first string select line SSL1 and memory cells connected to the second string select line SSL2 in this stated order.

Referring to FIG. 18C, a memory block BLK_c may include a configuration corresponding to the memory block BLK_c illustrated in FIG. 18C. In one embodiment, the memory device may perform a program sequence on the first sub-block SB1 according to the address scramble (1→2→3 . . . →6) by using a shadow programming scheme for memory cells connected to the fourth to sixth word lines WL4 to WL6. In this regard, the memory device may perform the program operation on the first sub-block SB1 according to the order of the word lines in the first direction $1^{ST}$ DIRECTION.

In one embodiment, the memory device may perform a program sequence on the second sub-block SB2 according to the address scramble (1→2→3 . . . →6) by using a shadow programming scheme for memory cells connected to the first to third word lines WL1 to WL3. In this regard, the memory device may perform the program operation on the second sub-block SB2 according to the order of the word lines in the second direction $2^{ND}$ DIRECTION.

However, the embodiments described in connection with FIGS. 18A to 18C are examples only, and the inventive concept is not limited thereto. For example, there are various other embodiments in which a program operation is performed in a program sequence that varies according to the position of a sub-block in consideration of the configuration of a memory block.

Figure 19A:
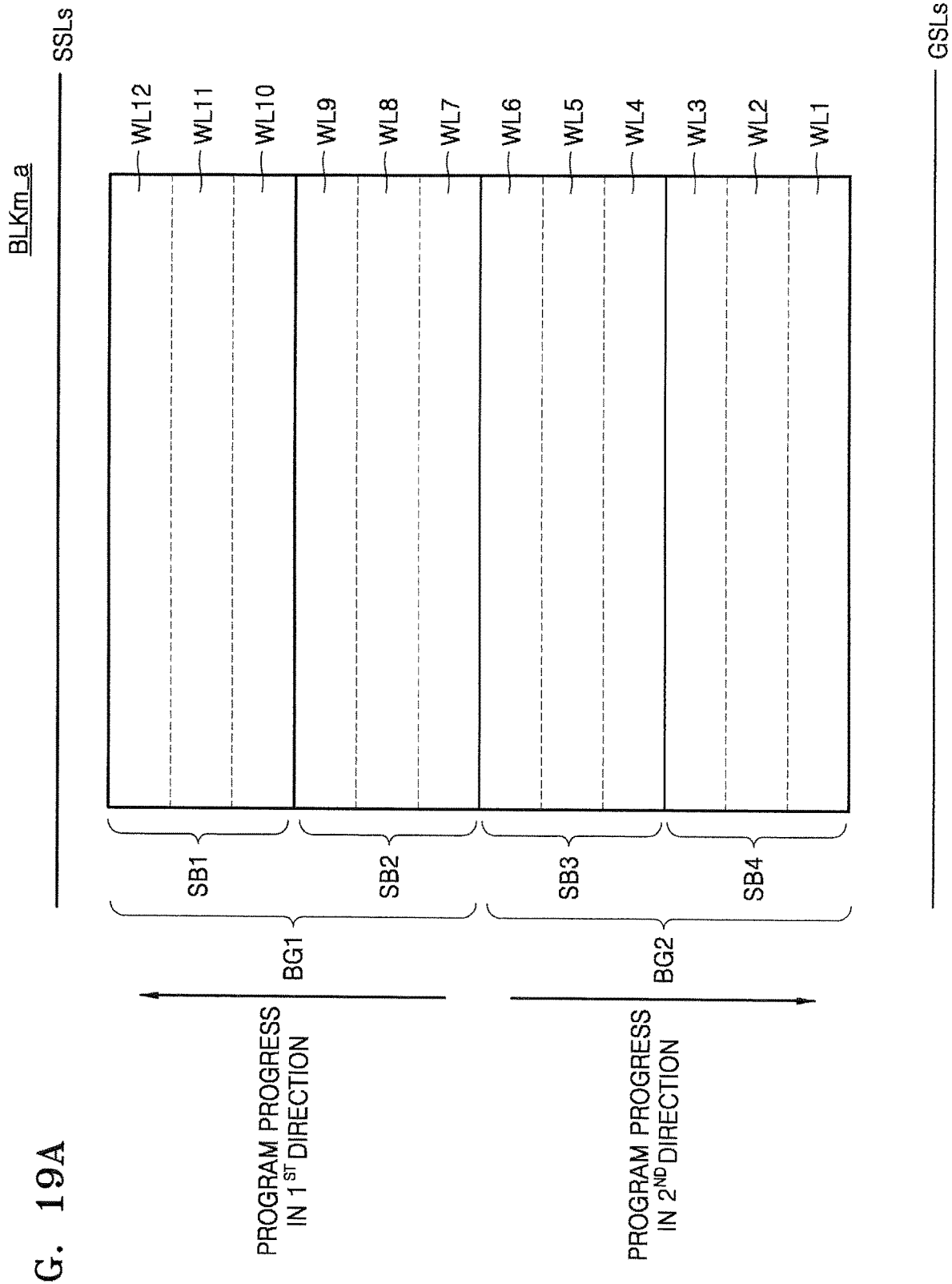
FIGS. 19A to 19C show diagrams for describing an embodiment of a reference for defining the position of a sub-block for a program operation of a memory device according to an embodiment of the inventive concept.
Figure 19B:
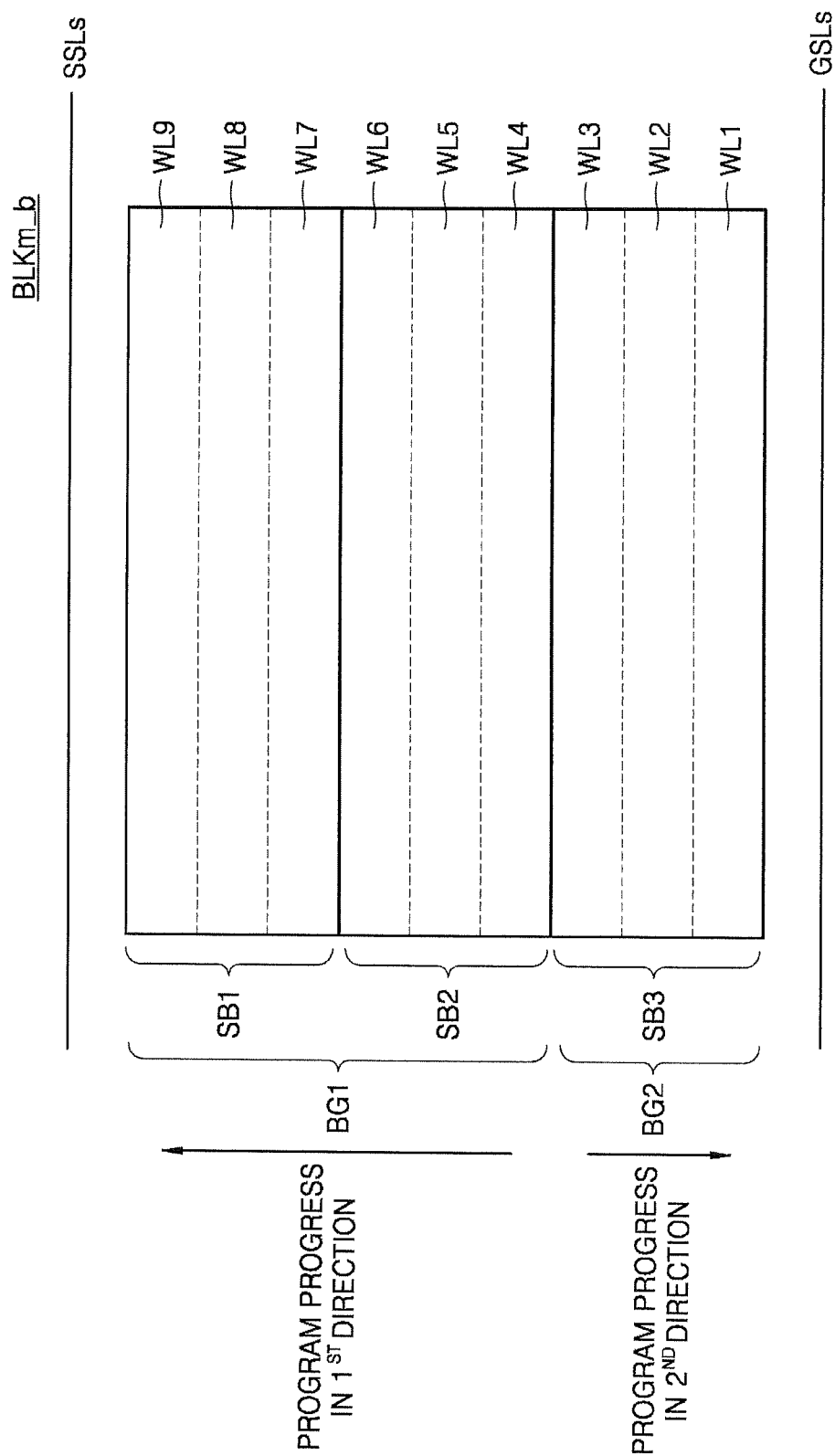
Figure 19C:
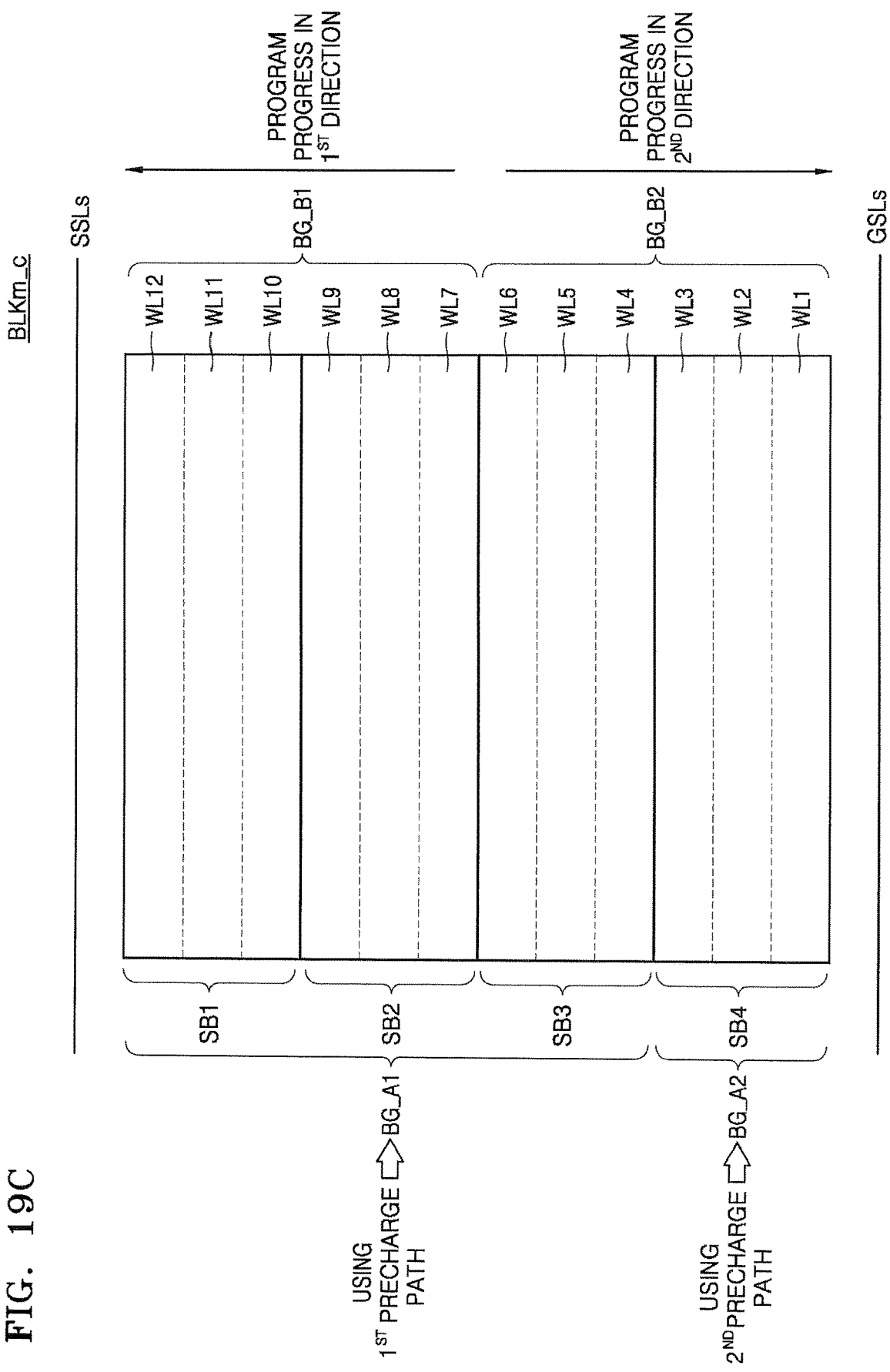

FIGS. 19A to 19C show diagrams for describing an embodiment of a reference for defining the position of a sub-block for a program operation of a memory device according to an embodiment of the inventive concept.

Referring to FIG. 19A, the memory block BLKm_a may include the first to fourth sub-blocks SB1 to SB4, and the first to fourth sub-blocks SB1 to SB4 may be organized into the first block group BG1 adjacent to the string select lines SSLs and the second block group BG2 adjacent to the ground select lines GSLs. Sub-blocks adjacent to the string select lines SSLs are classified as the first block group BG1, and sub-blocks adjacent to the ground select lines GSLs are classified as the second block group BG2. In one embodiment, the number of sub-blocks included in the first block group BG1 may be identical to the number of sub-blocks included in the second block group BG2, and further, the number of memory cells included in the first block group BG1 may be identical to the number of memory cells included in the second block group BG2. The first block group BG1 may include the first and second sub-blocks SB1 and SB2, and the second block group BG2 may include the third and fourth sub-blocks SB3 and SB4. Accordingly, when a memory device performs a program operation, the memory device determines which block group a sub-block connected to selected word lines to be subjected to the memory operation belongs to, and based on the result, the memory device selects a program sequence, and by using the selected program sequence, the memory device may perform the program operation. For example, when a sub-block connected to a selected word line to be subjected to a memory operation is included in the first block group BG1, the memory device may perform a program operation by using a first direction as the program sequence; and when a sub-block connected to a selected word line to be subjected to a memory operation is included in the second block group BG2, the memory device may perform a program operation by using a second direction as the program sequence.

In one embodiment, the memory controller may store, in a storage, information about which block group BG1 or BG2 each of the sub-blocks SB1 to SB4 belongs to, and based on the information, the memory controller may control the program operation of the memory device.

Referring to FIG. 19B, the memory block BLKm_b may include the first to third sub-blocks SB1 to SB3, and the first to third sub-blocks SB1 to SB3 may be divided into the first block group BG1 adjacent to the string select lines SSLs and the second block group BG2 adjacent to the ground select lines GSLs. In one embodiment, the number of sub-blocks included in the first block group BG1 may be different from the number of sub-blocks included in the second block group BG2, and further, the number of memory cells included in the first block group BG1 may be different from the number of memory cells included in the second block group BG2. The first block group BG1 may include first and second sub-blocks SB1 and SB2, and the second block group BG2 may include the third sub-block SB3. The program operation of the memory device has already been described in detail with reference to FIG. 19A. Accordingly, the related description will be skipped herein.

FIGS. 19A and FIG. 19B illustrate embodiments in which a block group of sub-blocks classified to perform a precharge operation in different precharge paths is identical to a block group of sub-blocks classified to perform a program operation in different program sequences. However, FIG. 19C illustrates an embodiment in which block groups BG_A1 and BG_A2 of sub-blocks SB1 to SB4 classified to perform a precharge operation in different precharge paths are different from block groups BG_B1 and BG_B2 of sub-blocks SB1 to SB4 classified to perform a program operation in different program sequences. Referring to FIG. 19C, the memory block BLKm_a may include the first to fourth sub-blocks SB1 to SB4. In one embodiment, to perform a precharge operation in different precharge paths, sub-blocks adjacent to the string select lines SSLs may be defined as the first block group BG_A1, and sub-blocks adjacent to the ground select lines GSLs may be defined as the second block group BG_A2, wherein the first block group BG_A1 may include first to third sub-blocks SB1 to SB3, and the second block group BG_A2 may include the fourth sub-block SB4.

In one embodiment, to perform a program operation in different program sequences, sub-blocks adjacent to the string select lines SSLs may be defined as the first block group BG_B1, and sub-blocks adjacent to the ground select lines GSLs may be defined as the second block group BG_B2, wherein the first block group BG_B1 may include the first sub-block SB1 and the second sub-blocks SB2, and the second block group BG_B2 may include the third sub-block SB3 and the fourth sub-block SB4.

As described above, the reference (for example, a block group) defining the position of a sub-block may be set differently depending on the type of a memory operation.

FIGS. 20A to 20E show diagrams for describing an embodiment of a reference for defining the position of a sub-block for a program operation of a memory device according to another embodiment of the inventive concept.

Figure 20A:
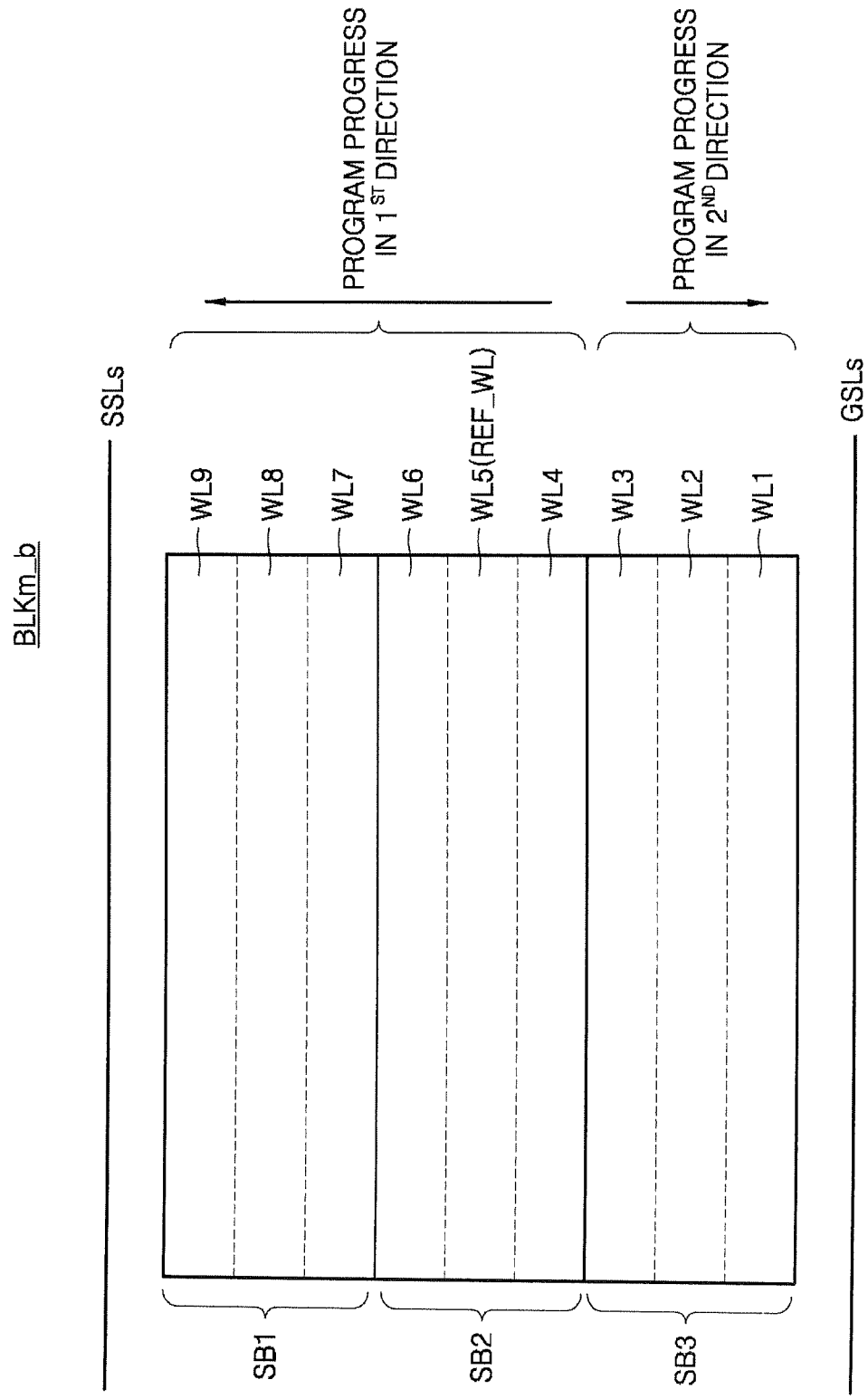
FIGS. 20A to 20E show diagrams for describing an embodiment of a reference for defining the position of a sub-block for a program operation of a memory device according to another embodiment of the inventive concept.

Referring to FIG. 20A, the memory block BLKm_b may include the first to third sub-blocks SB1 to SB3. The first sub-block SB1 may be connected to the seventh to ninth word lines WL7 to WL9, the second sub-block SB2 may be connected to the fourth to sixth word lines WL4 to WL6, and the third sub-block SB3 may be connected to the first to third word lines WL1 to WL3. When a program operation is performed, the fifth word line WL5 may be a reference word line REF_WL used to determine whether each of the sub-blocks SB1 to SB3 is adjacent to string select lines SSLs or adjacent to ground select lines GSLs. Hereinafter, it is assumed that the fifth word line WL5 is the reference word line REF_WL. In one embodiment, a sub-block (for example, the third sub-block SB3) below the reference word line REF_WL may be classified as a sub-block adjacent to the ground select lines GSLs, and a sub-block above the reference word line REF_WL (for example, the first sub-block SB1) may be classified as a sub-block adjacent to the string select lines SSLs. In one embodiment, the second sub-block SB2 connected to the reference word line REF_WL may be preset to be classified as a sub-block adjacent to the ground select lines GSLs or a sub-block adjacent to the string select lines SSLs. Referring to FIG. 20A, the second sub-block SB2 connected to the reference word line REF_WL is preset as being adjacent to the string select lines SSLs. Accordingly, when a plurality of selected word lines corresponding to the selected memory cells to be subjected to a program operation are connected to the first sub-block SB1 or the second sub-block SB2, the memory device may perform a program operation according to the order of the selected word lines in the first direction $1^{ST}$ DIRECTION. In one embodiment, when the selected word lines are connected to the third sub-block SB3, the memory device may perform a program operation according to the order of the selected word lines in the second direction $2^{ND}$ DIRECTION.

Figure 20B:
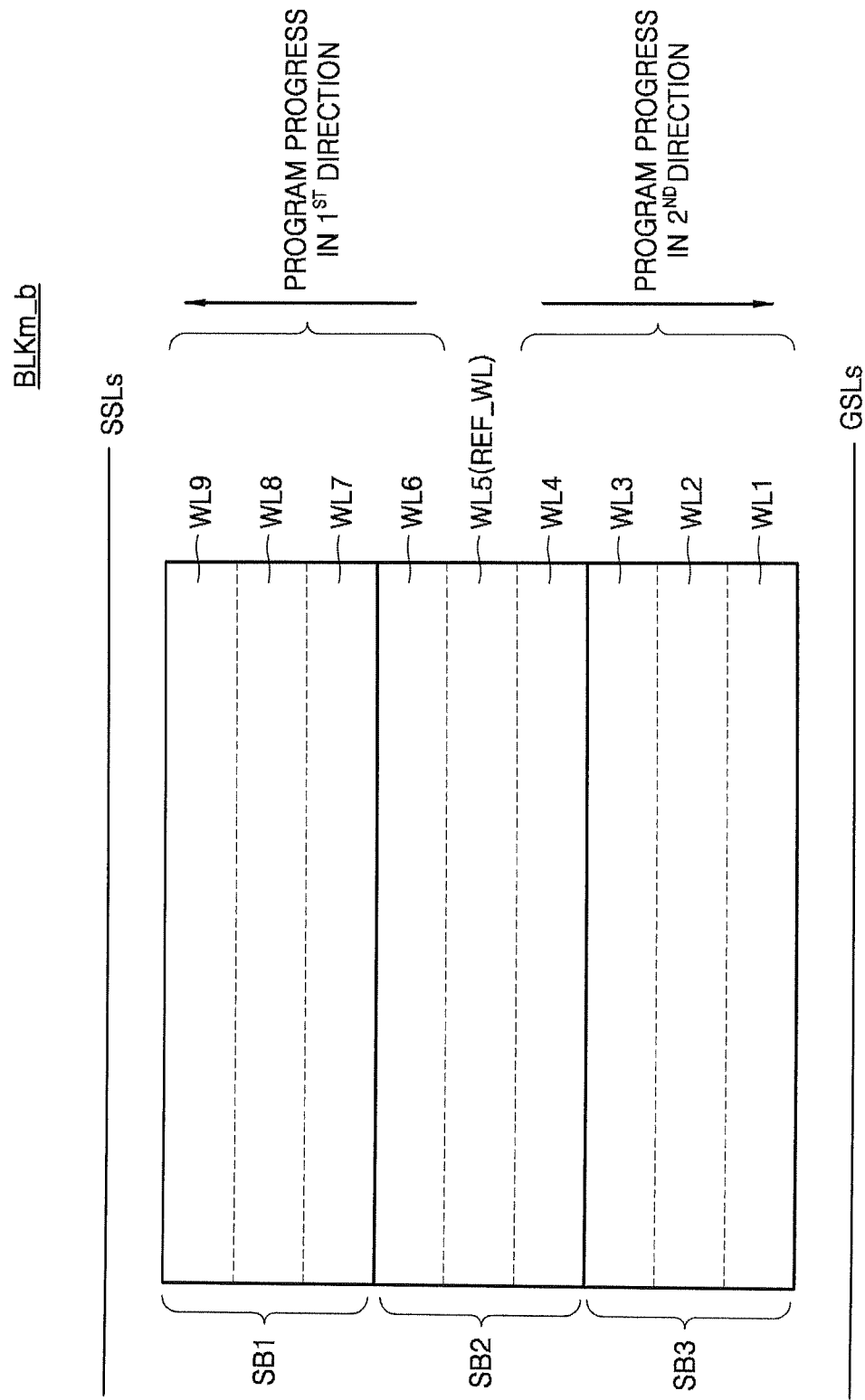

Unlike FIG. 20A, FIG. 20B illustrates an embodiment in which, even in the second sub-block connected to the reference word line REF_WL, a memory device may perform a program operation by using different program sequences. In detail, referring to FIG. 20B, when selected word lines corresponding to selected memory cells which are to be subjected to a memory operation are the sixth word line WL6 (connected to the second sub-block SB2) to the ninth word line WL9, the memory device may perform the program operation according to the order of selected word lines in the first direction $1^{ST}$ DIRECTION. When the selected word lines are the first word line WL1 to the fourth word line WL4 (connected to the second sub-block SB2), the memory device may perform a program operation according to the order of the selected word lines in the second direction $2^{ND}$ DIRECTION.

Figure 20C:
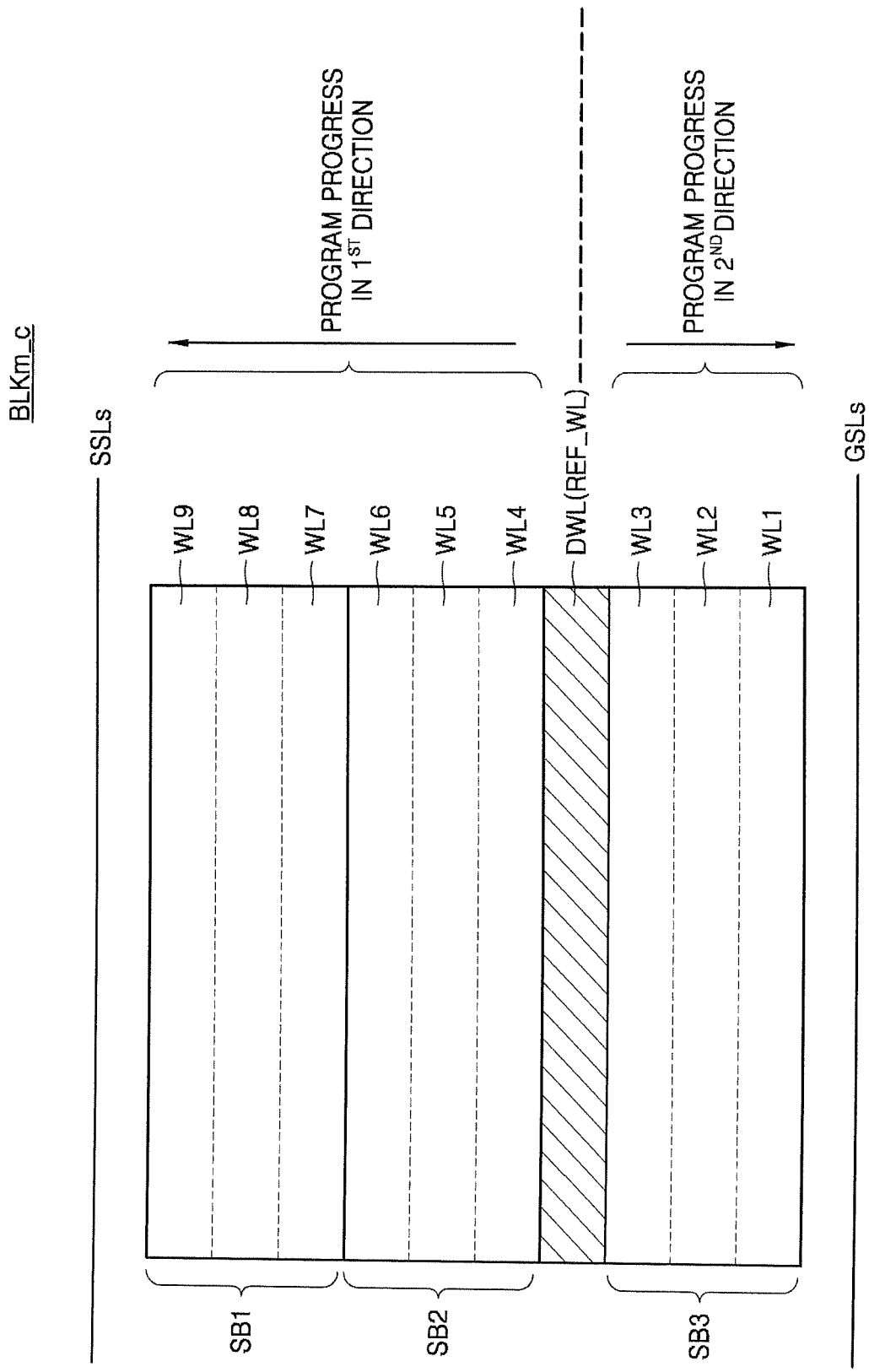

Referring to FIG. 20C, the memory block BLKm_c may include the first to third sub-blocks SB1 to SB3, and may further include dummy memory cells. The dummy memory cells may be connected to a dummy word line DWL, and the dummy word line DWL may be a reference word line REF_WL used to define the position of a sub-block during the program operation of the memory device. In one embodiment, a sub-block (for example, the third sub-block SB3) below the dummy word line DWL may be classified as a sub-block adjacent to the ground select lines GSLs, and a sub-block above the dummy word line DWL (for example, the first sub-block SB1 and the second sub-block SB2) may be classified as a sub-block adjacent to the string select lines SSLs.

Figure 20D:
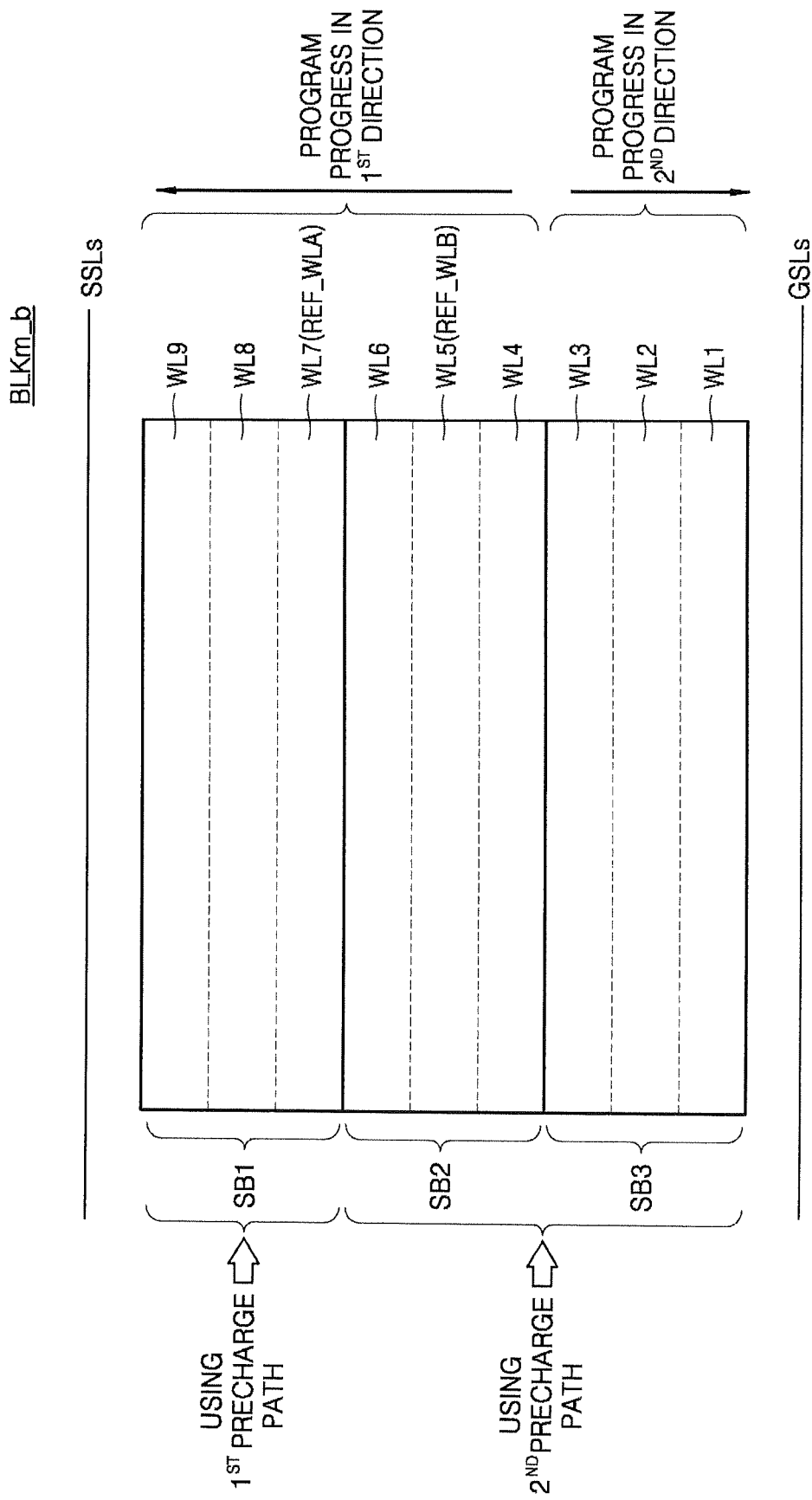

FIG. 20D illustrates an embodiment in which a first reference word line REF_WLA used as a reference to define the positions of the sub-blocks SB1 to SB3 to perform a precharge operation in different precharge paths are different from a second reference word line REF_WLB used as a reference to define the positions of the sub-blocks SB1 to SB3 to perform a program operation in different program sequences. Referring to FIG. 20D, the memory block BLKm_b may include the first to third sub-blocks SB1 to SB3. For example, the first reference word line REF_WLA may be the seventh word line WL7 connected to the first sub-block SB1, and the second reference word line REF_WLB may be the fifth word line WL5 connected to the second sub-block SB2.

Accordingly, when performing the precharge operation on the memory cells of the selected word line connected to the first sub-block SB1, the memory device may use the first precharge path, and when performing the precharge operation on the memory cells of the selected word line connected to the second sub-block SB2 or the third sub-block SB3, the memory device may use the second precharge path. In one embodiment, when performing a program operation on memory cells of a plurality of selected word lines connected to the first sub-block SB1 or the second sub-block SB2, the memory device may perform a program operation according to the order of the selected word lines in the first direction $1^{ST}$ DIRECTION. and when performing the program operation on memory cells of a plurality of selected word lines connected to the third sub-block SB3, the memory device may perform a program operation according to the order of the selected word lines in the second direction $2^{ND}$ DIRECTION.

Figure 20E:
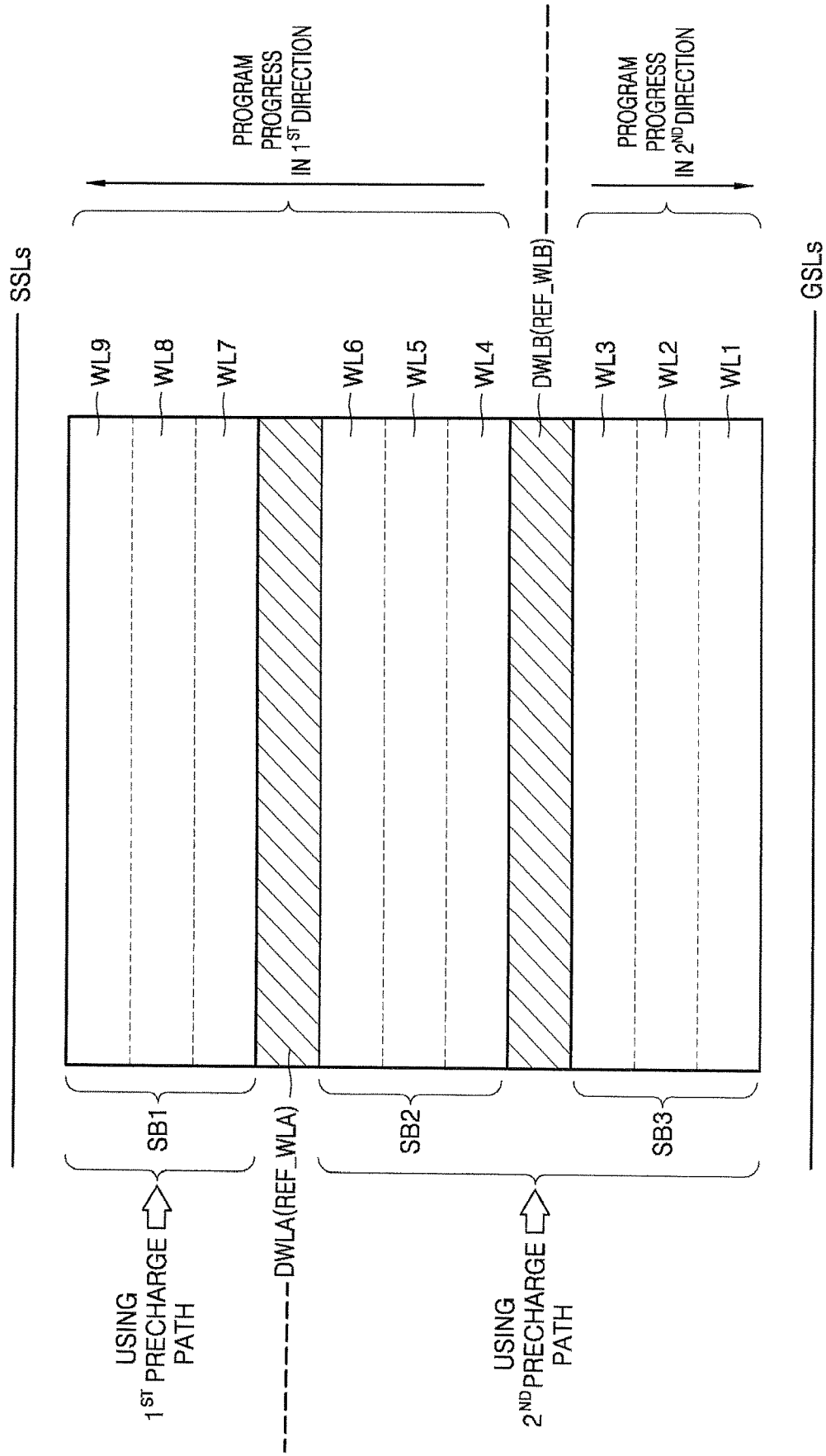

FIG. 20E illustrates an embodiment in which a first dummy word line DWLA (REF_WLA) used as a reference to define the positions of the sub-blocks SB1 to SB3 to perform a precharge operation in different precharge paths are different from a second dummy word line DWLB (REF_WLB) used as a reference to define the positions of the sub-blocks SB1 to SB3 to perform a program operation in different program sequences. Referring to FIG. 20E, the memory block BLKm_d may include the first to third sub-blocks SB1 to SB3, and may include dummy memory cells. Some dummy memory cells may be connected to the first dummy word lines DWLA (REF_WLA) and the remaining dummy memory cells may be connected to the second dummy word lines DWLB (REF_WLB).

In one embodiment, during a precharge operation, sub-blocks (for example, the second sub-block SB2 and the third sub-block SB3) below the first dummy word line DWLA (REF_WLA) may be classified as a sub-block adjacent to ground select lines GSLs, and a sub-block (for example, the first sub-block SB1) above the first dummy word line DWLA (REF_WLA) may be classified as a sub-block adjacent to the string select lines SSLs. During a program operation, a sub-block (for example, the third sub-block SB3) below the second dummy word lines DWLB (REF_WLB) may be classified as a sub-block adjacent to the ground select lines GSLs, and a sub-block (for example, the first sub-block SB1 and the second sub-block SB2) above the second dummy word line DWLB, (REF_WLB) may be classified as a sub-block adjacent to the string select lines SSLs.

FIG. 21 shows a flowchart for explaining a precharge operation and a program operation according to an embodiment of the inventive concept.

Referring to FIG. 21 a memory device may receive a program command transmitted by a memory controller (S300). The memory device may determine the position of a sub-block connected to a selected word line that is to be subjected to a program operation by referring to a first reference, and based on the result, the memory device may select a precharge path (S310). The memory device may perform a precharge operation on cell strings included in a memory block through the selected precharge path (S320). The memory device may determine the position of a sub-block connected to a selected word line by referring to a second reference, and based on the result, the memory device may select a reference direction for the program sequence (S330). The memory device may perform a program operation according to the order of the selected word lines in the reference direction selected for the program sequence (S340).

Figure 22:
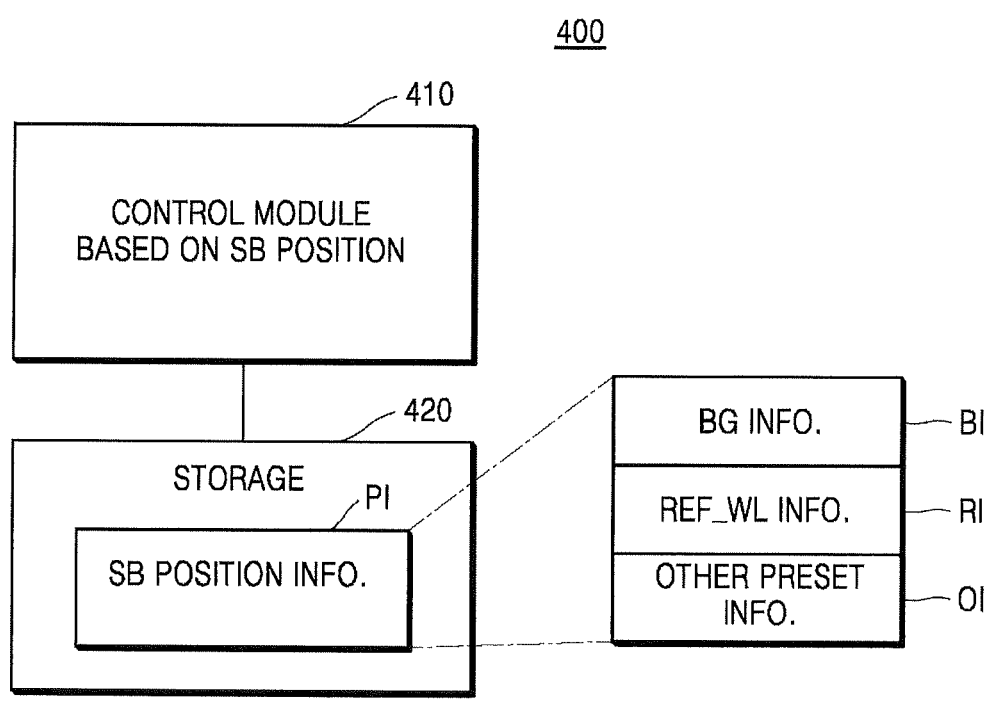
FIG. 22 shows a block diagram of a memory controller according to an embodiment of the inventive concept.

FIG. 22 shows a schematic block diagram of a memory controller 400 according to an embodiment of the inventive concept.

Referring to FIG. 22, the memory controller 400 may include a control module 410 and a storage 420. The storage 420 may be a predetermined memory area included in the memory controller 400 or may be a storage device separate from the memory controller 400. The storage 420 may store various information used when the control module 410 controls a memory operation performed by a memory device. In one embodiment, the storage 420 may include sub-block position information PI used for the control module 410 to identify the location of each sub-block included in the memory block during a precharge operation or a program operation.

The sub-block position information PI may include block group information BG INFO BI about a first block group including sub-blocks adjacent to string select lines and a second block group including sub-blocks adjacent to ground select lines. For example, the block group information BG INFO may be information about sub-blocks included in each block group, or information about block groups that are optionally used by the control module 410 when the control module 410 controls the precharge operation and the program operation as described in FIG. 19C.

The sub-block position information PI may include information REF_WL INFO RI about a reference word line to be used as a reference for determining whether each sub-block is adjacent to string select lines or adjacent to ground select lines. For example, the information REF_WL INFO RI about the reference word line may include address information about the reference word line, and may further include address information for a dummy word line. In one or more embodiments, as described in FIGS. 20D and 20E, the information about a reference word line may be included the information being optionally used by the control module 410 when the control module 410 controls the precharge operation and the program operation.

The sub-block position information PI may include other preset information OI. The other preset information OI, as described in FIGS. 14A, 14B, 20A, and 20B, may include at least one piece of information of first preset information about whether a sub-block connected to the reference word line is adjacent string select lines or ground select lines, and a second preset information about how a precharge operation or a program operation is performed when the reference word line is a selected word line during a memory operation.

The sub-block position information PI may be preset by receiving an external signal transmitted from outside the memory system (for example, a host). The sub-block position information PI may include information about the position of a sub-block that is set to be classified differently according to an environment when the memory device performs a memory operation (for example, a low or high temperature operating-environment, a P/E cycle for memory blocks included in a memory device, or a change according to a process etc.). The control module 410 may control the memory operation of the memory device by using information matched with the environment in which a memory operation is performed among the sub-block position information PI.

Figure 23:
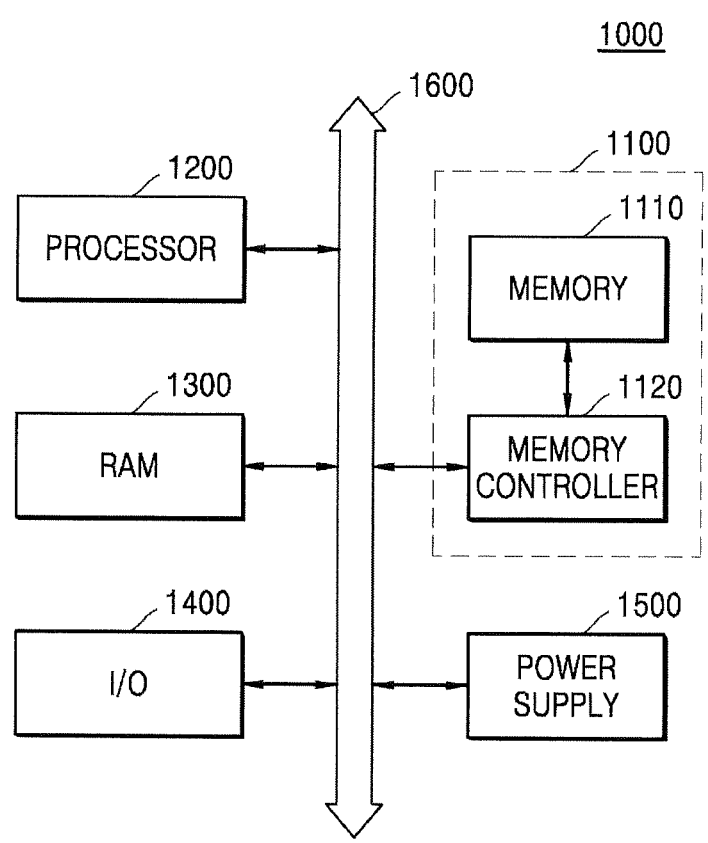
FIG. 23 shows a block diagram illustrating a computing system including a memory system according to embodiments of the inventive concept.

FIG. 23 shows a block diagram schematically illustrating a computing system 1000 including a memory system 1100 according to embodiments of the inventive concept.

Referring to FIG. 23, the computing system 1000 may include the memory system 1100, a processor 1200, a RAM 1300, an input-output device 1400, and a power supply 1500. Although not illustrated in FIG. 23, the computing system 1000 may further include ports for communicating with video cards, sound cards, memory cards, USB devices, or other electronic devices. The computing system 1000 may be implemented as a personal computer or a portable electronic device such as a notebook computer, a mobile phone, a personal digital assistant (PDA), a camera, and the like. The processor 1200 may perform certain calculations or tasks.

According to one embodiment, the processor 1200 may be a micro-processor or a central processing unit (CPU). The processor 1200 may communicate with the RAM 1300, the input-output device 1400, and the memory system 1100 via a bus 1600, such as an address bus, a control bus, and a data bus. In this regard, the memory system 1100 may be embodied by using embodiments described in connection with FIG. 22. That is, the memory system 1100 may perform a memory operation in such a way that a memory operation mode is changed according to the position of a sub-block connected to at least one selected word line that are to be subjected to the memory operation carried out by a memory controller 1120. According to one embodiment, the processor 1200 may also be connected to an expansion bus, such as a peripheral component interconnect (PCI) bus. The RAM 1300 may store data for the operation of the computing system 1000. For example, the RAM 1300 may be implemented as a DRAM, a mobile DRAM, an SRAM, a PRAM, an FRAM, an RRAM, and/or an MRAM. The input-output device 1400 may include: an input unit, such as a keyboard, a keypad, a mouse, etc.; and an output unit, such as a printer, a display, and the like. The power supply 1500 may supply the operating voltage required for operation of computing system 1000.

While the inventive concept has been particularly shown and described with reference to embodiments thereof, it will be understood that various changes in form and details may be made therein without departing from the spirit and scope of the following claims.

What is claimed:

1. A method of operating a memory device that comprises a memory block operatively connected to a common source line and a plurality of bit lines, wherein the memory block includes first and second sub-blocks each having a respective position in the memory block relative to the common source line and the plurality of bit lines, each of the first and second sub-blocks including a plurality of memory cells connected to a plurality of word lines and the plurality of bit lines, the method comprising:
   receiving a command and an address from outside the memory device; and
   performing a precharge operation on the memory block in response to the command, using either a first precharge path through the plurality of bit lines or a second precharge path through the common source line based on the respective position of the first or second sub-block that includes a word line that is configured to activate responsive to the address, wherein the memory block further includes:

a plurality of string select transistors configured to control connection of the plurality of bit lines to a plurality of strings of memory cells in the memory block responsive to a plurality of string select lines, and a plurality of ground select transistors configured to control connection of the common source line to the plurality of strings of memory cells responsive to a plurality of ground select lines, wherein the first sub-block is adjacent to the plurality of string select lines and the second sub-block is adjacent to the plurality of ground select lines, and wherein the number of data bits programmed in a first memory cell included in the first sub-block Is different from the number of data bits programmed in a second memory cell included in the second sub-block.

2. The method of claim 1, wherein the first and second sub-blocks are each configured to perform a respective partial erase operation.

3. The method of claim 1, wherein performing the precharge operation via the first precharge path has occurred when the word line that is configured to activate responsive to the address is in the first sub-block.

4. The method of claim 3, wherein performing of the precharge operation includes:

disabling the plurality of ground select transistors;
enabling the plurality of string select transistors; and
applying a precharge voltage to the plurality of bit lines.

5. The method of claim 3, wherein performing of the precharge operation includes:

performing the precharge operation via the second precharge path when the word line that is configured to activate responsive to the address is in the second sub-block.

6. The method of claim 5, wherein performing of the precharge operation further includes:

disabling the plurality of string select transistors;
enabling the plurality of ground select transistors; and
applying a precharge voltage to the common source line.

7. The method of claim 1, wherein performing the precharge operation further comprises:

identifying whether the first sub-block or the second sub-block that includes the word line configured to activate responsive to the address is included in a first block group that is adjacent to a plurality of string select transistors configured to control connection of the plurality of bit lines to the memory block or is included in a second block group that is adjacent to a plurality of ground select transistors configured to control connection of the common source line to the memory block to provide an identification result; and performing the precharge operation via the first precharge path or via the second precharge path based on the identification result.

8. The method of claim 7, wherein performing the precharge operation further comprises:

performing the precharge operation via the first precharge path when the identification result indicates that the word line configured to activate responsive to the address is in the first block group; and performing the precharge operation via the second precharge path when the identification result indicates that the word line configured to activate responsive to the address is in the second block group.

9. The method of claim 1, wherein performing the precharge operation further comprises:

defining a reference word line included in the memory block to provide a reference sub-block to indicate which sub-blocks included in the memory block are adjacent to a plurality of string select transistors;

determining whether the word line configured to activate responsive to the address is included in the first sub-block that is adjacent to the plurality of string select transistors that are configured to connect the plurality of bit lines to the memory block or the second sub-block that is adjacent to a plurality of ground select transistors that are configured to connect a plurality of ground select lines to the memory block to provide an identification result; and performing the precharge operation via the first precharge path or via the second precharge path based on the identification result.

10. The method of claim 9, wherein the memory block further comprises:

a plurality of dummy memory cells connected to the reference word line.

11. A memory system comprising:

a memory device including a memory block including first and second sub-blocks, each of the first and second sub-blocks including a plurality of memory cells, the first and second sub-blocks connected to a plurality of ground select lines configured to control connection to a common source line, and the first and second sub-blocks connected to a plurality of string select lines configured to control connection to a plurality of bit lines; and a memory controller configured to control a first precharge operation through the plurality of bit lines and to control a second precharge operation through the common source line according to a position of a sub-block connected to at least one select word line subject to a program operation or a read operation performed on the memory block, wherein the memory block further includes:

a plurality of string select transistors configured to control connection of the plurality of bit lines to a plurality of strings of memory cells in the memory block responsive to a plurality of string select lines, and a plurality of ground select transistors configured to control connection of the common source line to the plurality of strings of memory cells responsive to a plurality of ground select lines, wherein the first sub-block is adjacent to the plurality of string select lines and the second sub-block is adjacent to the plurality of ground select lines, and wherein the memory device is configured such that the number of data bits is programmed in a first memory cell included in the first sub-block and the number of data bits is programmed in a second memory cell included in the second sub-block different from the number of data bits programmed in the first memory cell.

12. The memory system of claim 11, wherein the memory controller is configured to control a partial erase operation on each sub-block of the first and second sub-blocks.

13. The memory system of claim 11, wherein the memory controller is configured to control the program operation on a plurality of selected word lines in an order of selected word lines in a first direction extending from the plurality of ground select lines toward the plurality of string select lines and in a second direction extending from the plurality of string select lines toward the plurality of ground select lines.

14. The memory system of claim 13, wherein when the first precharge operation is performed the memory controller is configured to carry out the program operation on selected word lines in an order of selected word lines in the first direction, and wherein when the second precharge operation is performed the memory controller is configured to carry out the program operation selected word lines in an order of selected word lines in the second direction.

15. The method of claim 1, wherein the number of word lines included in the first sub-block is different from the number of word lines included in the second sub-block.

16. The method of claim 1, wherein the memory block further includes a third sub-block between the first sub-block and the second sub-block, and wherein performing the precharge operation on the memory block includes:

performing a first precharge operation on the first sub-block and a first portion of the third sub-block using the first precharge path; and performing a second precharge operation on the second sub-block and a second portion of the third sub-block using the second precharge path.

17. The method of claim 1, further comprising:

performing a first program operation using a first sequence of a plurality of first selected word lines extending in a first direction from the plurality of ground select lines toward the plurality of string select lines responsive to determining that the plurality of selected word lines are included in the first sub-block; and performing a second program operation using a second sequence of a plurality of second selected word lines extending in a second direction from the plurality of string select lines toward the plurality of ground select lines responsive to determining that the plurality of selected word lines are included in the second sub-block.

18. The method of claim 17, wherein the precharge operation is performed on the first sub-block using either the first precharge path or the second precharge path, and wherein the precharge operation is performed on the second sub-block using either the second precharge path or the first precharge path.

19. A method of operating a memory device, the memory device comprising a memory block connected between a common source line and a plurality of bit lines and the memory block comprising at least three sub-blocks, the method comprising:

receiving a command and an address from outside the memory device;

comparing a position of a sub-block connected to a plurality of word lines corresponding to the address with each of a first reference position of a sub-block for determining a precharge path and a second reference position of a sub-block for determining a sequence direction of a memory operation;

performing, in response to the command, a precharge operation on the memory block by selecting any one of a first precharge path through the plurality of bit lines and a second precharge path through the common source line, based on a result of the comparison; and performing, in response to the command, the memory operation on target memory cells connected to the plurality of word lines by selecting any one of a first sequence direction from the common source line toward the plurality of bit lines and a second sequence direction from the plurality of bit lines toward the common source line, based on the result of the comparison.

20. The method of claim 19, wherein the at least three sub-blocks comprise a first sub-block, a second sub-block, and a third sub-block which are sequentially deposited in a direction from the plurality of bit lines toward the common source line, and wherein, when the plurality of word lines corresponding to the address are connected to the second sub-block, the performing of the precharge operation on the memory block occurs by selecting the second precharge path, and the performing of the memory operation on the target memory cells occurs by selecting the first sequence direction.

* * * * *